US012004350B2

(12) United States Patent
Jung et al.

(10) Patent No.: US 12,004,350 B2
(45) Date of Patent: Jun. 4, 2024

(54) THREE-DIMENSIONAL SEMICONDUCTOR MEMORY DEVICES

(71) Applicant: Samsung Electronics Co., Ltd., Suwon-si (KR)

(72) Inventors: Euntaek Jung, Seongnam-si (KR); Joongshik Shin, Yongin-si (KR); Sangjun Hong, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 17/819,355

(22) Filed: Aug. 12, 2022

(65) Prior Publication Data

US 2022/0384480 A1 Dec. 1, 2022

Related U.S. Application Data

(63) Continuation of application No. 16/139,775, filed on Sep. 24, 2018, now Pat. No. 11,437,397.

(30) Foreign Application Priority Data

Feb. 7, 2018 (KR) .......................... 10-2018-0015259

(51) Int. Cl.
*H10B 43/27* (2023.01)
*H10B 43/10* (2023.01)
*H10B 43/35* (2023.01)
*H10B 43/40* (2023.01)
(Continued)

(52) U.S. Cl.
CPC ............ *H10B 43/27* (2023.02); *H10B 43/10* (2023.02); *H10B 43/35* (2023.02); *H10B 43/40* (2023.02); *H10B 43/50* (2023.02); *H01L 29/42344* (2013.01)

(58) Field of Classification Search
CPC ... H01L 29/42344; H10B 43/10; H10B 43/27; H10B 43/35; H10B 43/40; H10B 43/50
See application file for complete search history.

(56) References Cited

U.S. PATENT DOCUMENTS

| 7,679,133 B2 | 3/2010 | Son et al. |
| 8,553,466 B2 | 10/2013 | Han et al. |
| 8,559,235 B2 | 10/2013 | Nam et al. |

(Continued)

FOREIGN PATENT DOCUMENTS

| CN | 106169477 A | 11/2016 |
| KR | 20160118114 A | 10/2016 |

(Continued)

OTHER PUBLICATIONS

Katsumata , et al., ", "Pipe-shaped BiCS Flash Memory with 16 Stacked Layers and Multi-Level-Cell Operation for Ultra High Density Storage Devices", 2009 Symposium on VLSI Technology Digest of Technical Papers, pp. 136-137.".

*Primary Examiner* — Meiya Li
(74) *Attorney, Agent, or Firm* — Myers Bigel, P.A.

(57) ABSTRACT

A three-dimensional (3D) semiconductor memory device includes a source conductive pattern on a substrate and extending in parallel to a top surface of the substrate, and an electrode structure including an erase control gate electrode, a ground selection gate electrode, cell gate electrodes, and a string selection gate electrode, which are sequentially stacked on the source conductive pattern in a first direction perpendicular to the top surface of the substrate.

20 Claims, 52 Drawing Sheets

(51) Int. Cl.
*H10B 43/50* (2023.01)
*H01L 29/423* (2006.01)

(56) References Cited

U.S. PATENT DOCUMENTS

| | | | |
|---|---|---|---|
| 8,654,587 B2 | 2/2014 | Yoon et al. |
| 8,987,089 B1 | 3/2015 | Pachamuthu et al. |
| 9,012,974 B2 | 4/2015 | Chae et al. |
| 9,224,752 B1 | 12/2015 | Lee et al. |
| 9,230,973 B2 | 1/2016 | Pachamuthu et al. |
| 9,431,419 B2 | 8/2016 | Fukuzumi et al. |
| 9,496,274 B2 | 11/2016 | Pachamuthu et al. |
| 9,508,730 B2 | 11/2016 | Lee et al. |
| 9,530,781 B2 | 12/2016 | Miyamoto et al. |
| 9,583,439 B1 | 2/2017 | Chen |
| 9,627,405 B1 | 4/2017 | Lee |
| 9,711,532 B2 | 7/2017 | Miyamoto et al. |
| 9,716,099 B2 | 7/2017 | Choi |
| 9,799,670 B2 | 10/2017 | Nishikawa et al. |
| 9,831,266 B2 | 11/2017 | Kai et al. |
| 9,917,100 B2 | 3/2018 | Zhang et al. |
| 10,032,666 B2 | 7/2018 | Shin |
| 10,096,616 B2 | 10/2018 | Lee et al. |
| 10,199,359 B1 * | 2/2019 | Sakakibara ............ H10B 43/30 |
| 10,347,654 B1 | 7/2019 | Iwai et al. |
| 10,490,566 B2 | 11/2019 | Jung et al. |
| 2011/0233648 A1 | 9/2011 | Seol et al. |
| 2015/0131381 A1 | 5/2015 | Rhie |
| 2015/0318297 A1 | 11/2015 | Hada |
| 2016/0005753 A1 | 1/2016 | Nowak et al. |
| 2016/0163389 A1 | 6/2016 | Zhang et al. |
| 2017/0148811 A1 | 5/2017 | Zhang et al. |
| 2017/0207226 A1 | 7/2017 | Lee |

FOREIGN PATENT DOCUMENTS

| | | |
|---|---|---|
| KR | 20170036877 A | 4/2017 |
| KR | 20170061232 A | 6/2017 |
| WO | 2017091338 A1 | 6/2017 |

* cited by examiner

THREE-DIMENSIONAL SEMICONDUCTOR MEMORY DEVICES

CROSS-REFERENCE TO RELATED APPLICATION

This application is a continuation of U.S. patent application Ser. No. 16/139,775 filed Sep. 24, 2018, which application claims priority under 35 U.S.C. § 119 to Korean Patent Application No. 10-2018-0015259, filed on Feb. 7, 2018, in the Korean Intellectual Property Office, the disclosures of which are hereby incorporated by reference in their entireties.

BACKGROUND

Embodiments of the inventive concepts relate to three-dimensional (3D) semiconductor memory devices and, more particularly, to 3D semiconductor memory devices with improved reliability and integration density.

Semiconductor devices have been highly integrated to provide excellent performance and low manufacturing costs. The integration density of semiconductor devices directly affects the costs of the semiconductor devices, thereby resulting in a demand of highly integrated semiconductor devices. The integration density of two-dimensional (2D) or planar semiconductor devices may be mainly determined by an area occupied by a unit memory cell. Therefore, the integration density of the 2D or planar semiconductor devices may be greatly affected by a technique of forming fine patterns. However, since extremely high-priced apparatus may be needed to form fine patterns, the integration density of 2D semiconductor devices continues to increase but is still limited. Thus, 3D semiconductor memory devices have been developed to overcome the above limitations. 3D semiconductor memory devices may include memory cells three-dimensionally arranged.

SUMMARY

Embodiments of the inventive concepts may provide 3D semiconductor memory devices capable of improving reliability and integration density.

In an aspect of the inventive concepts, a 3D semiconductor memory device may include a source conductive pattern on a substrate and extending in parallel to a top surface of the substrate, and an electrode structure including an erase control gate electrode, a ground selection gate electrode, cell gate electrodes, and a string selection gate electrode, which are sequentially stacked on the source conductive pattern in a first direction perpendicular to the top surface of the substrate.

In an aspect of the inventive concepts, a 3D semiconductor memory device may include a source conductive pattern extending in parallel to a top surface of a substrate, and a plurality of NAND cell strings provided on the source conductive pattern and extending in a first direction perpendicular to the top surface of the substrate. Each of the plurality of NAND cell strings may include a cell string including a plurality of memory cell transistors connected in series to each other, a ground selection transistor connected to a first end of the cell string, and an erase control transistor connected between the ground selection transistor and the source conductive pattern.

In an aspect of the inventive concepts, a 3D semiconductor memory device may include an electrode structure including a plurality of electrodes stacked in a first direction perpendicular to a top surface of a substrate, the electrode structure extending in a second direction parallel to the top surface of the substrate, a source conductive pattern between the substrate and the electrode structure and extending in parallel to the electrode structure, a vertical semiconductor pattern that penetrates the electrode structure and the source conductive pattern and of which a portion of a sidewall of the vertical semiconductor pattern is in contact with the source conductive pattern, and a data storage pattern extending between the vertical semiconductor pattern and the electrode structure in the first direction. The source conductive pattern may include a horizontal portion under the electrode structure and extending in the second direction, and a sidewall portion that extends from the horizontal portion in the first direction and is on the portion of the sidewall of the vertical semiconductor pattern.

In an aspect of the inventive concepts, a 3D semiconductor memory device may include a substrate including a peripheral circuit region and a cell array region, a peripheral circuit structure including peripheral gate stacks on the peripheral circuit region of the substrate, a source structure including a source conductive pattern on the cell array region of the substrate, a lower electrode structure including lower insulating layers and lower electrodes that are vertically and alternately stacked on the source structure, a lower planarization insulating layer on an uppermost one of the lower electrodes of the lower electrode structure and the peripheral circuit structure, an upper electrode structure including upper electrodes and upper insulating layers that are vertically and alternately stacked on the lower planarization insulating layer on the cell array region, and a vertical semiconductor pattern that vertically extends on the cell array region and of which a portion of a sidewall of the vertical semiconductor pattern is in contact with the source conductive pattern.

BRIEF DESCRIPTION OF THE DRAWINGS

The inventive concepts will become more apparent in view of the attached drawings and accompanying detailed description.

FIGS. 9A to 20A are cross-sectional views taken along the line I-I' of FIG. 2 to illustrate a method of manufacturing a 3D semiconductor memory device according to some embodiments of the inventive concepts.

FIGS. 9B to 20B are cross-sectional views taken along the line II-IP of FIG. 2 to illustrate the method of manufacturing a 3D semiconductor memory device according to some embodiments of the inventive concepts.

FIGS. 21A to 26A are cross-sectional views illustrating a method of forming a source structure of a 3D semiconductor memory device according to some embodiments of the inventive concepts. FIGS. 21B to 26B are enlarged views of portions 'A' of FIGS. 21A to 26A, respectively.

DETAILED DESCRIPTION

Embodiments of the inventive concepts will be described hereinafter in detail with reference to the accompanying drawings.

Figure 1:
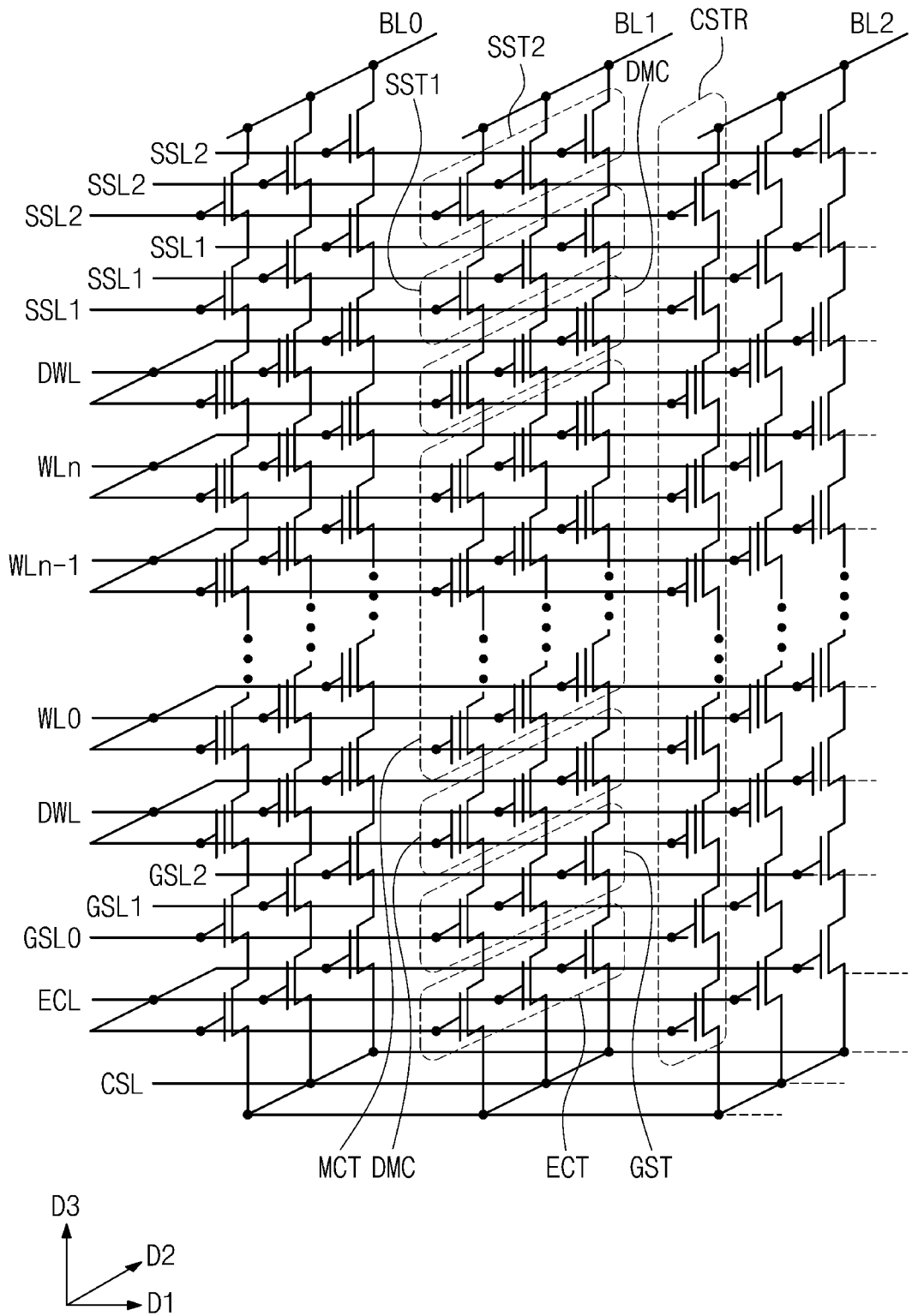
FIG. 1 is a schematic circuit diagram illustrating a cell array of a 3D semiconductor memory device according to some embodiments of the inventive concepts.

FIG. 1 is a schematic circuit diagram illustrating a cell array of a three-dimensional (3D) semiconductor memory device according to some embodiments of the inventive concepts.

Referring to FIG. 1, a cell array of a 3D semiconductor memory device may include a common source line CSL, a plurality of bit lines BL0 to BL2, and a plurality of cell strings CSTR disposed between the common source line CSL and respective ones of the bit lines BL0 to BL2.

The cell strings CSTR may be two-dimensionally arranged along first and second directions D1 and D2 and may extend in a third direction D3. The bit lines BL0 to BL2 may be spaced apart from each other in the first direction D1 and may extend in the second direction D2.

Respective ones of the plurality of the cell strings CSTR may be connected in parallel to one of the bit lines BL0 to BL2. The cell strings CSTR may be connected in common to the common source line CSL. In other words, a plurality of the cell strings CSTR may be disposed between one common source line CSL and a plurality of the bit lines BL0 to BL2. The common source line CSL may be provided in plurality, and the plurality of common source lines CSL may be two-dimensionally arranged. In some embodiments, the same voltage may be applied to the plurality of common source lines CSL. In certain embodiments, the common source lines CSL may be electrically controlled independently of each other.

In some embodiments, each of the cell strings CSTR may include string selection transistors SST1 and SST2 connected in series with each other, memory cell transistors MCT connected in series with each other, a ground selection transistor GST, and an erase control transistor ECT. Each of the memory cell transistors MCT may include a data storage element.

In some embodiments, each of the cell strings CSTR may include first and second string selection transistors SST1 and SST2 connected in series with each other, and the second string selection transistor SST2 may be connected to one of the bit lines BL0 to BL2. In some embodiments, each of the cell strings CSTR may include a single string selection transistor. In certain embodiments, in each of the cell strings CSTR, the ground selection transistor GST may include a plurality of MOS transistors connected in series with each other, similarly to the first and second string selection transistors SST1 and SST2.

One cell string CSTR may include the plurality of memory cell transistors MCT respectively disposed at different distances from the common source line CSL. The memory cell transistors MCT may be connected in series between the first string selection transistor SST1 and the ground selection transistor GST. The erase control transistor ECT may be connected between the ground selection transistor GST and the common source line CSL. In addition, each of the cell strings CSTR may further include dummy cell transistors DMC which are connected between the first string selection transistor SST1 and an uppermost one of the memory cell transistors MCT and/or between the ground selection transistor GST and a lowermost one of the memory cell transistors MCT, respectively.

In some embodiments, the first string selection transistor SST1 may be controlled by a first string selection line SSL1, and the second string selection transistor SST2 may be controlled by a second string selection line SSL2. The memory cell transistors MCT may be controlled by word lines WL0 to WLn, respectively, and the dummy cell transistors DMC may be controlled by dummy word lines DWL, respectively. The ground selection transistor GST may be controlled by a ground selection line GSL0, GSL1, or GSL2, and the erase control transistor ECT may be controlled by an erase control line ECL. The common source line CSL may be connected in common to sources of the erase control transistors ECT.

Gate electrodes of the memory cell transistors MCT (or the dummy cell transistors DMC) disposed at substantially the same level (or distance) from the common source line CSL may be connected in common to one of the word lines WL0 to WLn and DWL so as to be in an equipotential state. In some embodiments, even though the gate electrodes of the memory cell transistors MCT are disposed at substantially the same level from the common source line CSL, the gate electrodes disposed in one row (or one column) may be controlled independently of the gate electrodes disposed in another row (or another column).

The ground selection lines GSL0 to GSL2 and the string selection lines SSL1 and SSL2 may extend in the first direction D1 and may be spaced apart from each other in the second direction D2. The ground selection lines GSL0 to GSL2 disposed at substantially the same level from the common source line CSL may be electrically isolated from each other, and the string selection lines SSL1 or SSL2 disposed at substantially the same level from the common source line CSL may be electrically isolated from each other. In addition, the erase control transistors ECT of the cell strings CSTR different from each other may be controlled in common by the erase control line ECL. The erase control transistors ECT may generate a gate induced drain leakage (GIDL) in an erase operation of the cell array.

The number of elements illustrated in FIG. 1 is for convenience of description, but the present inventive concepts are not limited thereto. For example, though FIG. 1 illustrates three bit lines BL0 to BL2, it will be understood that more, or fewer, bit lines may be used without deviating from the present inventive concepts.

Figure 2:
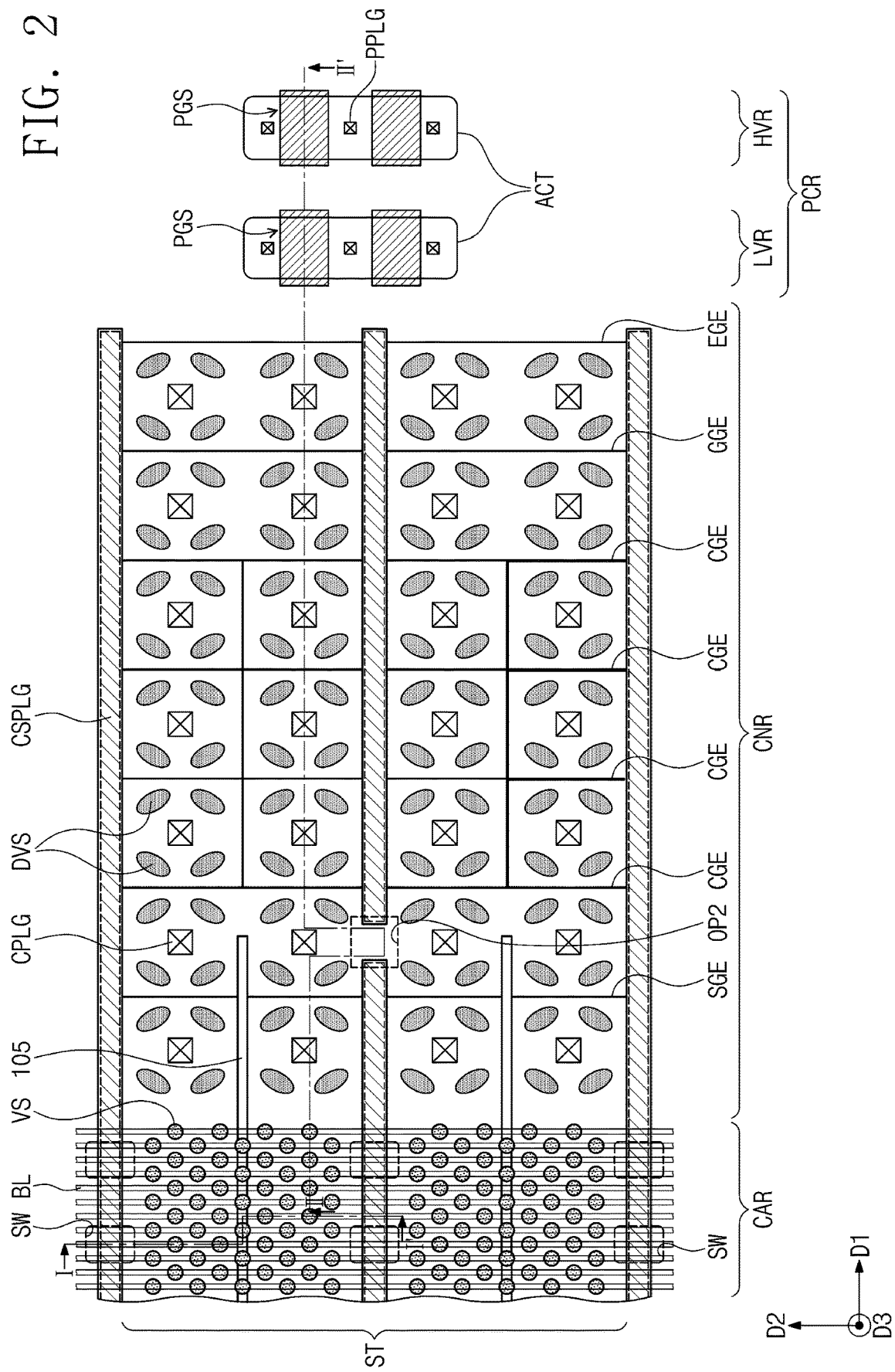
FIG. 2 is a plan view illustrating a 3D semiconductor memory device according to some embodiments of the inventive concepts.
Figure 3A:
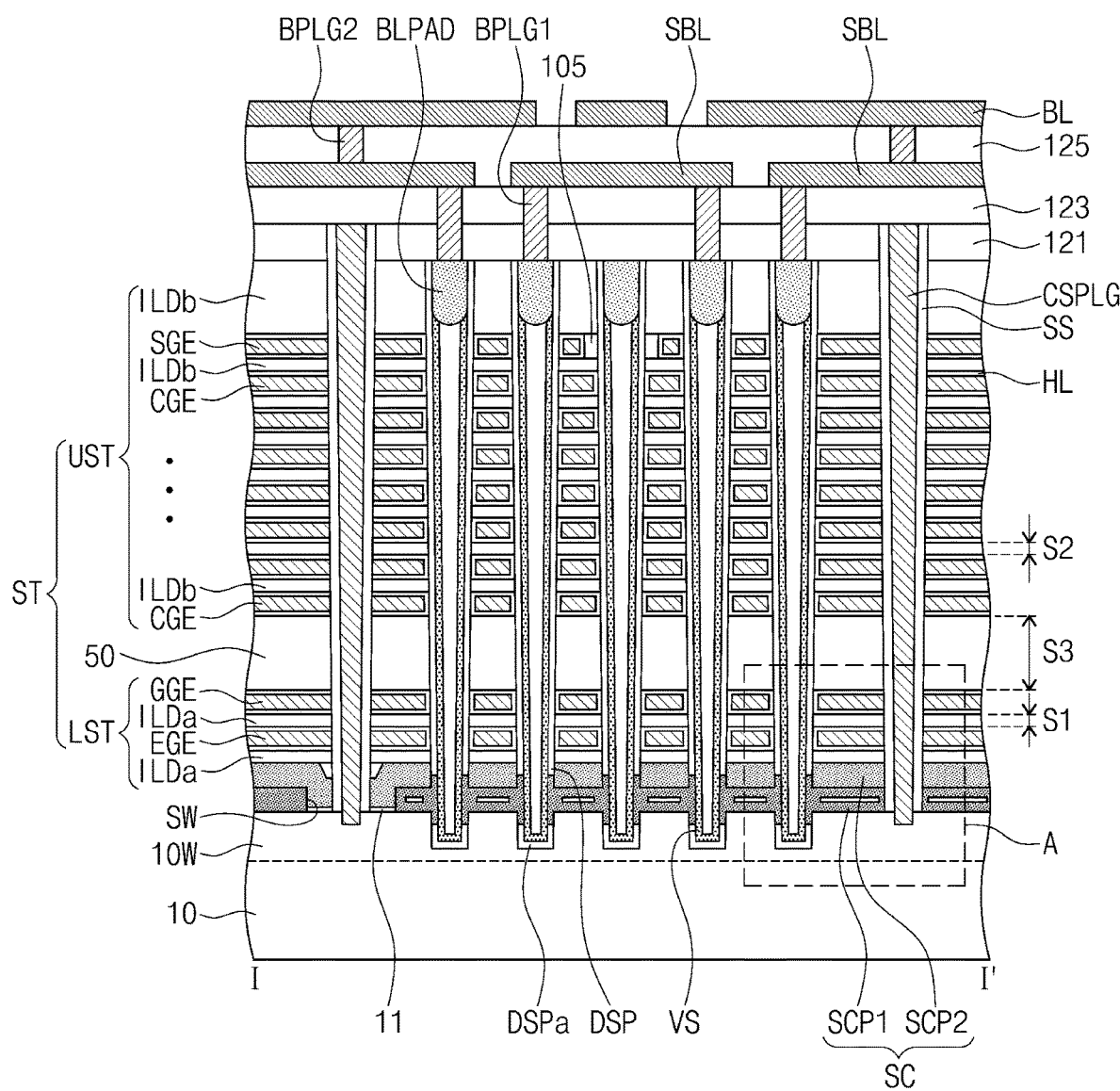
FIGS. 3A and 3B are cross-sectional views taken along lines I-I' and II-II' of FIG. 2, respectively, to illustrate a 3D semiconductor memory device according to some embodiments of the inventive concepts.
Figure 3B:
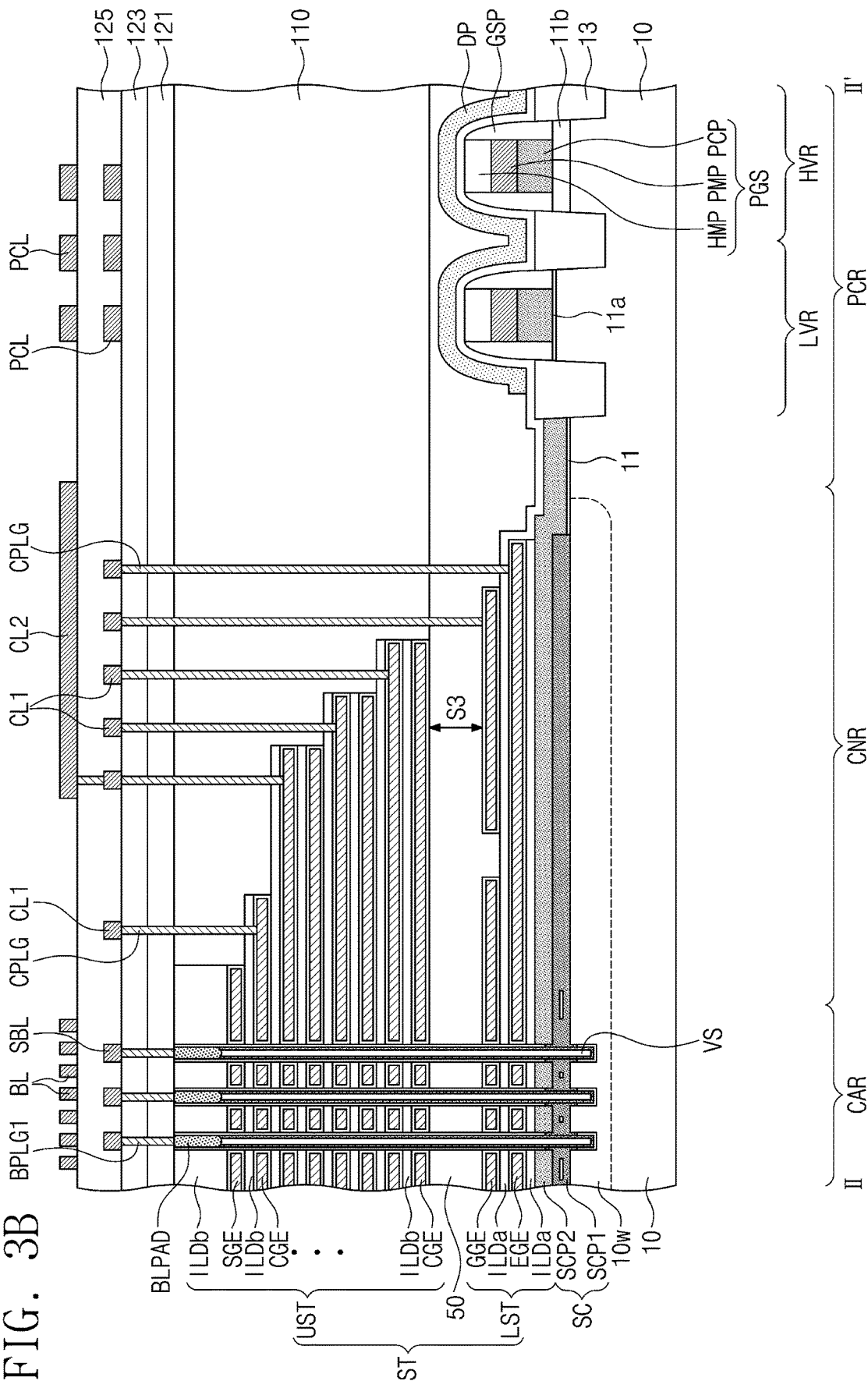
Figure 4A:
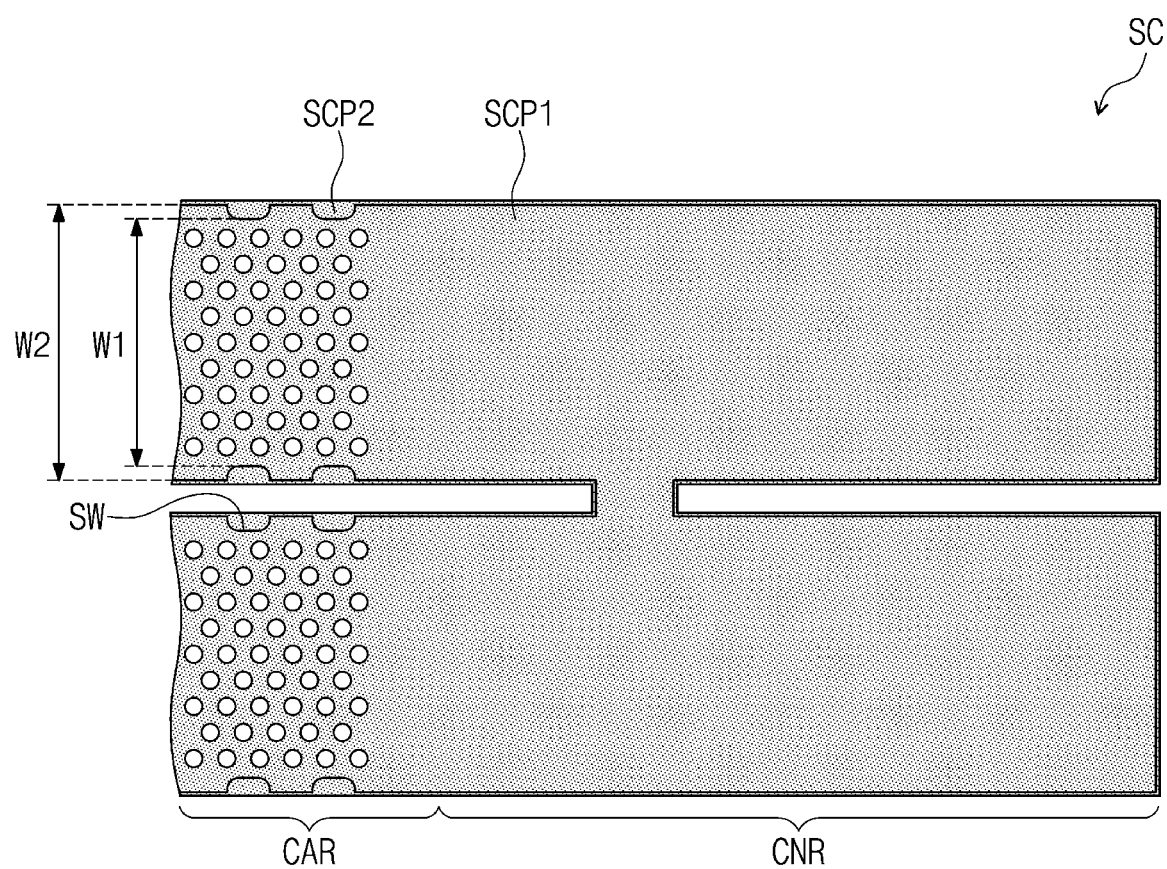
FIG. 4A is a plan view illustrating a source structure according to some embodiments of the inventive concepts.
Figure 4B:
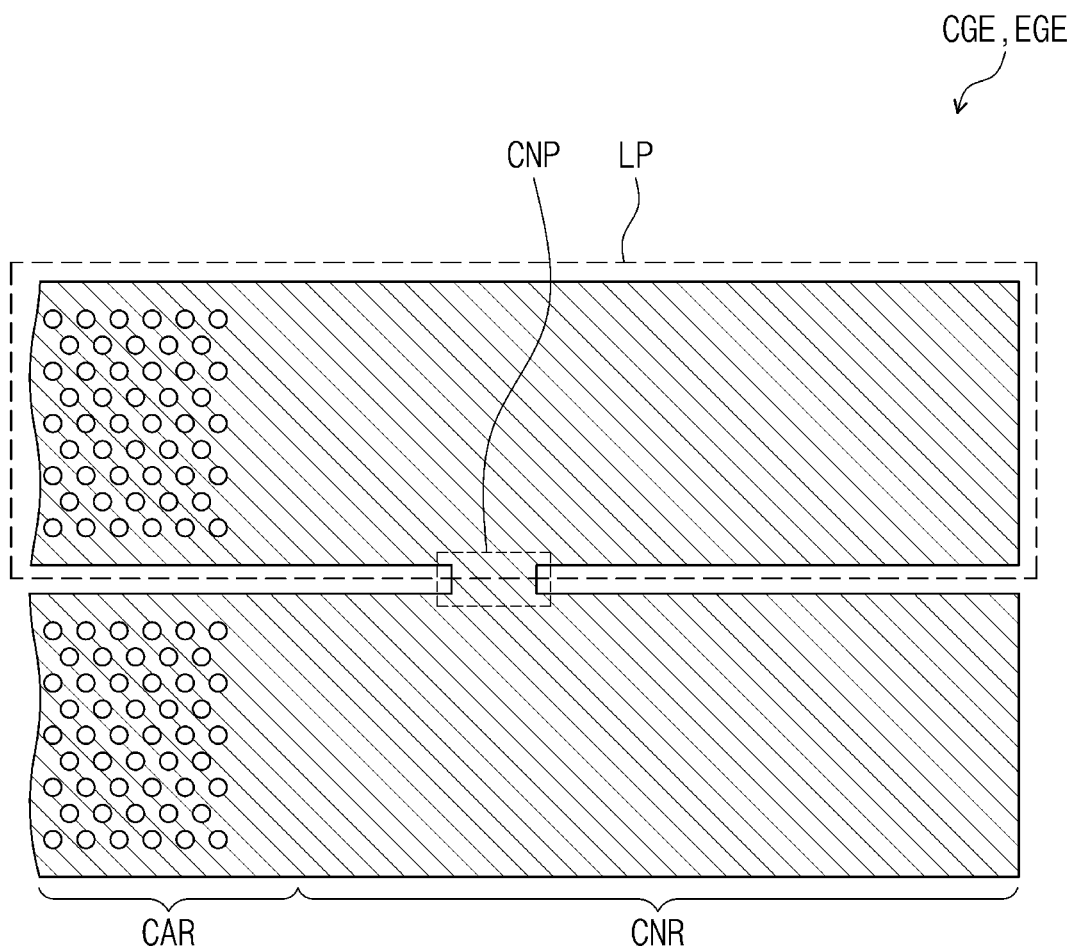
FIG. 4B is a plan view illustrating a cell gate electrode and an erase control gate electrode, which may be included in an electrode structure according to some embodiments of the inventive concepts.
Figure 4C:
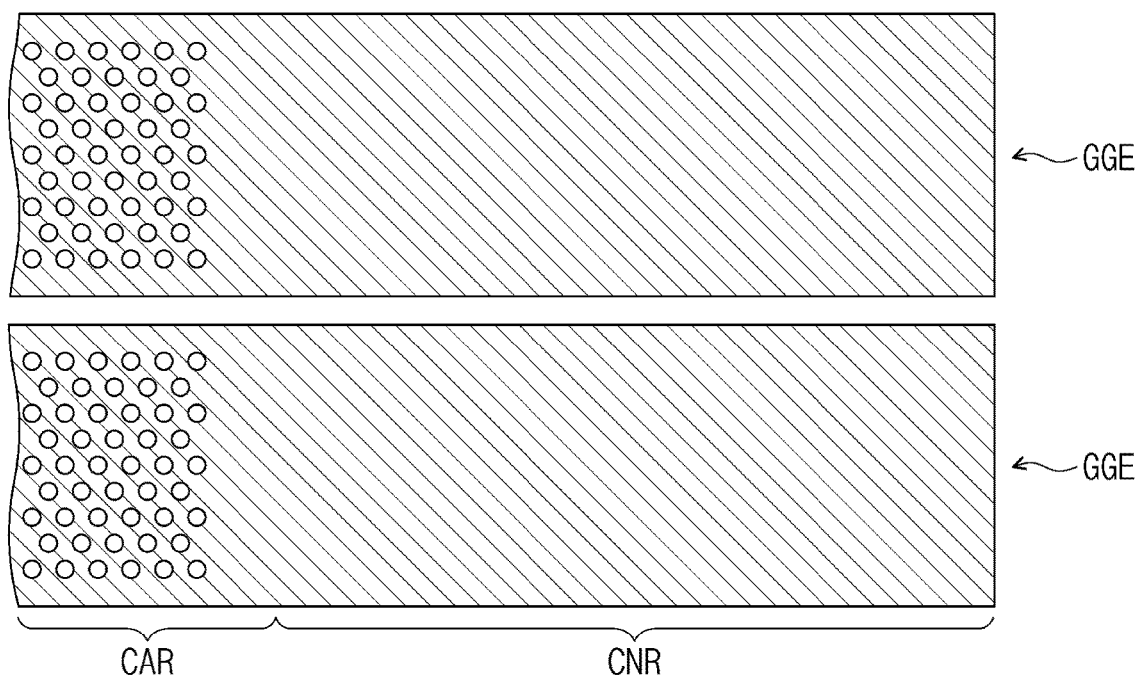
FIG. 4C is a plan view illustrating ground selection gate electrodes included in an electrode structure according to some embodiments of the inventive concepts.
Figure 4C:
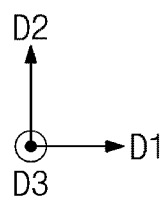
Figure 5A:
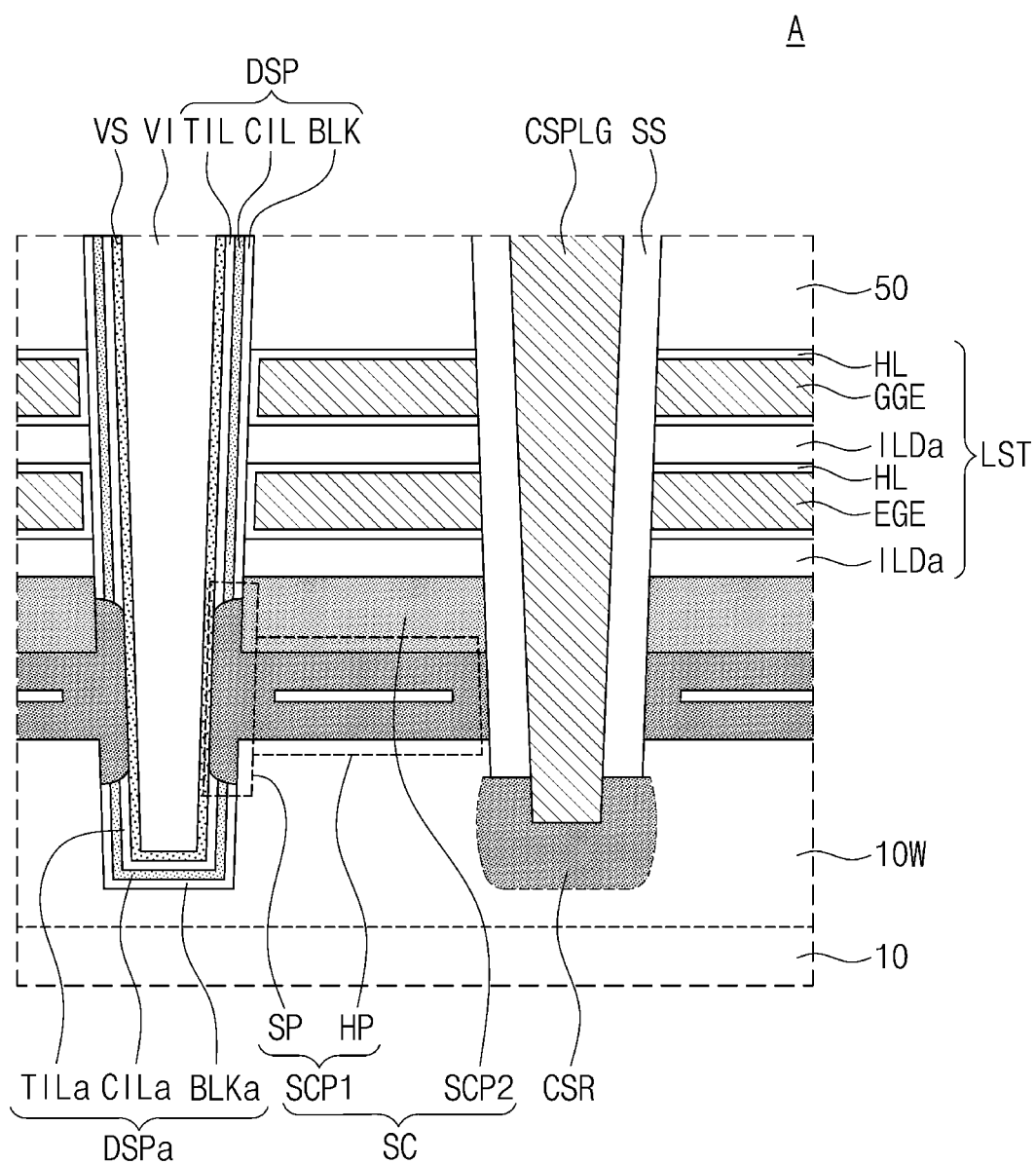
FIGS. 5A and 5B are enlarged views of a portion 'A' of FIG. 3A.
Figure 5B:
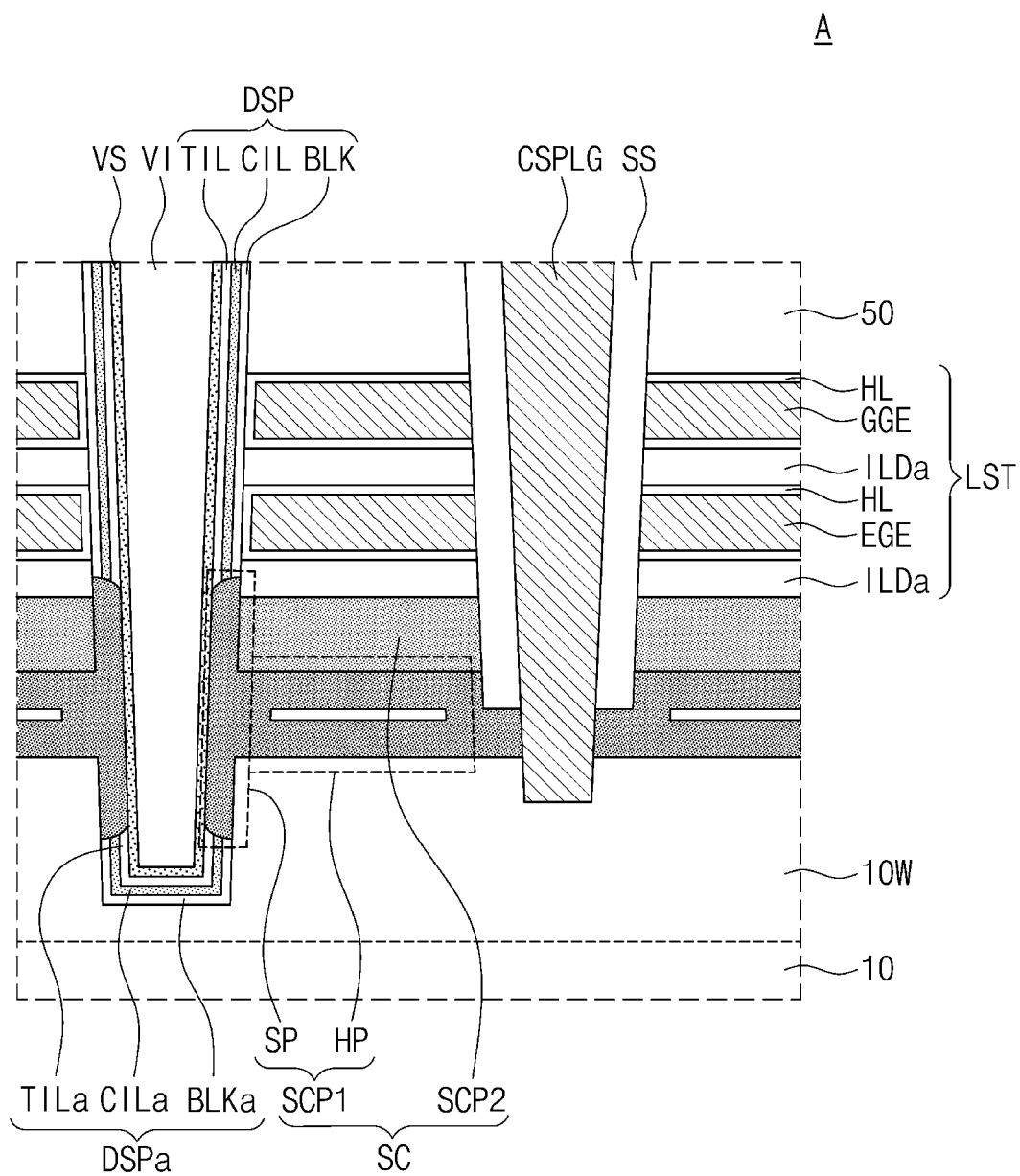
Figure 6:
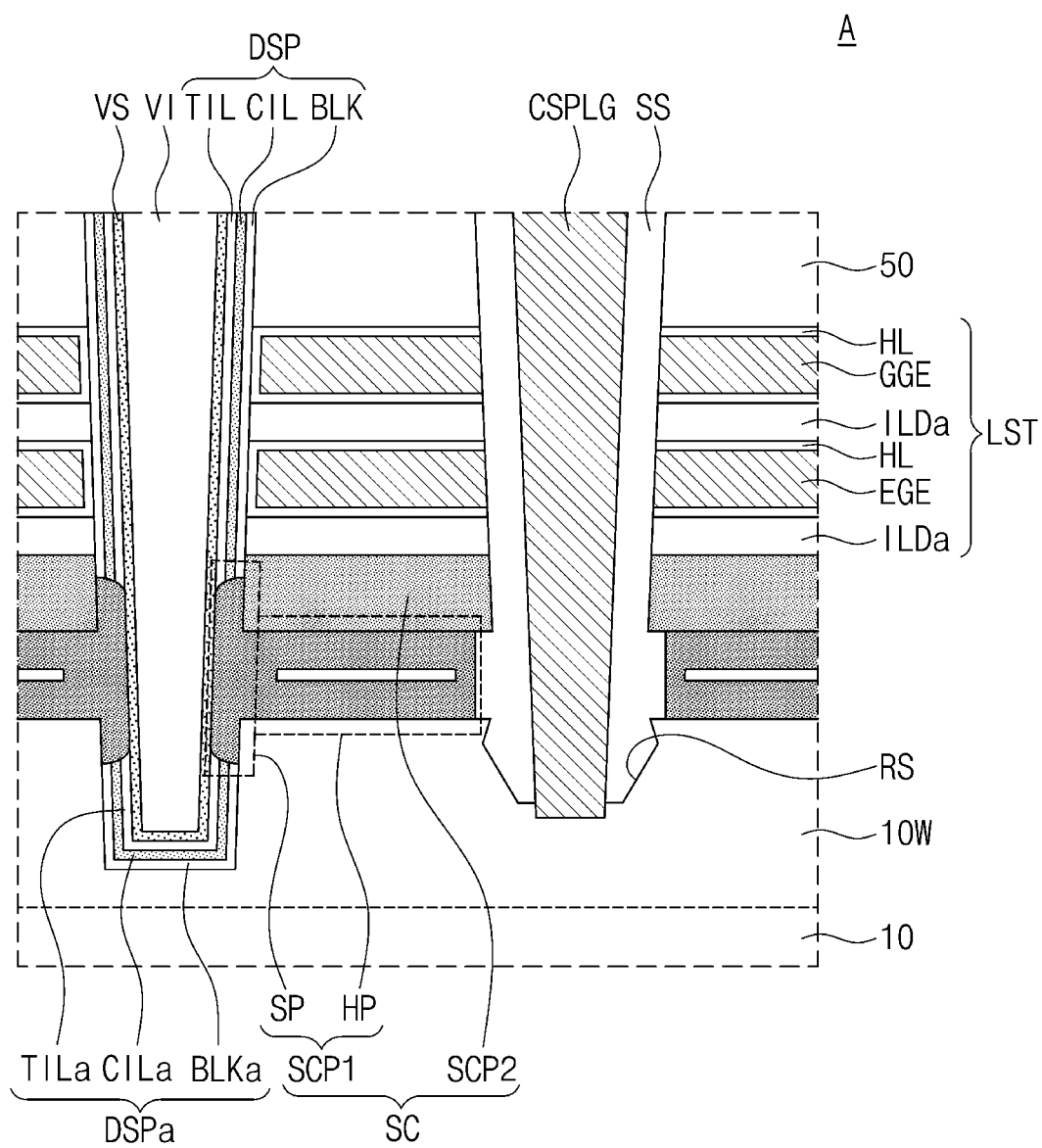
FIG. 6 is an enlarged view illustrating a portion of a 3D semiconductor memory device according to some embodiments of the inventive concepts.

FIG. 2 is a plan view illustrating a 3D semiconductor memory device according to some embodiments of the inventive concepts. FIGS. 3A and 3B are cross-sectional views taken along lines I-I' and II-II' of FIG. 2, respectively, to illustrate a 3D semiconductor memory device according to some embodiments of the inventive concepts. FIG. 4A is a plan view illustrating a source structure according to some embodiments of the inventive concepts. FIG. 4B is a plan view illustrating a cell gate electrode and an erase control gate electrode which are included in an electrode structure according to some embodiments of the inventive concepts, and FIG. 4C is a plan view illustrating ground selection gate electrodes according to some embodiments of the inventive concepts. FIGS. 5A and 5B are enlarged views of a portion 'A' of FIG. 3A. FIG. 6 is an enlarged view illustrating a portion of a 3D semiconductor memory device according to some embodiments of the inventive concepts.

Referring to FIGS. 2, 3A and 3B, a substrate 10 may include a cell array region CAR, a connection region CNR, and a peripheral circuit region PCR. The connection region CNR may be located between the cell array region CAR and the peripheral circuit region PCR. The substrate 10 may include a material having a semiconductor characteristic (e.g., a silicon wafer), an insulating material (e.g., a glass substrate), and/or a semiconductor or conductor covered with an insulating material. For example, the substrate 10 may be a silicon wafer having a first conductivity type.

A 3D semiconductor memory device according to some embodiments of the inventive concepts may include a peripheral circuit structure provided on the peripheral circuit region PCR of the substrate 10, an electrode structure ST provided on the cell array region CAR of the substrate 10, a source structure SC provided between the electrode structure ST and the substrate 10, vertical semiconductor patterns VS penetrating the electrode structure ST and the source structure SC and electrically connected to the source structure SC, and a data storage pattern DSP between the electrode structure ST and each of the vertical semiconductor patterns VS. In addition, an interconnection structure connecting memory cells to the peripheral circuit structure (e.g., peripheral logic circuits) may be provided on the connection region CNR.

In some embodiments, the peripheral circuit structure may include row and column decoders, a page buffer, and/or control circuits. For example, the peripheral circuit structure may include high-voltage and low-voltage transistors, a resistor, and/or a capacitor. In more detail, the peripheral circuit region PCR may include a low-voltage region LVR and a high-voltage region HVR, the low-voltage transistor may be provided on the low-voltage region LVR, and the high-voltage transistor may be provided on the high-voltage region HVR.

A device isolation layer 13 may be disposed in the peripheral circuit region PCR of the substrate 10 to define active regions ACT. Peripheral gate stacks PGS may be disposed on the peripheral circuit region PCR to intersect the active regions ACT. A first gate insulating layer 11a that is thin may be disposed between the low-voltage region LVR of the substrate 10 and the peripheral gate stack PGS, and a second gate insulating layer 11b that is thick may be disposed between the high-voltage region HVR of the substrate 10 and the peripheral gate stack PGS. Source and drain dopant regions may be provided in the active region ACT at both sides of each of the peripheral gate stacks PGS. Each of the peripheral gate stacks PGS may include a peripheral poly-silicon pattern PCP doped with dopants, a gate metal pattern PMP, and a peripheral hard mask pattern HMP, which are sequentially stacked on the first and/or second gate insulating layer 11a or 11b. Spacers GSP may be on and, in some embodiments, cover both sidewalls of each of the peripheral gate stacks PGS.

A dummy sacrificial pattern DP may be disposed conformally on and may, in some embodiments, cover the peripheral gate stacks PGS and a top surface of the substrate 10 of the peripheral circuit region PCR. For example, the dummy sacrificial pattern DP may be formed of silicon nitride.

A well dopant region 10w may be provided in the substrate 10 of the cell array region CAR and the connection region CNR. The well dopant region 10w may include dopants which have a second conductivity type opposite to the first conductivity type of the substrate 10. For example, the well dopant region 10w may include phosphorus (P) and/or arsenic (As). In certain embodiments, the well dopant region 10w may be omitted.

According to some embodiments, the source structure SC may be disposed on the well dopant region 10w. The source structure SC may be parallel to the top surface of the substrate 10 and may extend in a first direction D1 in parallel to the electrode structure ST. The source structure SC may include first and second source conductive patterns SCP1 and SCP2 which are sequentially stacked. The first source conductive pattern SCP1 may be in contact with the well dopant region 10w and the second source conductive pattern SCP2 may be in contact with a top surface of the first source conductive pattern SCP1. In certain embodiments, a gate insulating layer 11 may be disposed between the first source conductive pattern SCP1 and the well dopant region 10w. A bottom surface of the first source conductive pattern SCP1 may be located at a lower level (e.g., closer to a bottom surface of the substrate 10) than bottom surfaces of the peripheral gate stacks PGS.

The first and second source conductive patterns SCP1 and SCP2 may be formed of a semiconductor material doped with dopants (e.g., phosphorus (P) and/or arsenic (As)) having the second conductivity type opposite to the first conductivity type of the substrate 10. In some embodiments, the first and second source conductive patterns SCP1 and SCP2 may be formed of poly-silicon doped with N-type dopants, and a concentration of the N-type dopants in the first source conductive pattern SCP1 may be greater than a concentration of the N-type dopants in the second source conductive pattern SCP2. In some embodiments, the second source conductive pattern SCP2 may include the same material as the peripheral poly-silicon patterns PCP of the peripheral gate stacks PGS.

As illustrated in FIGS. 2, 3A and 4A, the first source conductive pattern SCP1 may include portions which have recessed sidewalls SW. In other words, the first source conductive pattern SCP1 may include first portions having a first width W1 and second portions having a second width W2 greater than the first width W1. The second source conductive pattern SCP2 may extend from the top surface of the first source conductive pattern SCP1 onto the recessed sidewalls SW of the first source conductive pattern SCP1. A portion of the second source conductive pattern SCP2 may be in contact with the gate insulating layer 11 disposed on the substrate 10 and/or the well dopant region 10w. In some embodiments, a portion of the second source conductive pattern SCP2 may be in contact with the substrate 10 and/or the well dopant region 10w.

In some embodiments, the first source conductive pattern SCP1 may be in contact with portions of sidewalls of the vertical semiconductor patterns VS. In more detail, referring to FIG. 5A, the first source conductive pattern SCP1 may include a sidewall portion SP and a horizontal portion HP. The sidewall portion SP may be in contact with the portion of the sidewall of the vertical semiconductor pattern VS and may surround the portion of the sidewall of the vertical semiconductor pattern VS. The horizontal portion HP may be substantially parallel to the top surface of the substrate 10 under the electrode structure ST. A top surface of the horizontal portion HP of the first source conductive pattern SCP1 may be in contact with a bottom surface of the second source conductive pattern SCP2, and a bottom surface of the horizontal portion HP of the first source conductive pattern SCP1 may be in contact with the well dopant region 10w. The sidewall portion SP of the first source conductive pattern SCP1 may be on and, in some embodiments, cover a portion of a sidewall of the second source conductive pattern SCP2 and a portion of the substrate 10.

Referring to FIGS. 5A and 5B, a top surface of the sidewall portion SP of the first source conductive pattern SCP1 may be located at a lower level (e.g., closer to a bottom surface of the substrate 10) than a bottom surface of an erase control gate electrode EGE. In some embodiments, the top surface of the sidewall portion SP of the first source conductive pattern SCP1 may be located at a level between the top surface and the bottom surface of the second source conductive pattern SCP2, as illustrated in FIG. 5A. In some embodiments, the top surface of the sidewall portion SP of the first source conductive pattern SCP1 may be located at a higher level than the top surface of the second source conductive pattern SCP2, as illustrated in FIG. 5B.

In some embodiments, the electrode structure ST may extend from the cell array region CAR onto the connection region CNR in the first direction D1 and may have a stepped structure on the connection region CNR. The electrode structure ST may be disposed between source contact plugs CSPLG extending in the first direction D1. Insulating spacers SS formed of an insulating material may be disposed between the electrode structure ST and the source contact plugs CSPLG.

The electrode structure ST may include electrodes EGE, GGE, CGE, and SGE stacked in a third direction D3 (e.g., a vertical direction) crossing (and, in some embodiments, perpendicular to) the first and second directions D1 and D2. Lengths, in the first direction D1, of the electrodes EGE, GGE, CGE, and SGE of the electrode structure ST may sequentially decrease as a vertical distance from the substrate 10 increases, and a height of the electrode structure ST may decrease as a horizontal distance from the cell array region CAR increases. Each of the electrodes EGE, GGE, CGE, and SGE may have a pad portion on the connection region CNR, and the pad portions of the electrodes EGE, GGE, CGE, and SGE may be located at positions which are horizontally and vertically different from each other.

In some embodiments, the electrode structure ST may include a lower electrode structure LST, an upper electrode structure UST, and a lower planarization insulating layer 50 provided between the lower electrode structure LST and the upper electrode structure UST. Here, the lower electrode structure LST may include lower insulating layers ILDa and lower electrodes EGE and GGE, which are alternately stacked on the source structure SC. The lower planarization insulating layer 50 may be on and, in some embodiments, cover the lower electrode structure LST on the cell array region CAR and may be on and, in some embodiments, cover the peripheral circuit structure on the peripheral circuit region PCR. The upper electrode structure UST may include upper electrodes CGE and SGE and upper insulating layers ILDb, which are alternately stacked on the lower planarization insulating layer 50. For example, the lower and upper electrodes EGE, GGE, CGE, and SGE may include at least one of a doped semiconductor material (e.g., doped silicon), a metal (e.g., tungsten, copper, and/or aluminum), a conductive metal nitride (e.g., titanium nitride and/or tantalum nitride), and/or a transition metal (e.g., titanium or tantalum). The lower and upper insulating layers ILDa and ILDb may include a silicon oxide layer and/or a low-k dielectric layer.

In some embodiments, the lower electrodes EGE and GGE may include the erase control gate electrode EGE and a plurality of ground selection gate electrodes GGE disposed on the erase control gate electrode EGE. The erase control gate electrode EGE may be adjacent to the source structure SC and may be used as gate electrodes of the erase control transistors ECT (see FIG. 1) controlling an erase operation of a memory cell array. The erase control gate electrode EGE may include line portions LP extending in the first direction D1 and a connection portion CNP connecting the line portions LP, as illustrated in FIG. 4B. The erase control gate electrode EGE may be used as the gate electrodes of the erase control transistors ECT (see FIG. 1) which are used to generate the gate induced drain leakage (GIDL). The plurality of ground selection gate electrodes GGE may have line shapes extending in the first direction D1, as illustrated in FIG. 4C. The plurality of ground selection gate electrodes GGE may be disposed at the same level from the top surface of the substrate 10 and may be spaced apart from each other. The ground selection gate electrodes GGE may be used as gate electrodes of the ground selection transistors GST (see FIG. 1) which control electrical connection between the common source line CSL (see FIG. 1) and the vertical semiconductor patterns VS.

The upper electrodes CGE and SGE may include cell gate electrodes CGE and string selection gate electrodes SGE. The cell gate electrodes CGE may be disposed at different levels from each other with respect to the top surface of the substrate 10. The cell gate electrodes CGE may be used as control gate electrodes (e.g., WL0 to WL3 and DWL of FIG. 1) of the memory and dummy cell transistors MCT and DMC. The string selection gate electrodes SGE may be laterally spaced apart from each other by an isolation insulating pattern 105 disposed on an uppermost cell gate electrode CGE. In the electrode structure ST, the string selection gate electrodes SGE corresponding to an uppermost layer may be used as gate electrodes of the string selection transistors SST2 (see FIG. 1) which control electrical connection between bit lines BL and the vertical semiconductor patterns VS. In the present embodiment, the first string selection transistors SST1 of FIG. 1 are omitted. In some embodiments, the electrode structure ST may further include string selection gate electrodes SGE used as gate electrodes of the first string selection transistors SST1 of FIG. 1. In some embodiments, each of the cell gate electrodes CGE may include line portions LP extending in the first direction D1 and a connection portion CNP connecting the line portions LP, as illustrated in FIG. 4B.

In some embodiments, the lower planarization insulating layer 50 may be thicker than each of the lower insulating layers ILDa and/or each of the upper insulating layers ILDb. That is, a distance S3 between the lower electrode GGE and the upper electrode CGE adjacent to each other may be greater than a distance S1 between the lower electrodes EGE and GGE adjacent to each other and/or a distance S2 between the upper electrodes CGE and SGE adjacent to each other. In other words, a distance S3 between the ground selection gate electrode GGE and a lowermost cell gate electrode CGE may be greater than a distance S2 between the cell gate electrodes CGE adjacent to each other and/or may be greater than a distance S1 between the erase control gate electrode EGE and the ground selection gate electrode GGE adjacent to each other. The lower planarization insulating layer 50 may extend from the cell array region CAR onto the peripheral circuit region PCR. The lower planarization insulating layer 50 may be on and, in some embodiments cover, the peripheral gate stacks PGS and the dummy sacrificial pattern DP on the peripheral circuit region PCR. The lower planarization insulating layer 50 may include a single insulating layer or a plurality of stacked insulating layers. For example, the lower planarization insulating layer 50 may include a silicon oxide layer and/or a low-k dielectric layer.

An upper planarization insulating layer 110 may be disposed on the substrate 10 to on and, in some embodiments cover, the electrode structure ST and the lower planarization insulating layer 50 of the peripheral circuit region PCR. The upper planarization insulating layer 110 may have a substantially flat top surface and may have a maximum thickness on the peripheral circuit region PCR. The upper planarization insulating layer 110 may include a single insulating layer or a plurality of stacked insulating layers. For example, the upper planarization insulating layer 110 may include a silicon oxide layer and/or a low-k dielectric layer.

The vertical semiconductor patterns VS may be disposed on the cell array region CAR of the substrate 10, and dummy semiconductor patterns DVS may be disposed on the connection region CNR of the substrate 10. The vertical semiconductor patterns VS and the dummy semiconductor patterns DVS may extend in the third direction D3 substantially perpendicular to the top surface of the substrate 10 to penetrate the electrode structure ST and the source structure SC.

In some embodiments, sidewalls of lower portions of the vertical and dummy semiconductor patterns VS and DVS may be in contact with the source structure SC. In more detail, the vertical semiconductor patterns VS may be in contact with the sidewall portions SP of the first source conductive pattern SCP1.

The vertical semiconductor patterns VS may be arranged in a line in one direction or may be arranged in a zigzag form in one direction. The dummy semiconductor patterns DVS may penetrate end portions of the electrodes. In some embodiments, each of the vertical semiconductor patterns VS may have a pipe or macaroni shape of which a bottom end is closed. The vertical semiconductor patterns VS may include, for example, a semiconductor material such as silicon (Si), germanium (Ge), or a combination thereof. In some embodiments, the vertical semiconductor patterns VS may include a semiconductor material doped with dopants or an intrinsic semiconductor material not doped with dopants. The vertical semiconductor patterns VS may include, for example, a poly-crystalline semiconductor material. An insulating material VI may be formed on interior sidewalls of the vertical semiconductor patterns VS to be within and, in some embodiments fill, an interior space formed by the vertical semiconductor patterns VS. The vertical semiconductor patterns VS including the semiconductor material may be used as channel regions of the erase control, string, ground, and memory cell transistors ECT, SST2, GST, and MCT described with reference to FIG. 1. A bit line conductive pad BLPAD may be formed on a top end of each of the vertical semiconductor patterns VS. The bit line conductive pad BLPAD may be a dopant region doped with dopants and/or may be formed of a conductive material. The bit line conductive pad BLPAD may be connected to the bit line BL. According to some embodiments, in the erase operation of the memory cell array, an erase voltage may be applied to the bit line BL and the source structure SC to generate a gate induced leakage current at the string selection transistor SST2 (see FIG. 1) and the erase control transistor ECT (see FIG. 1).

The dummy semiconductor patterns DVS may penetrate the pad portions of the electrodes on the connection region CNR. Widths of the dummy semiconductor patterns DVS may be greater than widths of the vertical semiconductor patterns VS. In some embodiments, the widths of the dummy semiconductor patterns DVS may be substantially equal to the widths of the vertical semiconductor patterns VS. In addition, the dummy semiconductor patterns DVS may have substantially the same stack structure and material as the vertical semiconductor patterns VS.

The data storage pattern DSP may be disposed between the electrode structure ST and each of the vertical semiconductor patterns VS. The data storage pattern DSP may extend in the third direction D3 and may be on and, in some embodiments, may surround a sidewall of each of the vertical semiconductor patterns VS. In other words, the data storage pattern DSP may have a pipe or macaroni shape of which top and bottom ends are opened.

In some embodiments, a bottom surface of the data storage pattern DSP may be disposed at a lower level than the bottom surface of the erase control gate electrode EGE and may be in contact with the sidewall portion SP of the first source conductive pattern SCP1, as illustrated in FIG. 5A. In some embodiments, a lower portion of the data storage pattern DSP may be disposed between the vertical semiconductor pattern VS and the second source conductive pattern SCP2.

The data storage pattern DSP may be disposed on the sidewall portion SP of the first source conductive pattern SCP1. A thickness of the data storage pattern DSP on the sidewall of the vertical semiconductor pattern VS may be substantially equal to a thickness of the sidewall portion SP of the first source conductive pattern SCP1.

The bottom surface of the data storage pattern DSP may be disposed at a lower level than the top surface of the second source conductive pattern SCP2, as illustrated in FIG. 5A. In some embodiments, the bottom surface of the data storage pattern DSP may be disposed at a level between the top surface of the second source conductive pattern SCP2 and the bottom surface of the erase control gate electrode EGE, as illustrated in FIG. 5B.

The data storage pattern DSP may include a single layer or a plurality of layers. In some embodiments, the data storage pattern DSP may be a data storage layer of a NAND flash memory device and may include a tunnel insulating layer TIL, a charge storage layer CIL, and a blocking insulating layer BLK, which are sequentially stacked on the sidewall of the vertical semiconductor pattern VS. For example, the charge storage layer CIL may include a trap insulating layer, a floating gate electrode, and/or an insulating layer including conductive nano dots. In more detail, the charge storage layer CIL may include, for example, at least one of a silicon nitride layer, a silicon oxynitride layer, a silicon-rich nitride layer, a nano-crystalline silicon layer, and/or a laminated trap layer. The tunnel insulating layer TIL may include at least one of materials having energy band gaps greater than that of the charge storage layer CIL, and the blocking insulating layer BLK may include a high-k dielectric layer such as an aluminum oxide layer and/or a hafnium oxide layer.

According to some embodiments, a dummy data storage pattern DSPa may be vertically spaced apart from the data storage pattern DSP and may be disposed in the substrate 10. The dummy data storage pattern DSPa may have a cross section which has a substantial U-shape, and the vertical semiconductor pattern VS may be spaced apart from the substrate 10 by the dummy data storage pattern DSPa. In other words, portions of the dummy data storage pattern DSPa may be disposed between a bottom surface of the vertical semiconductor pattern VS and the substrate 10. In some embodiments, a top surface of the dummy data storage pattern DSPa may be disposed at a lower level than the top surface of the substrate 10. The dummy data storage pattern DSPa may have substantially the same layer structure as the data storage pattern DSP. In other words, the dummy data storage pattern DSPa may include a tunnel insulating layer TILa, a charge storage layer CILa, and a blocking insulating layer BLKa, which are sequentially stacked on the bottom surface and the sidewall of the vertical semiconductor pattern VS.

A horizontal insulating pattern HL may be provided between the data storage pattern DSP and one sidewall of each of the electrodes EGE, GGE, CGE, and SGE. The horizontal insulating pattern HL may extend from the one sidewall of each of the electrodes EGE, GGE, CGE, and SGE onto top and bottom surfaces of each of the electrodes EGE, GGE, CGE, and SGE. The horizontal insulating pattern HL may be a portion of the data storage layer of the NAND flash memory device. For example, the horizontal insulating pattern HL may include a charge storage layer and a blocking insulating layer. In some embodiments, the horizontal insulating pattern HL may include at least a portion of the blocking insulating layer.

Referring to FIGS. 2 and 5A, common source regions CSR may extend in the first direction D1 in parallel to the electrode structure ST and may be provided in the substrate 10. The common source regions CSR may include dopants of which a conductivity type is opposite to that of the substrate 10. For example, the common source regions CSR may include N-type dopants (e.g., arsenic (As) and/or phosphorus (P)). The source contact plug CSPLG may be connected to the common source region CSR, as illustrated in FIG. 5A. In some embodiments, the common source region CSR may be omitted and the source contact plug CSPLG may be connected to the well dopant region 10w, as illustrated in FIG. 5B.

According to embodiments illustrated in FIG. 6, a sidewall of the first source conductive pattern SCP1 may be laterally recessed from sidewalls of the electrodes EGE, GGE, CGE, and SGE of the electrode structure ST. In addition, the substrate 10 may have a substrate recess region RS adjacent the source contact plug CSPLG. The substrate recess region RS may be defined by sidewalls inclined with respect to the top surface of the substrate 10.

Referring again to FIGS. 2, 3A, and 3B, first, second, and third interlayer insulating layers 121, 123, and 125 may be sequentially stacked on the upper planarization insulating layer 110 and may be on and, in some embodiments, cover the electrode structure ST, the vertical semiconductor patterns VS, and the dummy semiconductor patterns DVS. Sub-bit lines SBL may be disposed on the second interlayer insulating layer 123 of the cell array region CAR and may be electrically connected to the vertical semiconductor patterns VS through bit line contact plugs BPLG1. The bit line contact plugs BPLG1 may be connected to the bit line conductive pads BLPAD. The bit lines BL may be disposed on the third interlayer insulating layer 125 and may extend in the second direction D2 on the electrode structure ST. The bit lines BL may be connected to the sub-bit lines SBL through bit line contact plugs BPLG2. First and second interconnection lines CL1 and CL2 may be disposed on the second and third interlayer insulating layers 123 and 125 of the connection region CNR and may be electrically connected to cell contact plugs CPLG. Peripheral circuit interconnection lines PCL may be disposed on the second and third interlayer insulating layers 123 and 125 of the peripheral circuit region PCR and may be electrically connected to peripheral contact plugs PPLG.

According to some embodiments of the inventive concepts, the erase operation of memory cells (i.e., the memory cell transistors) may be performed by generating the gate induced drain leakage (GIDL) at the erase control transistors ECT (see FIG. 1) of the cell strings. The erase operation will be described briefly. An erase voltage (Vera) may be applied to the first source conductive pattern SCP1 to generate a potential difference between the erase control gate electrode EGE and the first source conductive pattern SCP1. At this time, 0V or a negative voltage may be applied to the erase control gate electrode EGE. Thus, a GIDL phenomenon may be generated in the vicinity of the sidewall portion SP of the first source conductive pattern SCP1 adjacent to the erase control gate electrode EGE. In other words, a depletion layer may be induced in the vicinity of the sidewall portion SP of the first source conductive pattern SCP1 adjacent to the erase control gate electrode EGE, and electron-hole pairs may be generated in the depletion layer. At this time, since the high erase voltage is applied to the first source conductive pattern SCP1, electrons may be attracted to the first source conductive pattern SCP1 and holes may be provided into the vertical semiconductor pattern VS so as to be accumulated in the vertical semiconductor pattern VS adjacent to the electrode structure ST. Since the holes are accumulated in the vertical semiconductor pattern VS, charges trapped in the memory cells may be discharged to the vertical semiconductor pattern VS. As a result, data stored in the memory cells may be erased.

Figure 7A:
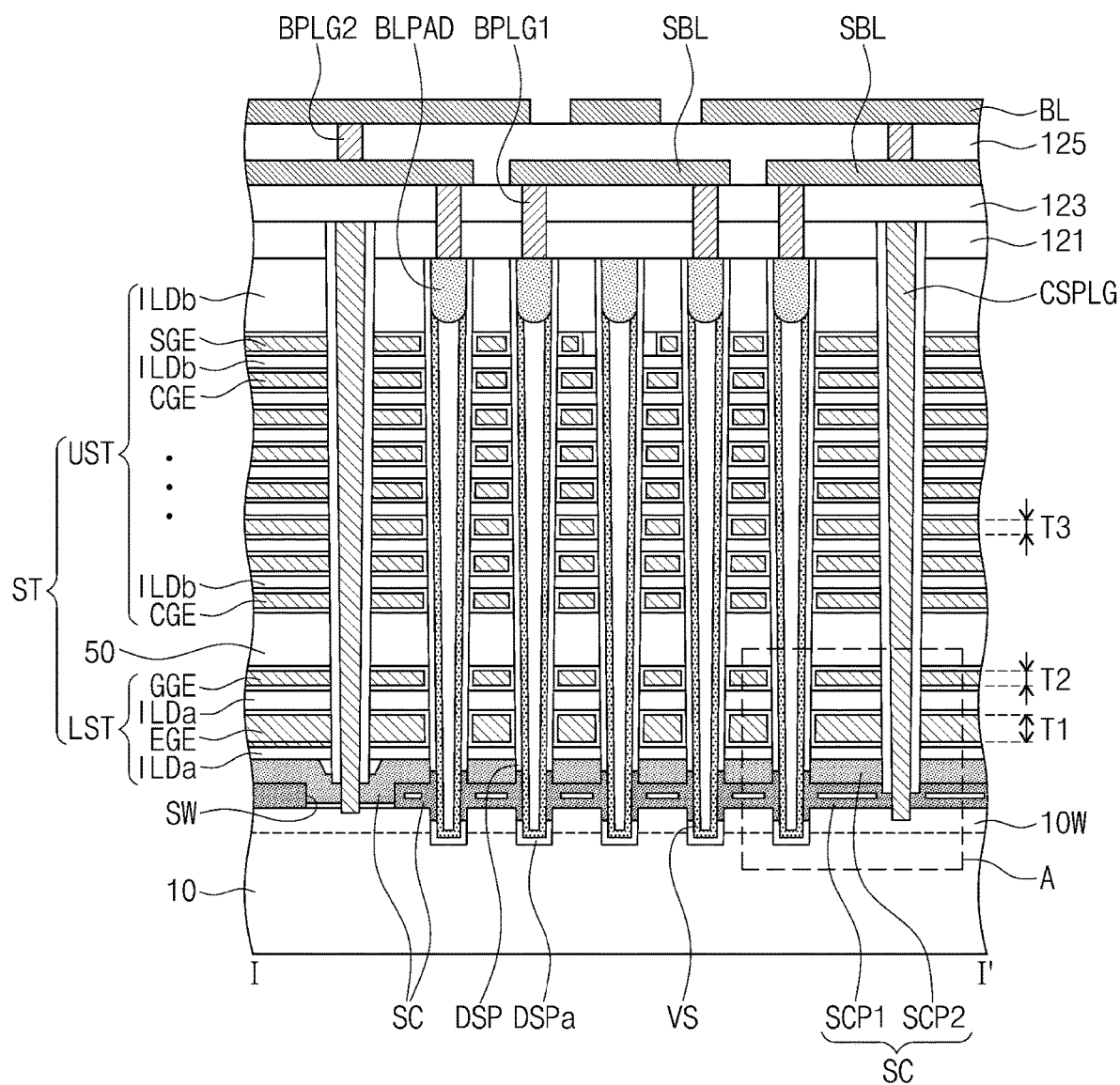
FIG. 7A is a cross-sectional view taken along the line I-I' of FIG. 2 to illustrate a 3D semiconductor memory device according to some embodiments of the inventive concepts.
Figure 7B:
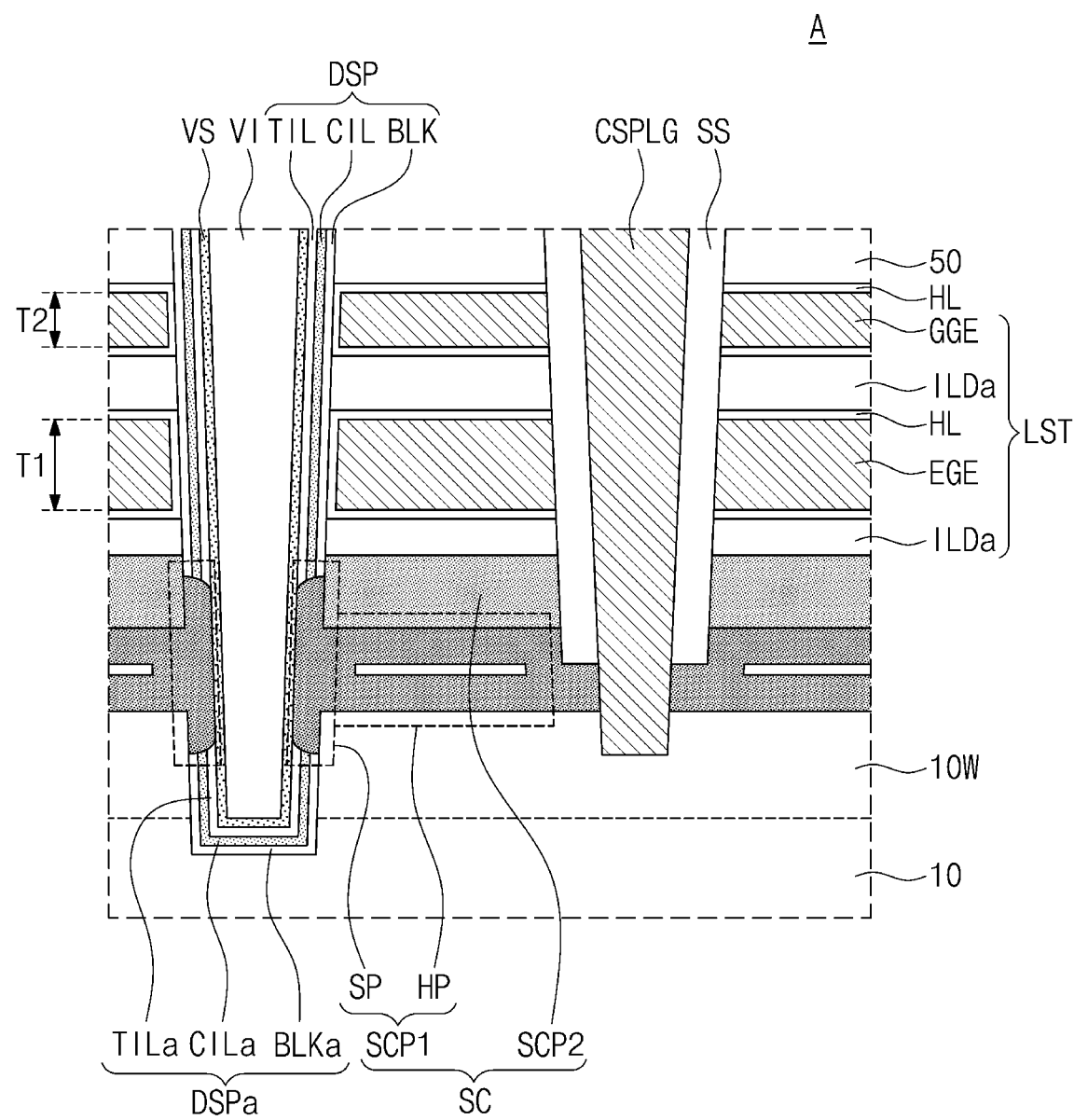
FIG. 7B is an enlarged view of a portion 'A' of FIG. 7A.
Figure 8A:
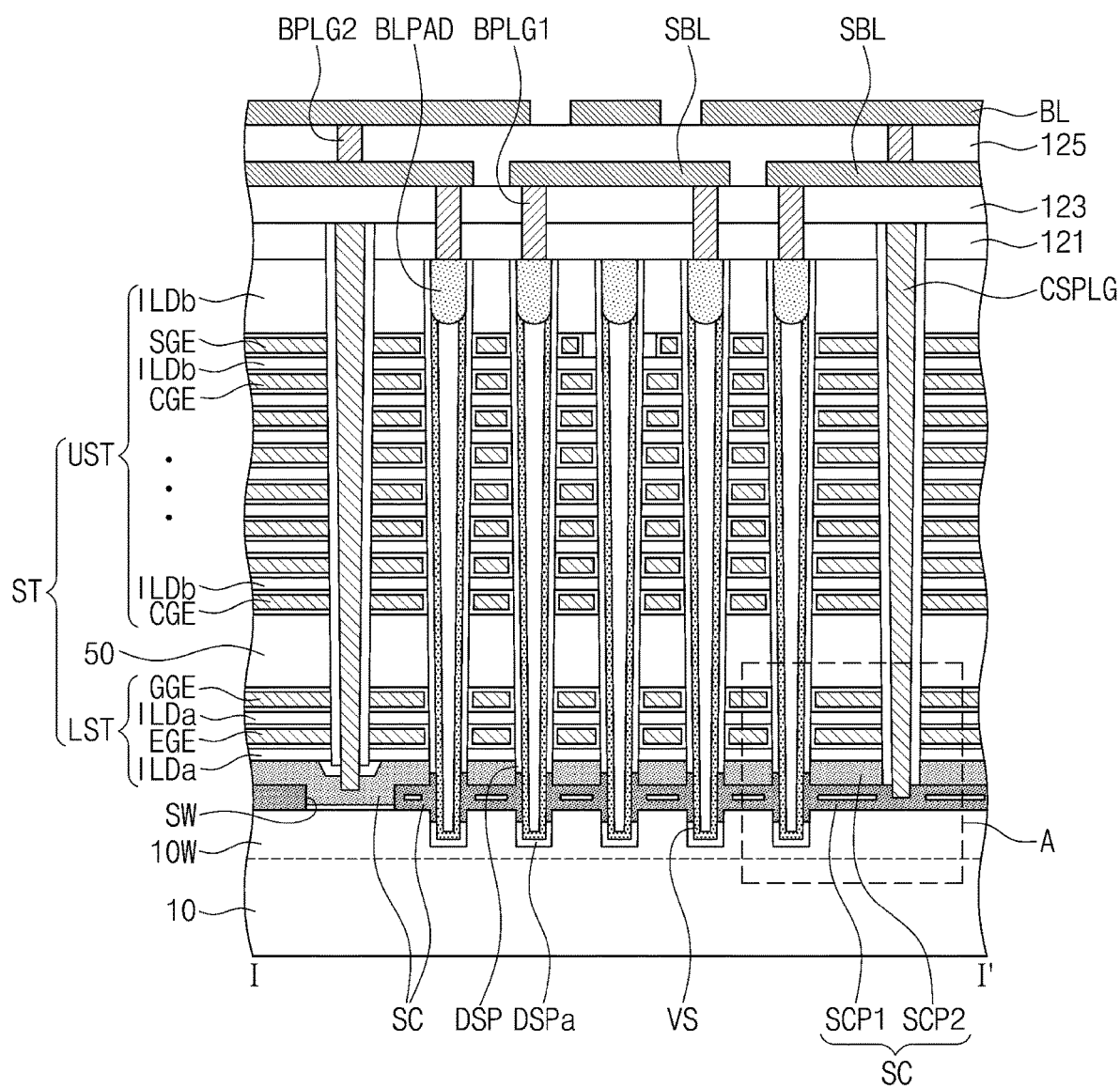
FIG. 8A is a cross-sectional view taken along the line I-I' of FIG. 2 to illustrate a 3D semiconductor memory device according to some embodiments of the inventive concepts.
Figure 8B:
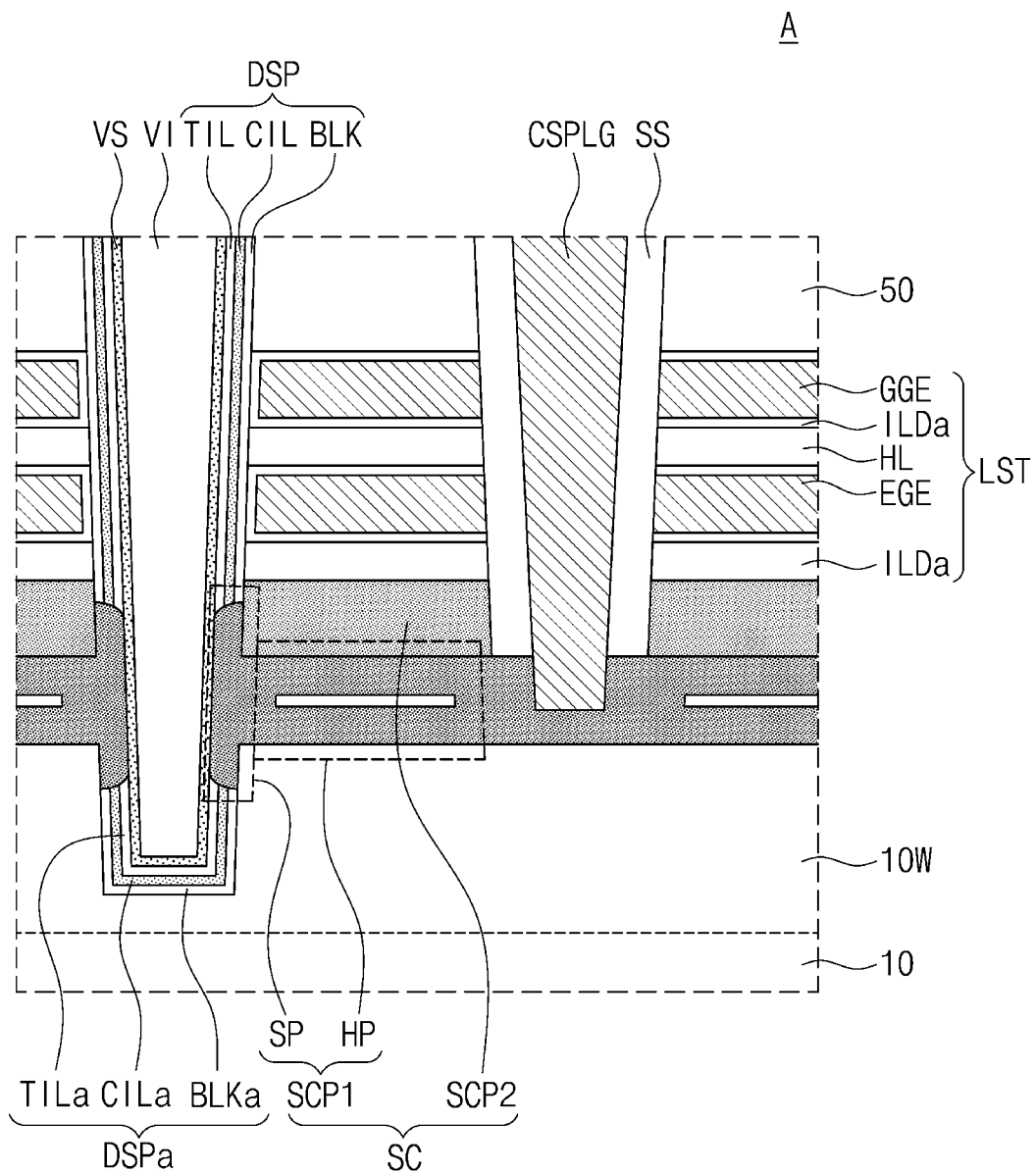
FIG. 8B is an enlarged view of a portion 'A' of FIG. 8A.

FIGS. 7A and 8A are cross-sectional views taken along the line I-I' of FIG. 2 to illustrate 3D semiconductor memory devices according to some embodiments of the inventive concepts. FIGS. 7B and 8B are enlarged views of portions 'A' of FIGS. 7A and 8A, respectively. For the purpose of ease and convenience in explanation, the descriptions to the same technical features as in the above embodiments will be omitted or mentioned briefly and differences between the present embodiments and the above embodiments will be mainly described hereinafter.

Referring to FIGS. 7A and 7B, the erase control gate electrode EGE corresponding to the lowermost one of the electrodes of the electrode structure ST may be thicker than other electrodes of the electrode structure ST. In more detail, the erase control gate electrode EGE may have a first thickness T1, and the ground selection gate electrode GGE may have a second thickness T2 that is less than the first thickness T1, and each of the cell gate electrodes CGE may have a third thickness T3, wherein the first thickness T1 may be greater than both the second thickness T2 and the third thickness T3. In addition, a distance between the erase control gate electrode EGE and the ground selection gate electrode GGE may be greater than a distance between the cell gate electrodes CGE adjacent to each other. In other words, a thickness of the lower insulating layer ILDa between the erase control gate electrode EGE and the ground selection gate electrode GGE may be greater than a thickness of the upper insulating layer ILDb.

According to an embodiment illustrated in FIGS. 8A and 8B, the first source conductive pattern SCP1 may horizontally extend under the source contact plug CSPLG. The source contact plug CSPLG may be in contact with the first source conductive pattern SCP1 and may be spaced apart from the substrate 10.

FIGS. 9A to 20A (e.g., 9A, 10A, 11A, . . . , 20A) are cross-sectional views taken along the line I-I' of FIG. 2 to illustrate a method of manufacturing a 3D semiconductor memory device according to some embodiments of the inventive concepts, and FIGS. 9B to 20B (e.g., 9B, 10B, 11B, . . . , 20B) are cross-sectional views taken along the line II-IP of FIG. 2 to illustrate the method of manufacturing a 3D semiconductor memory device according to some embodiments of the inventive concepts.

Figure 9A:
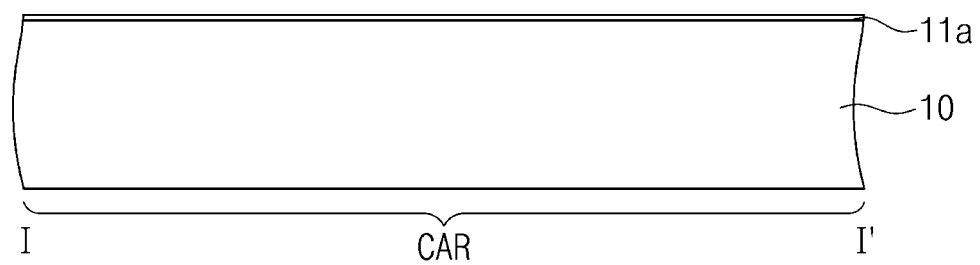
Figure 9B:
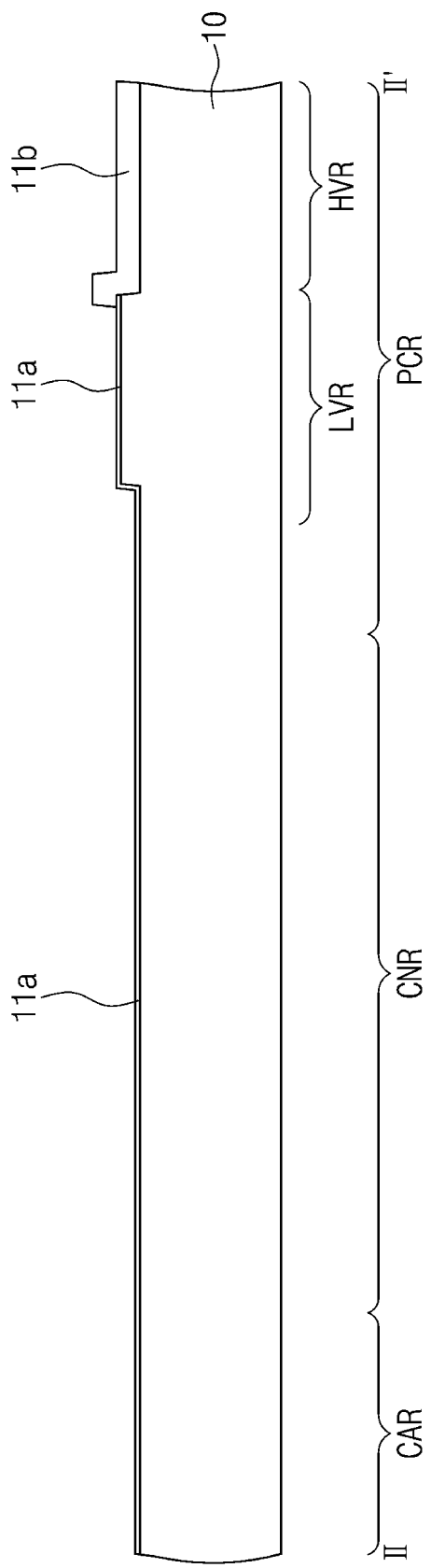

Referring to FIGS. 2, 9A, and 9B, the first gate insulating layer 11a may be formed on the substrate 10 of the low-voltage region LVR and the cell array region CAR, and the second gate insulating layer 11b may be formed on the substrate 10 of the high-voltage region HVR. The second gate insulating layer 11b may be thicker than the first gate insulating layer 11a.

In more detail, a top surface of the substrate 10 of the high-voltage region HVR and the cell array region CAR may be recessed. Thus, the recessed top surface of the substrate 10 of the high-voltage region HVR and the cell array region CAR may be lower than a top surface of the substrate of the low-voltage region LVR. In some embodiments, a top surface of the substrate 10 of the connection region CNR may also be recessed, as illustrated in FIGS. 9A and 9B. Subsequently, the second gate insulating layer 11b which is thick may be formed on an entire top surface of the recessed substrate 10. Thereafter, a mask pattern (not shown) covering the high-voltage region HVR may be formed, and a portion of the second gate insulating layer 11b may be etched using the mask pattern as an etch mask to form the first gate insulating layer 11a on the substrate 10 of the low-voltage region LVR and the cell array region CAR.

Figure 10A:
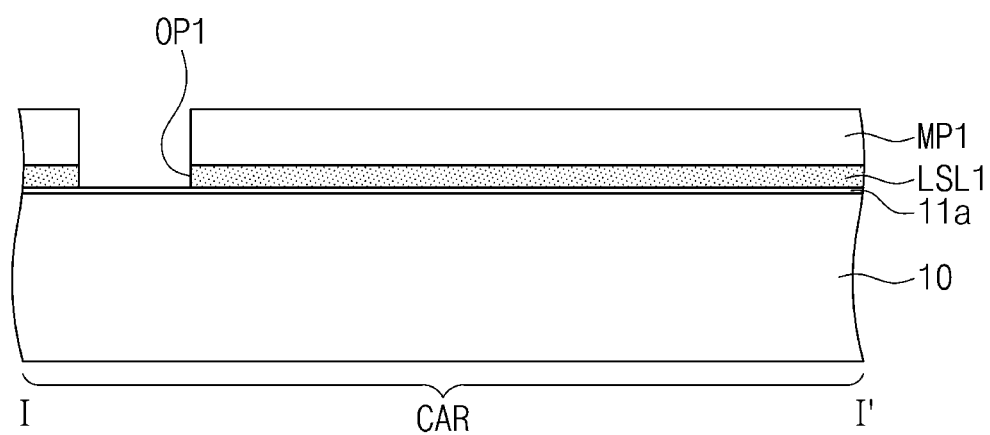
Figure 10B:
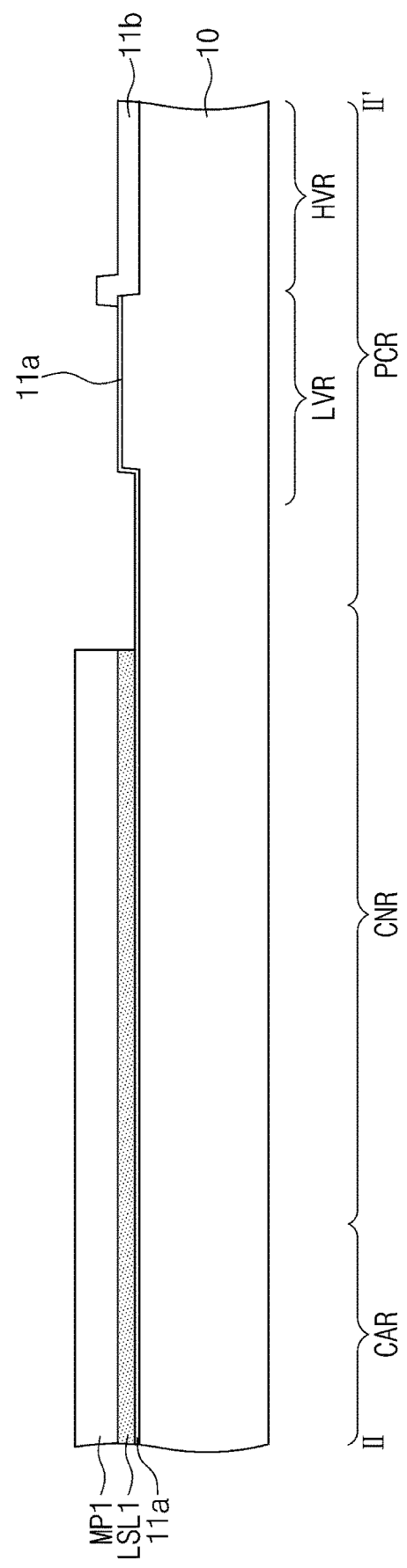

Referring to FIGS. 2, 10A, and 10B, a first lower sacrificial layer LSL1 exposing the peripheral circuit region PCR may be formed on the first gate insulating layer 11a. The first lower sacrificial layer LSL1 may have first openings OP1 which expose portions of the first gate insulating layer 11a or portions of the substrate 10 on the cell array region CAR. The first lower sacrificial layer LSL1 may be formed of a material having an etch selectivity with respect to the first and second gate insulating layers 11a and 11b. For example, the first lower sacrificial layer LSL1 may be formed of at least one of a silicon nitride layer, a silicon oxynitride layer, a silicon carbide layer, and/or a silicon-germanium layer.

The formation of the first lower sacrificial layer LSL1 may include depositing a lower sacrificial layer on an entire surface of the substrate 10, forming a first mask pattern MP1 exposing the peripheral circuit region PCR and portions of the cell array region CAR on the lower sacrificial layer, and etching the lower sacrificial layer using the first mask pattern MP1 as an etch mask to expose the first gate insulating layer 11a and/or the substrate 10. The first mask pattern MP1 may be removed after the formation of the first lower sacrificial layer LSL1.

Figure 11A:
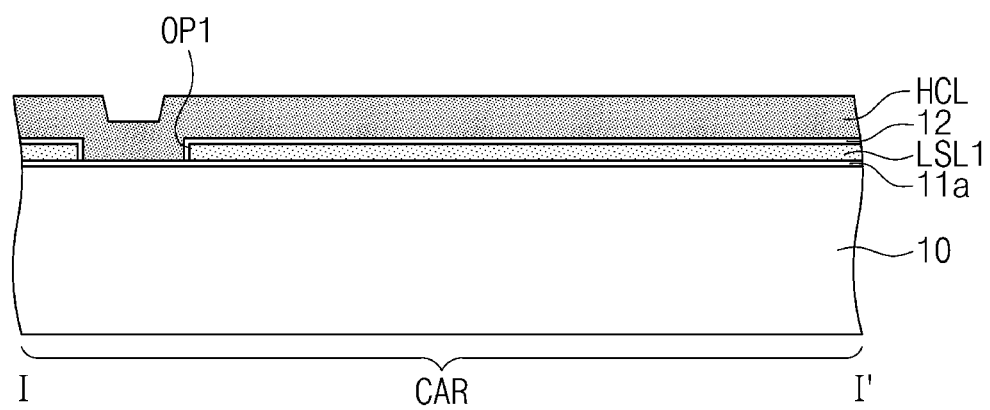
Figure 11B:
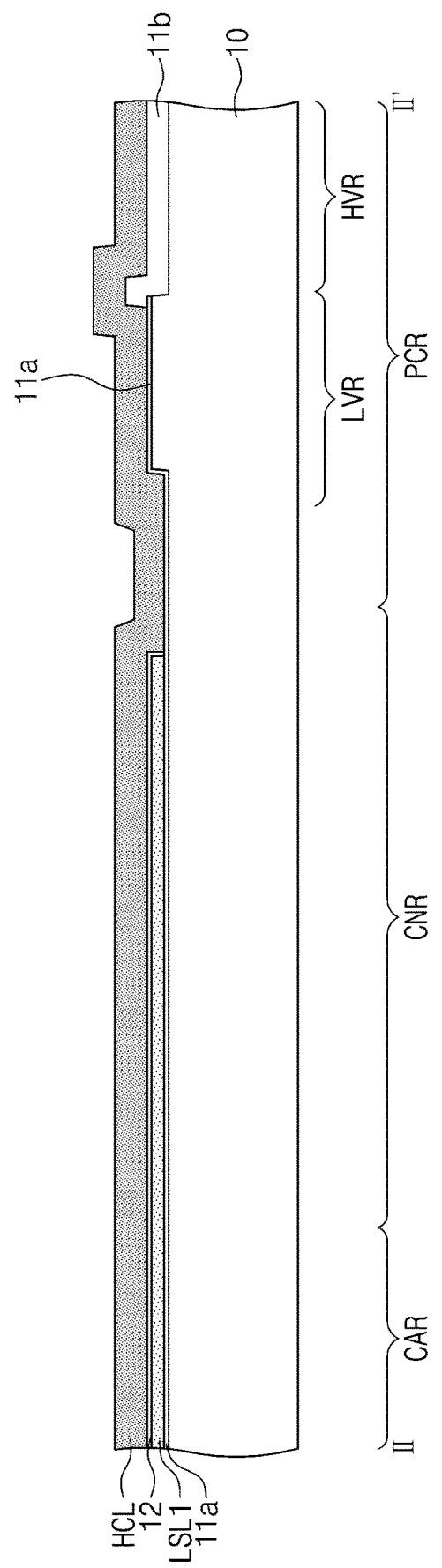

Referring to FIGS. 2, 11A, and 11B, a buffer insulating layer 12 and a horizontal conductive layer HCL may be deposited with substantially uniform thicknesses on an entire surface of the substrate 10. In certain embodiments, the buffer insulating layer 12 may be omitted and the horizontal conductive layer HCL may be deposited directly on the first lower sacrificial layer LSL1. The horizontal conductive layer HCL may be on, and in some embodiments cover, the first lower sacrificial layer LSL1 on the cell array region CAR and may be on, and in some embodiments cover, top surfaces of the first and second gate insulating layers 11a and 11b on the peripheral circuit region PCR. Portions of the buffer insulating layer 12 may be disposed between the horizontal conductive layer HCL and the first lower sacrificial layer LSL1. The buffer insulating layer 12 and the horizontal conductive layer HCL may be within and/or fill the first openings OP1 of the first lower sacrificial layer LSL1. In some embodiments, when the first openings OP1 expose the substrate 10, the horizontal conductive layer HCL may be in direct contact with the substrate 10 in the first openings OP1. For example, the buffer insulating layer 12 may be a silicon oxide layer, and the horizontal conductive layer HCL may be a poly-silicon layer doped with N-type dopants.

Figure 12A:
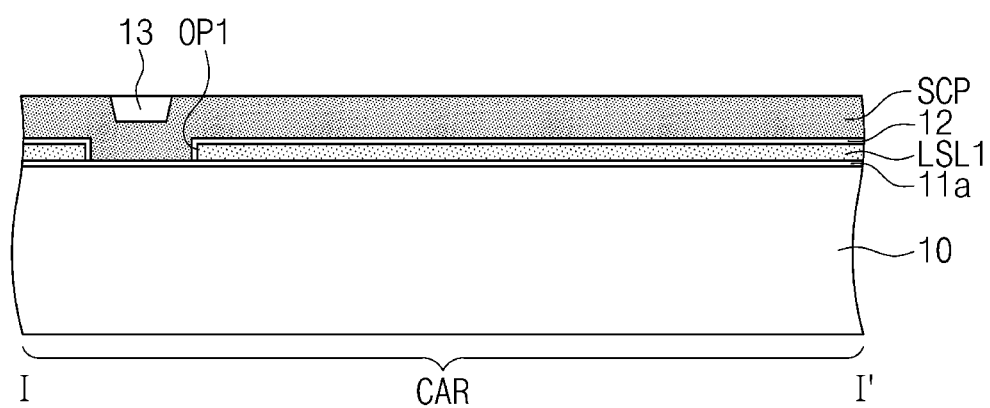
Figure 12B:
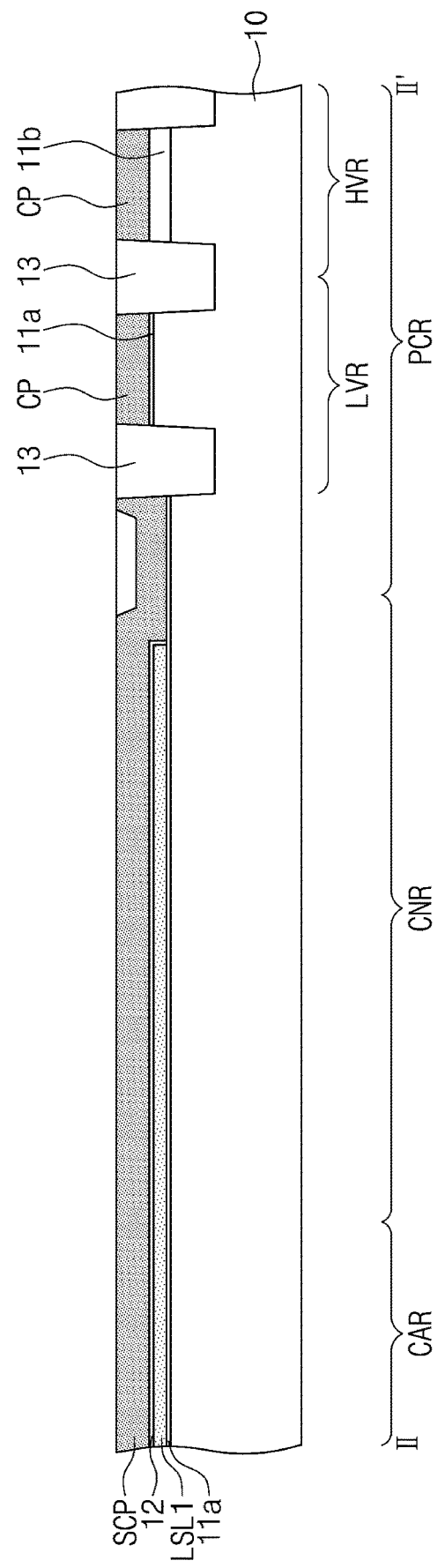

Referring to FIGS. 2, 12A, and 12B, a device isolation layer 13 may be formed to define active regions ACT in the peripheral circuit region PCR. The formation of the device isolation layer 13 may include patterning the horizontal conductive layer HCL, the buffer insulating layer 12, the first and second gate insulating layers 11a and 11b, and the substrate 10 to form a trench, filling the trench with an insulating material, and performing a planarization process on the insulating material to expose a top surface of the horizontal conductive layer HCL.

Since the device isolation layer 13 is formed, a source conductive layer SCP may be formed on the cell array region CAR and the connection region CNR, and peripheral conductive layers CP may be formed on the peripheral circuit region PCR. When the device isolation layer 13 is formed, a portion of the insulating material may remain on the source conductive layer SCP disposed in the first opening OP1.

Figure 13A:
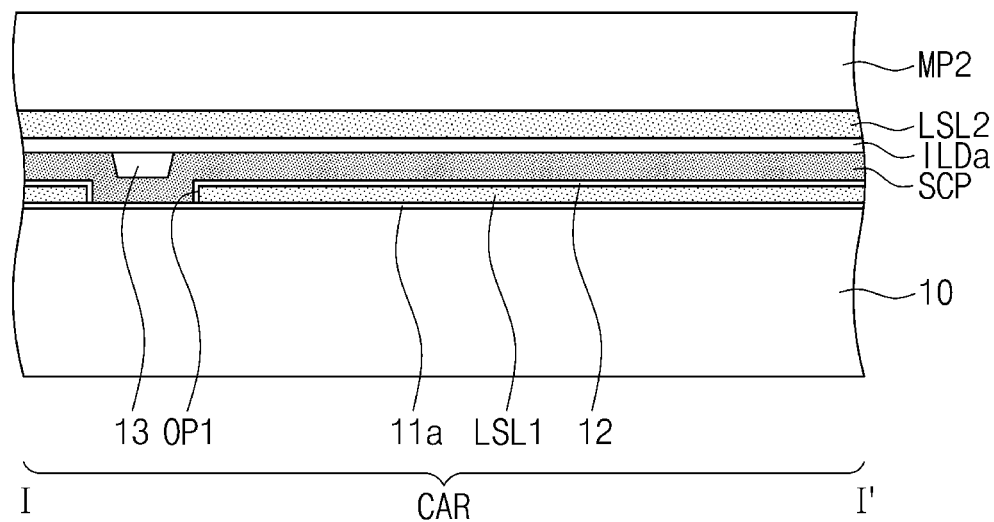
Figure 13B:
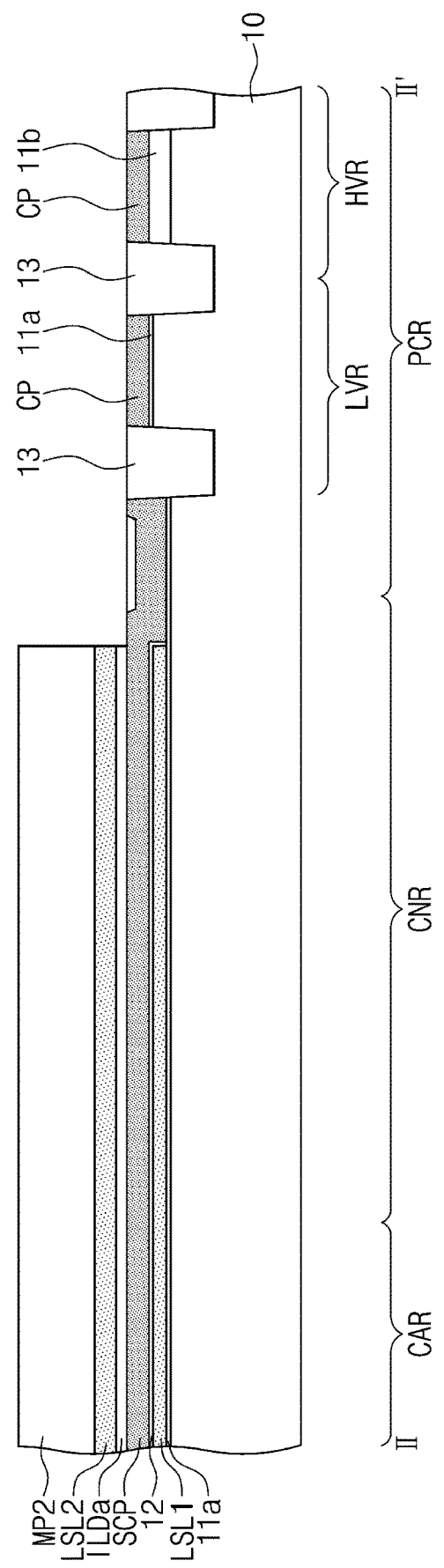

Referring to FIGS. 2, 13A, and 13B, a lower insulating layer ILDa and a second lower sacrificial layer LSL2 may be sequentially stacked on the source conductive layer SCP disposed on the cell array region CAR and the connection region CNR. The lower insulating layer ILDa and the second lower sacrificial layer LSL2 may expose the peripheral circuit region PCR. Here, the second lower sacrificial layer LSL2 may be formed of a material having an etch selectivity with respect to the lower insulating layer ILDa. For example, the second lower sacrificial layer LSL2 may be formed of the same material as the first lower sacrificial layer LSL1.

The formation of the second lower sacrificial layer LSL2 may include depositing an insulating layer and a sacrificial layer with uniform thicknesses on the substrate 10, forming a second mask pattern MP2 on the sacrificial layer, and anisotropically etching the sacrificial layer and the insulating layer using the second mask pattern MP2 as an etch mask to expose the peripheral conductive layers CP of the peripheral circuit region PCR.

Figure 14A:
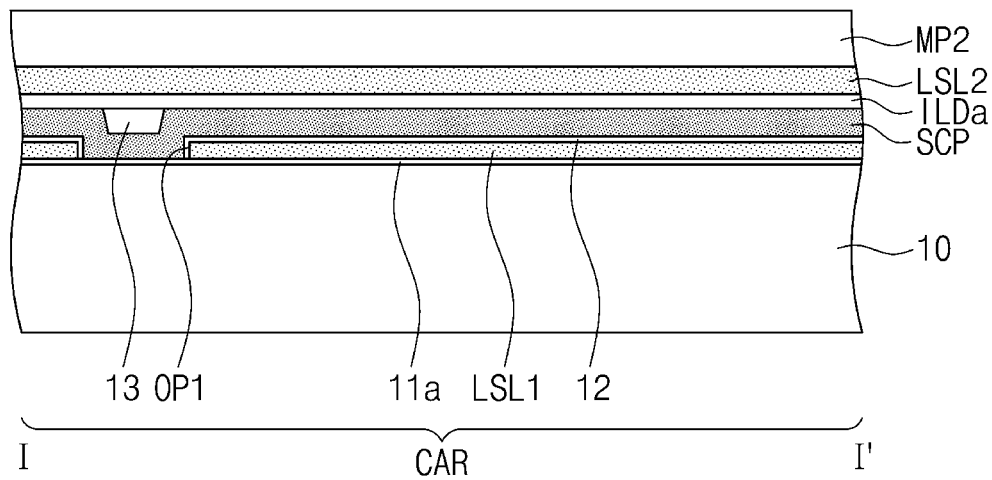
Figure 14B:
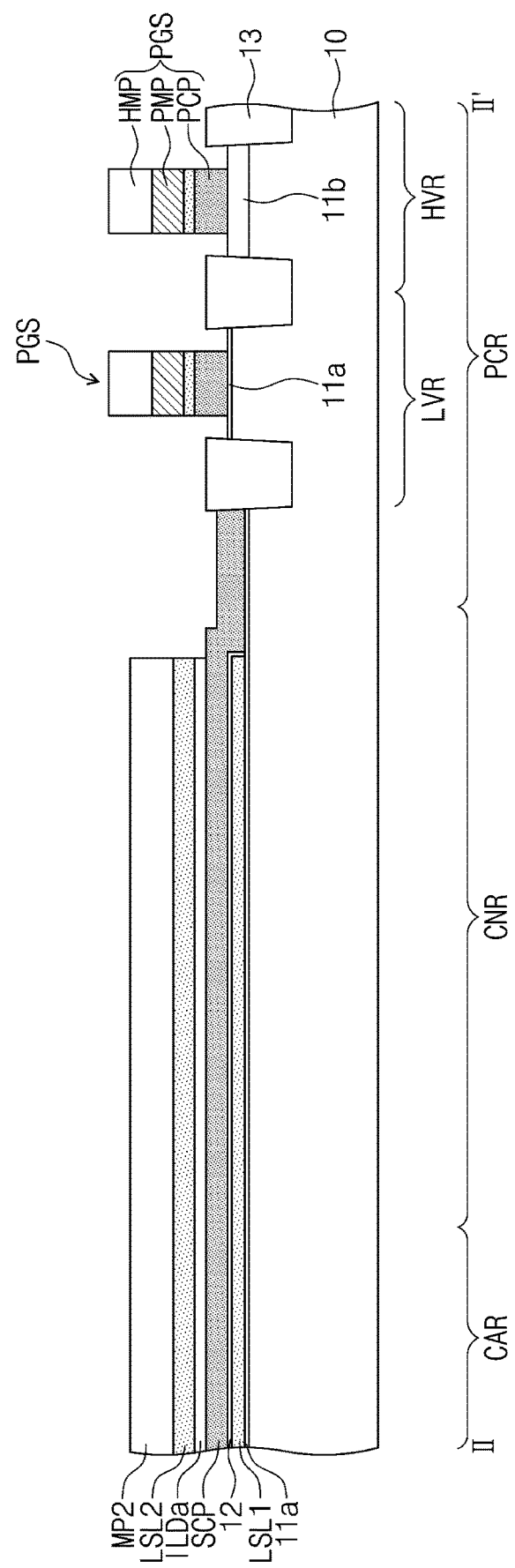

Referring to FIGS. 2, 14A, and 14B, after the formation of the second lower sacrificial layer LSL2, a low-voltage transistor and a high-voltage transistor may be formed on the peripheral circuit region PCR.

In more detail, peripheral gate stacks PGS may be formed on the peripheral circuit region PCR. A poly-silicon layer, a metal layer, and a hard mask layer may be sequentially formed on an entire surface of the substrate 10, and a patterning process may be performed on the hard mask layer, the metal layer, the poly-silicon layer, and the peripheral conductive layers CP to form the peripheral gate stacks PGS. The peripheral gate stacks PGS may be formed on the first and second gate insulating layers 11a and 11b, respectively.

Figure 15A:
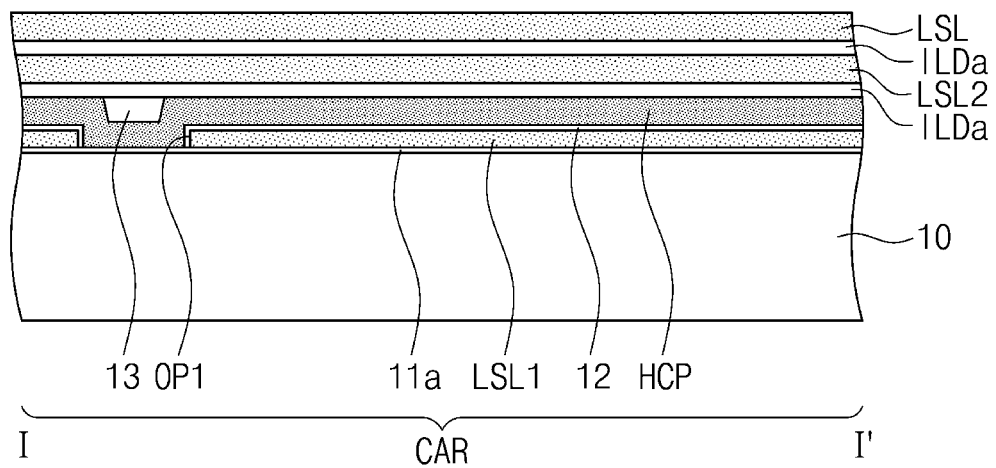
Figure 15B:
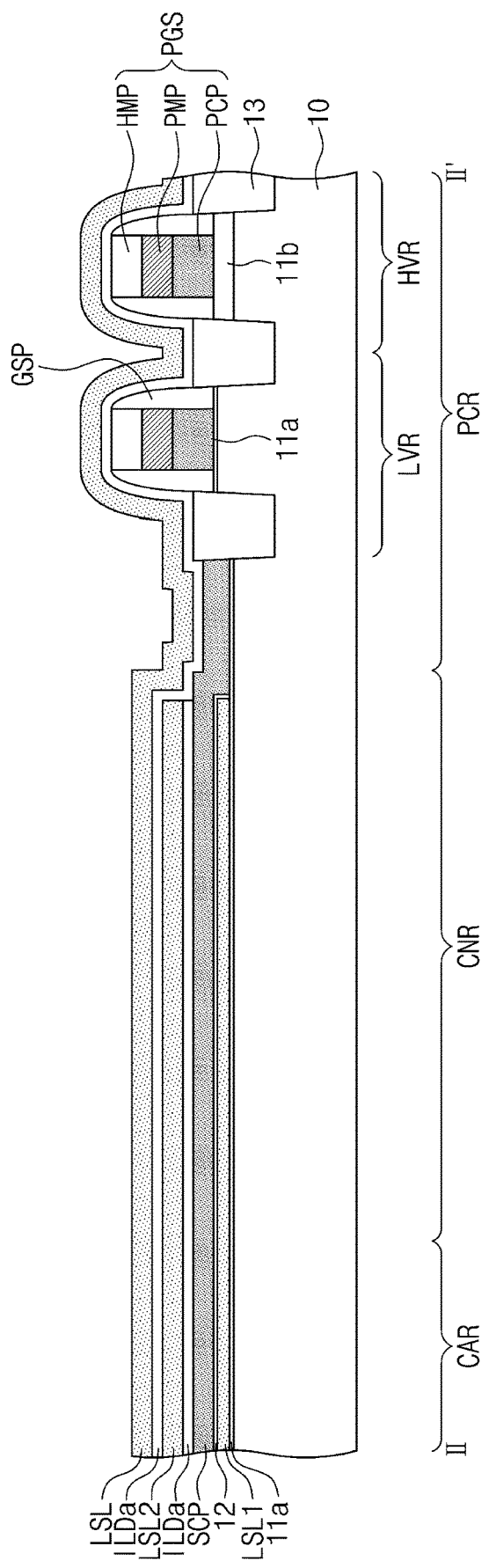

Referring to FIGS. 2, 15A, and 15B, gate spacers GSP may be formed on both sidewalls of each of the peripheral gate stacks PGS, and source/drain regions may be formed in the active region ACT at both sides of each of the peripheral gate stacks PGS. After the formation of the peripheral gate stacks PGS, the gate spacers GSP, and the source/drain regions, the second mask pattern MP2 may be removed to expose the second lower sacrificial layer LSL2.

Still referring to FIGS. 2, 15A, and 15B, a lower insulating layer ILDa and a lower sacrificial layer LSL may be sequentially formed to cover an entire surface of the substrate 10 having the peripheral gate stacks PGS. The lower insulating layer ILDa and the lower sacrificial layer LSL may conformally cover a top surface of the second lower sacrificial layer LSL2 and the peripheral gate stacks PGS. The lower sacrificial layer LSL may have a substantially uniform thickness and may extend from the cell array region CAR onto the peripheral circuit region PCR. In some embodiments, a thickness of the lower sacrificial layer LSL may be less than a thickness of the peripheral gate stack PGS.

The lower sacrificial layer LSL may be formed of a material having an etch selectivity with respect to the lower insulating layer ILDa. For example, the lower sacrificial layer LSL may be formed of the same material as the first and second lower sacrificial layers LSL1 and LSL2.

Figure 16A:
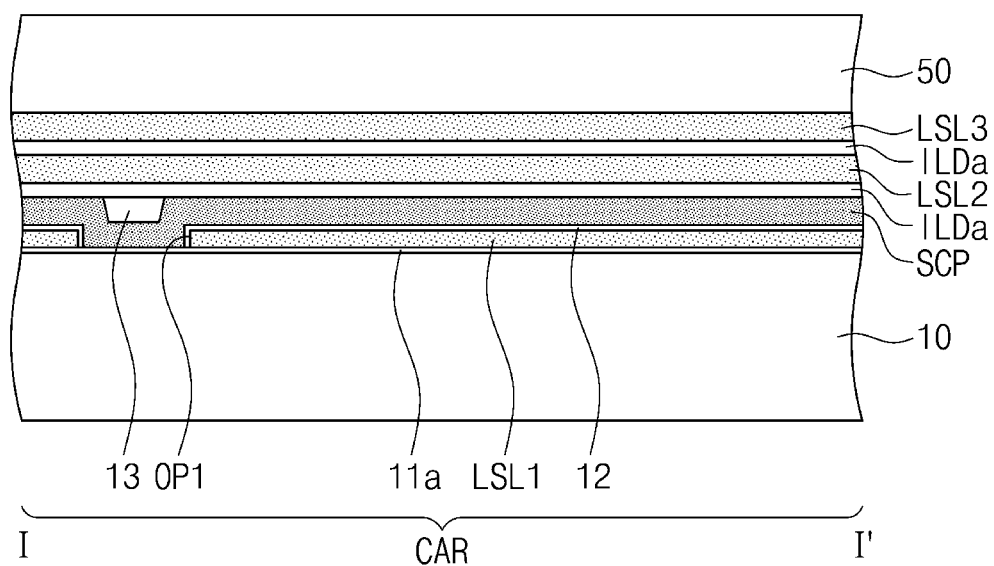
Figure 16B:
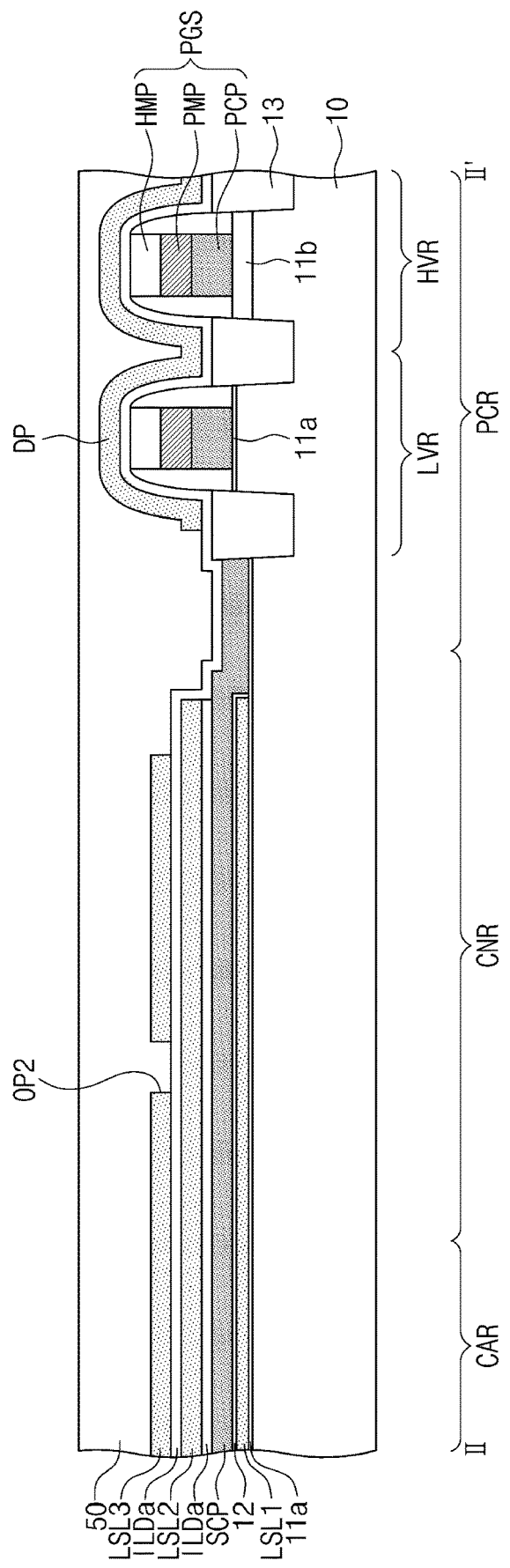

Referring to FIGS. 2, 16A, and 16B, the lower sacrificial layer LSL may be patterned to form a third lower sacrificial layer LSL3 and a dummy sacrificial pattern DP. The third lower sacrificial layer LSL3 may have a second opening OP2 on the connection region CNR, and the dummy sacrificial pattern DP may be on and, in some embodiments cover, the peripheral gate stacks PGS. The dummy sacrificial pattern DP may be separated from the third lower sacrificial layer LSL3.

Next, a lower planarization insulating layer 50 may be formed to be on (e.g., cover) an entire portion of the substrate 10. The lower planarization insulating layer 50 may be on, and in some embodiments cover, the third lower sacrificial layer LSL3 and the dummy sacrificial pattern DP and may be within, and in some embodiments fill, the second opening OP2 of the third lower sacrificial layer LSL3 on the connection region CNR. The lower planarization insulating layer 50 may include a silicon oxide layer and may have a substantially flat top surface by a planarization process (e.g., a chemical mechanical polishing (CMP) process).

Figure 17A:
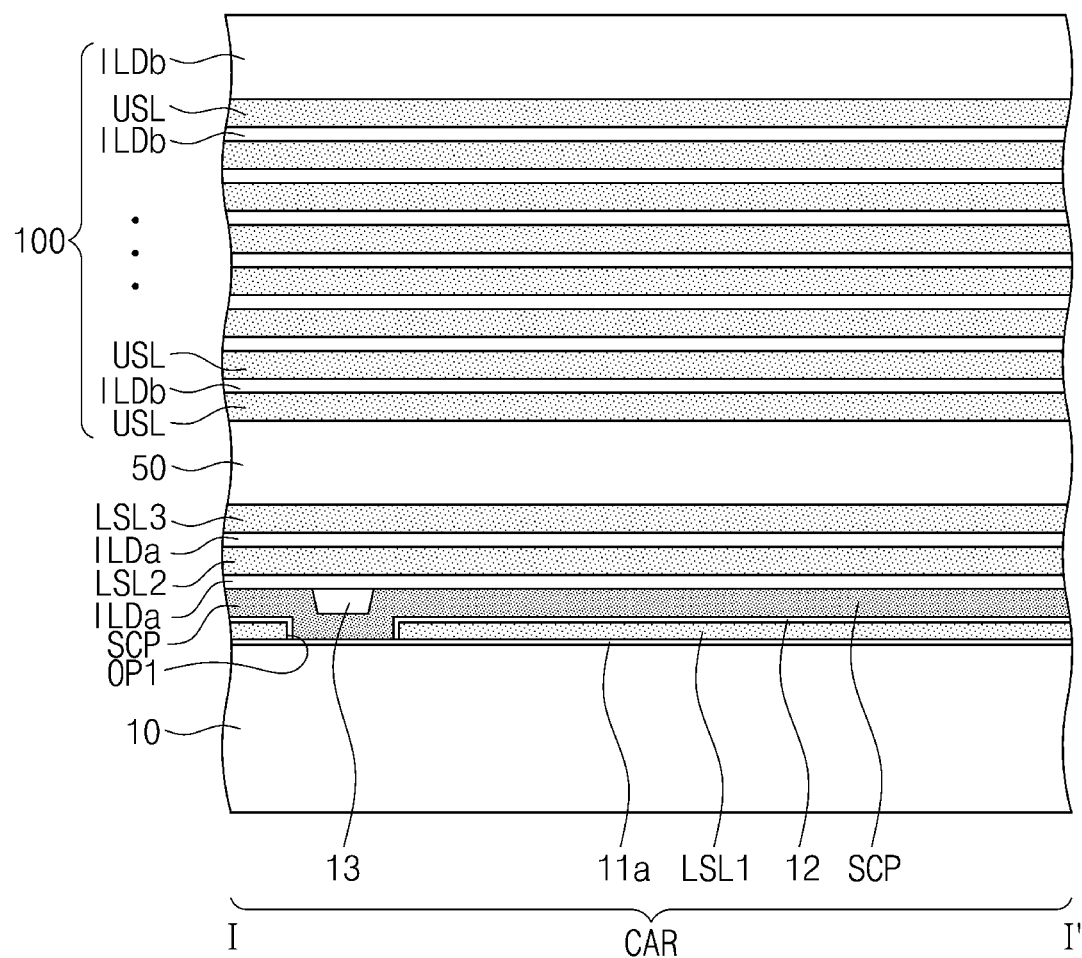
Figure 17B:
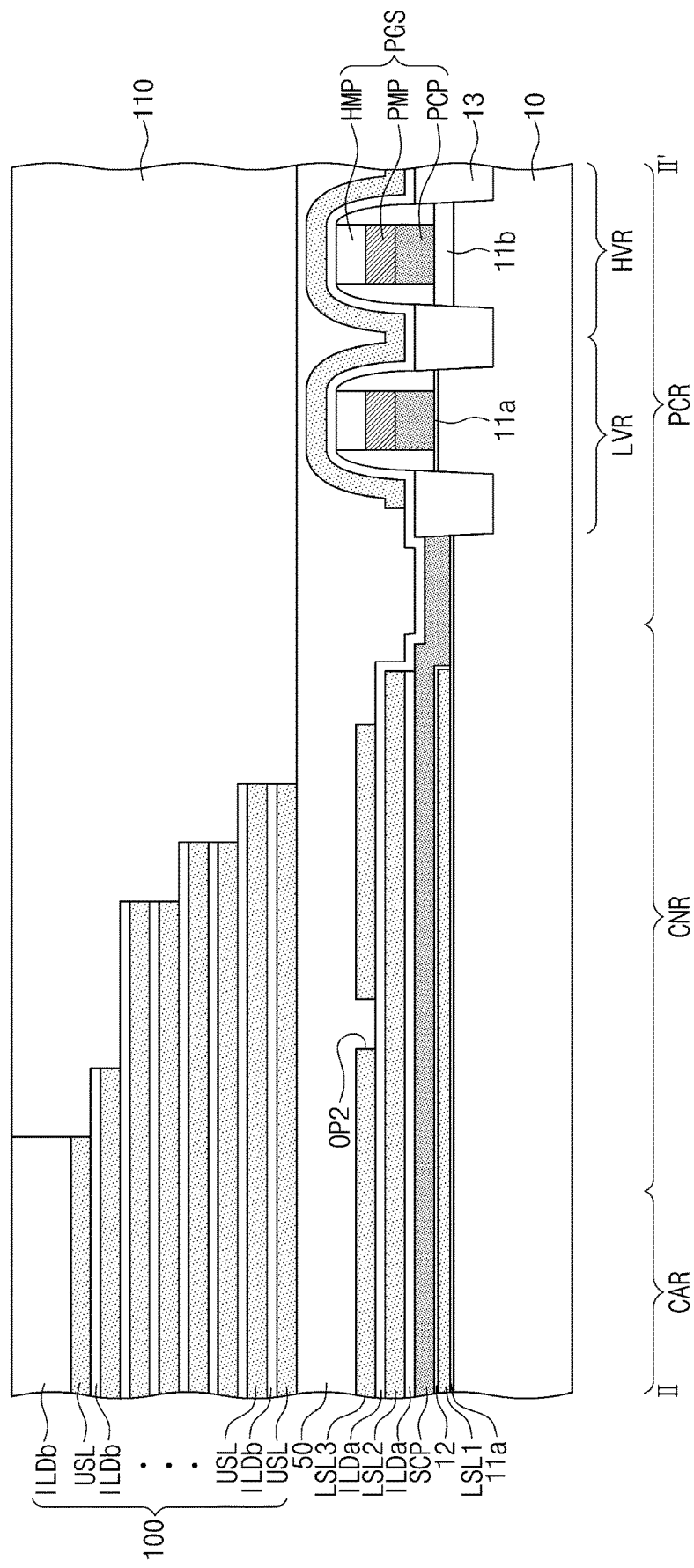

Referring to FIGS. 2, 17A, and 17B, a mold structure 100 may be formed on the lower planarization insulating layer 50. The mold structure 100 may include upper sacrificial layers USL and upper insulating layers ILDb, which are alternately stacked in a vertical direction. In some embodiments, the upper sacrificial layers USL may be formed of the same material as the first to third lower sacrificial layers LSL1, LSL2, and LSL3. For example, each of the upper sacrificial layers USL may be formed of a silicon nitride layer, and each of the upper insulating layers ILDb may be formed of a silicon oxide layer.

A patterning process may be performed on the upper sacrificial layers USL and the upper insulating layers ILDb in such a way that the mold structure 100 has a stepped structure downward from the cell array region CAR toward the peripheral circuit region PCR. Thus, the mold structure 100 may have the stepped structure on the connection region CNR. An upper planarization insulating layer 110 may be formed on, and in some embodiments may cover, the stepped structure of the mold structure 100 and the lower planarization insulating layer 50 of the peripheral circuit region PCR.

Figure 18A:
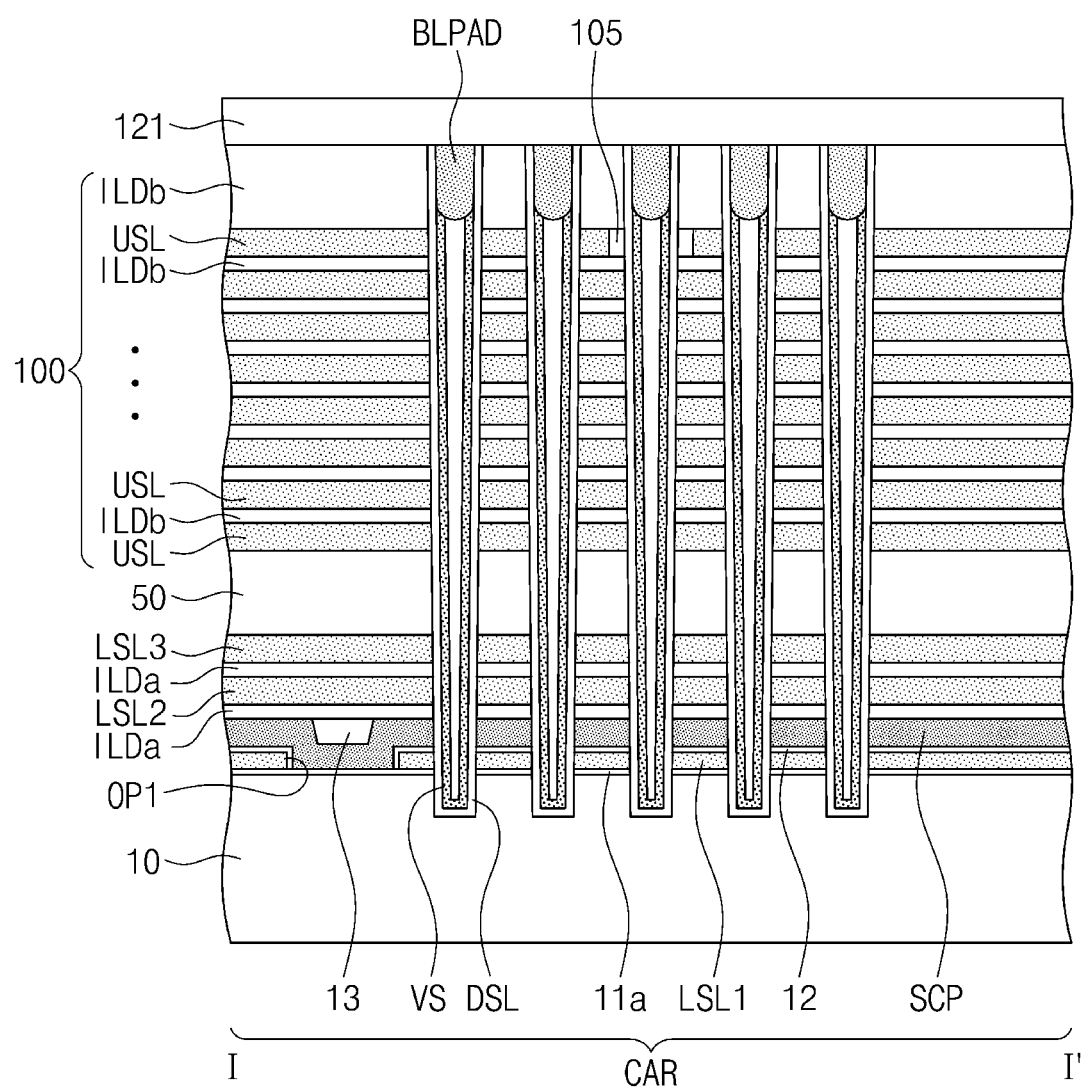
Figure 18B:
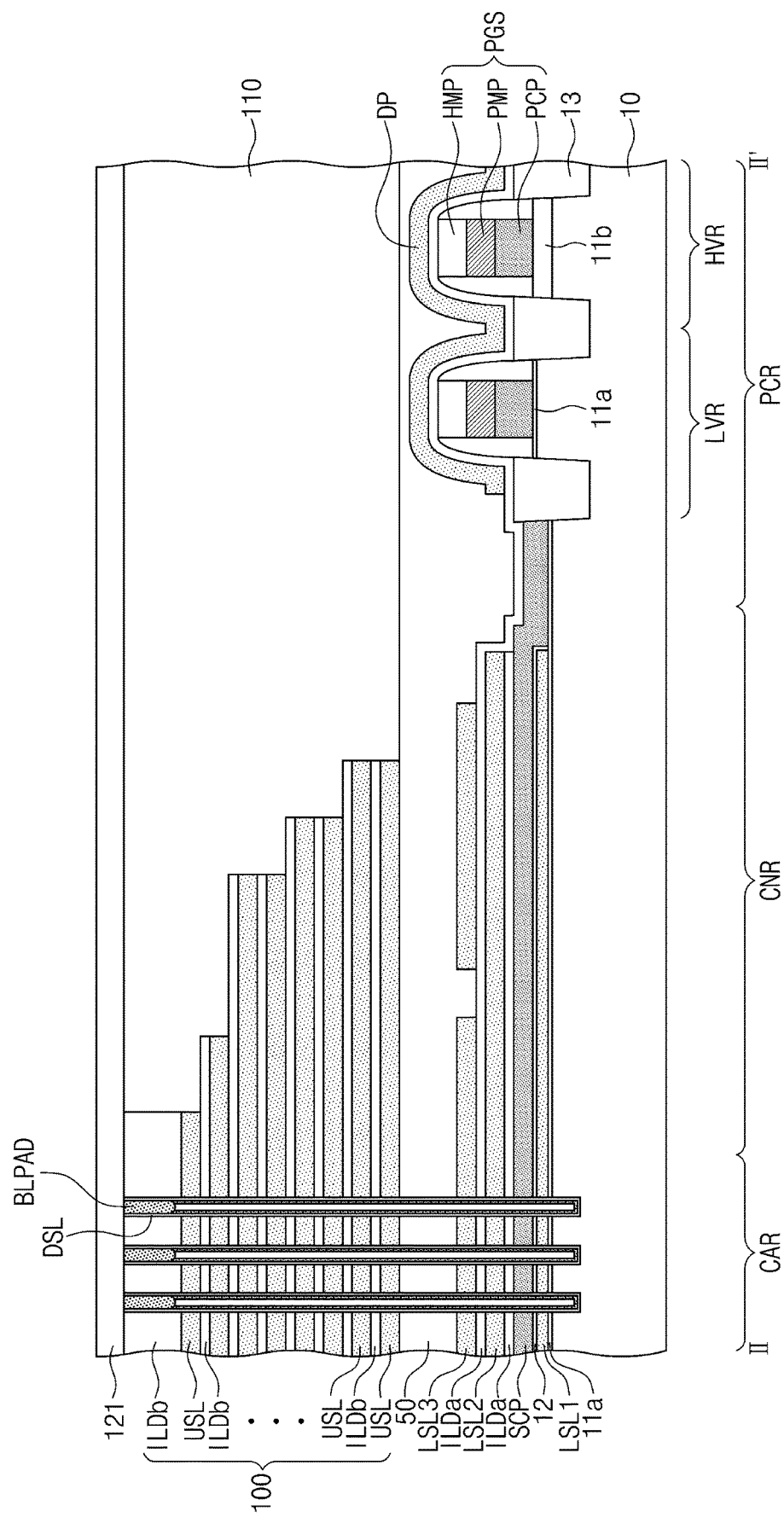

Referring to FIGS. 2, 18A, and 18B, an isolation insulating pattern 105 may be formed to divide at least an uppermost one of the upper sacrificial layers USL into line-shaped segments.

Next, vertical structures may be formed to penetrate the mold structure 100, the third lower sacrificial layer LSL3, the second lower sacrificial layer LSL2, the source conductive layer SCP, and the first lower sacrificial layer LSL1 on the cell array region CAR and the connection region CNR.

The formation of the vertical structures may include forming vertical holes that penetrate the mold structure 100, the first to third lower sacrificial layers LSL1 to LSL3, the lower insulating layers ILDa, and the source conductive layer SCP to expose the substrate 10, and sequentially forming a data storage layer DSL and a vertical semiconductor pattern VS in each of the vertical holes. A sum of thicknesses of the data storage layer DSL and the vertical semiconductor pattern VS on an inner sidewall of the vertical hole may be less than about a half of an upper width of the vertical hole. In other words, the data storage layer DSL and the vertical semiconductor pattern VS may partially fill the vertical hole. Thus, an insulating material VI may be within and, in some embodiments, fill an empty space of the vertical hole, which remains after the data storage layer DSL and a vertical semiconductor layer are formed.

The data storage layer DSL may have a substantially uniform thickness and may conformally cover the inner sidewall of the vertical hole. The data storage layer DSL may include a tunnel insulating layer, a charge storage layer, and a blocking insulating layer, which are sequentially stacked. The vertical semiconductor layer may be deposited with a substantially uniform thickness on the data storage layer DSL by a chemical vapor deposition (CVD) method or an atomic layer deposition (ALD) method, and a planarization process may be performed on the vertical semiconductor layer to form the vertical semiconductor pattern VS. The vertical semiconductor pattern VS may include, for example, a semiconductor material doped with dopants or an intrinsic semiconductor material not doped with dopants.

Subsequently, a bit line conductive pad BLPAD may be formed on a top end of each of the vertical semiconductor patterns VS. The bit line conductive pad BLPAD may be, for example, a dopant region doped with dopants or may be formed of a conductive material. A bottom surface of the bit line conductive pad BLPAD may be disposed at a higher level (e.g., farther from the substrate 10) than a top surface of the uppermost one of the upper sacrificial layers USL. After the formation of the bit line conductive pads BLPAD, a first interlayer insulating layer 121 may be formed on the mold structure 100, the bit line conductive pads BLPAD, and the upper planarization insulating layer 110.

Figure 19A:
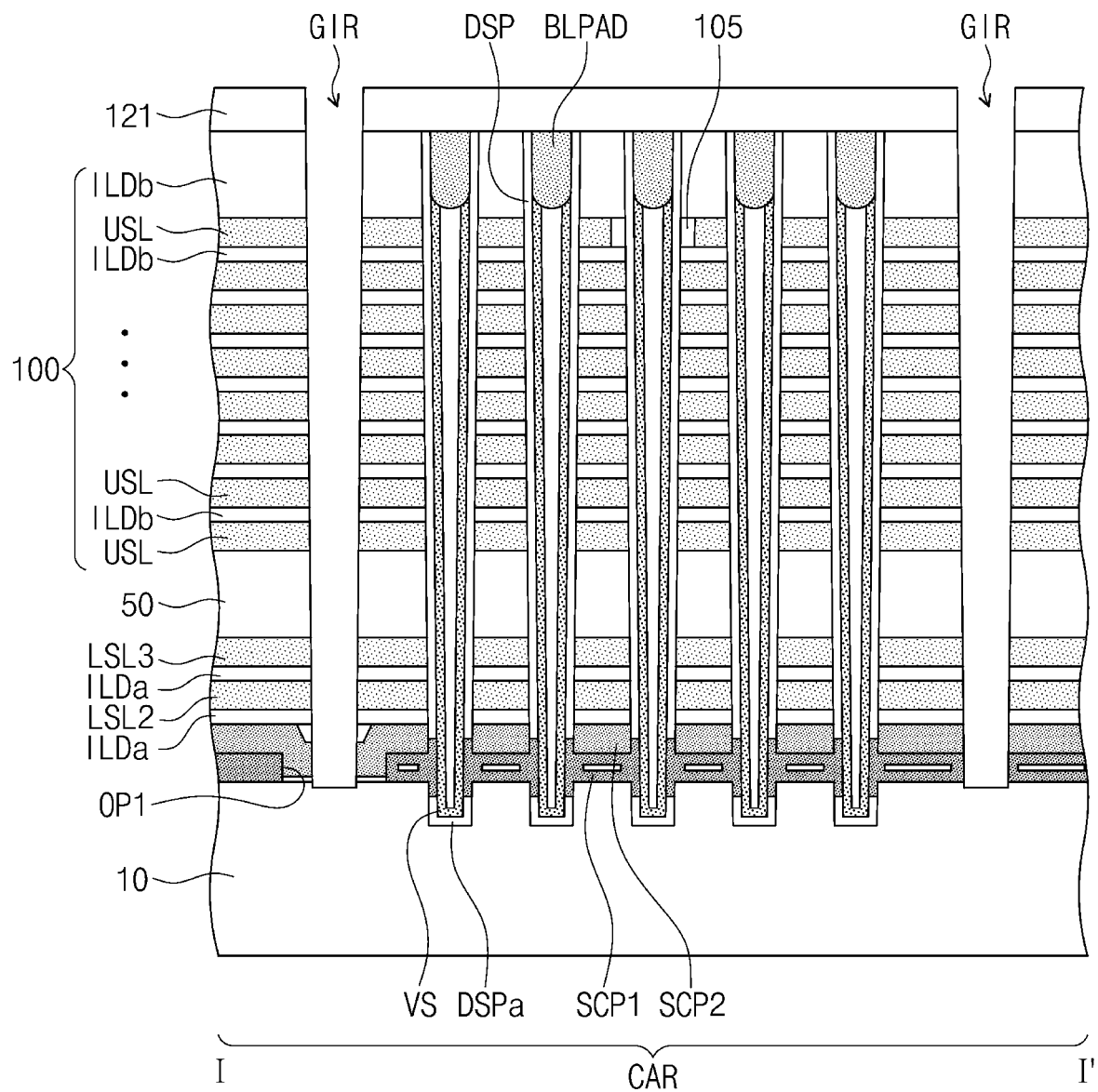
Figure 19B:
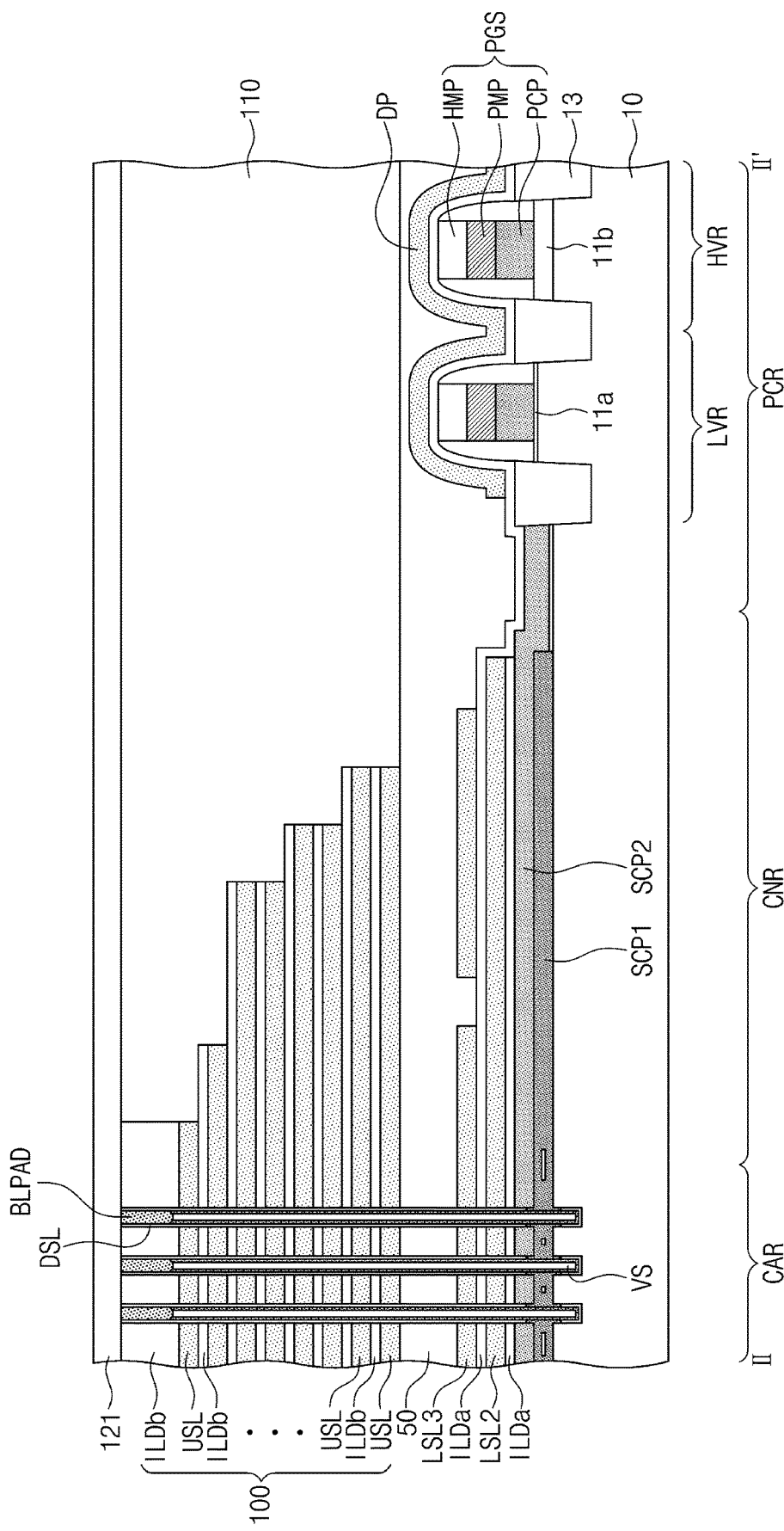

Referring to FIGS. 2, 19A, and 19B, a process of replacing the first lower sacrificial layer LSL1 with a first source conductive pattern SCP1 may be performed. The first source conductive pattern SCP1 may be formed to be in contact with portions of sidewalls of the vertical semiconductor patterns VS, as described above. A portion of the first gate insulating layer 11a under the first lower sacrificial layer LSL1 may be removed when the first source conductive pattern SCP1 is formed, and thus the first source conductive pattern SCP1 may be in contact with the substrate 10 or the well dopant region. In some embodiments, the first gate insulating layer 11a may remain on the substrate 10 after the formation of the first source conductive pattern SCP1. In addition, the formation of the first source conductive pattern SCP1 may include forming gate isolation regions GIR. The gate isolation regions GIR may extend in the first direction D1 on the cell array region CAR and the connection region CNR and may expose the top surface of the substrate 10. In addition, the gate isolation regions GIR may penetrate the source conductive layer SCP within the first openings OP1. In some embodiments, a plurality of the gate isolation regions GIR may extend in the first direction D1 in parallel to each other, and a length of at least one of the gate isolation regions GIR may be different from those of others of the gate isolation regions GIR. Some of the gate isolation regions GIR may be spaced apart from each other in the first direction D1 with the second opening OP2 interposed therebetween when viewed in a plan view.

The method of forming the first source conductive pattern SCP1 according to some embodiments of the inventive concepts will be described later in more detail with reference to FIGS. 21A to 26A and 21B to 26B.

Figure 20A:
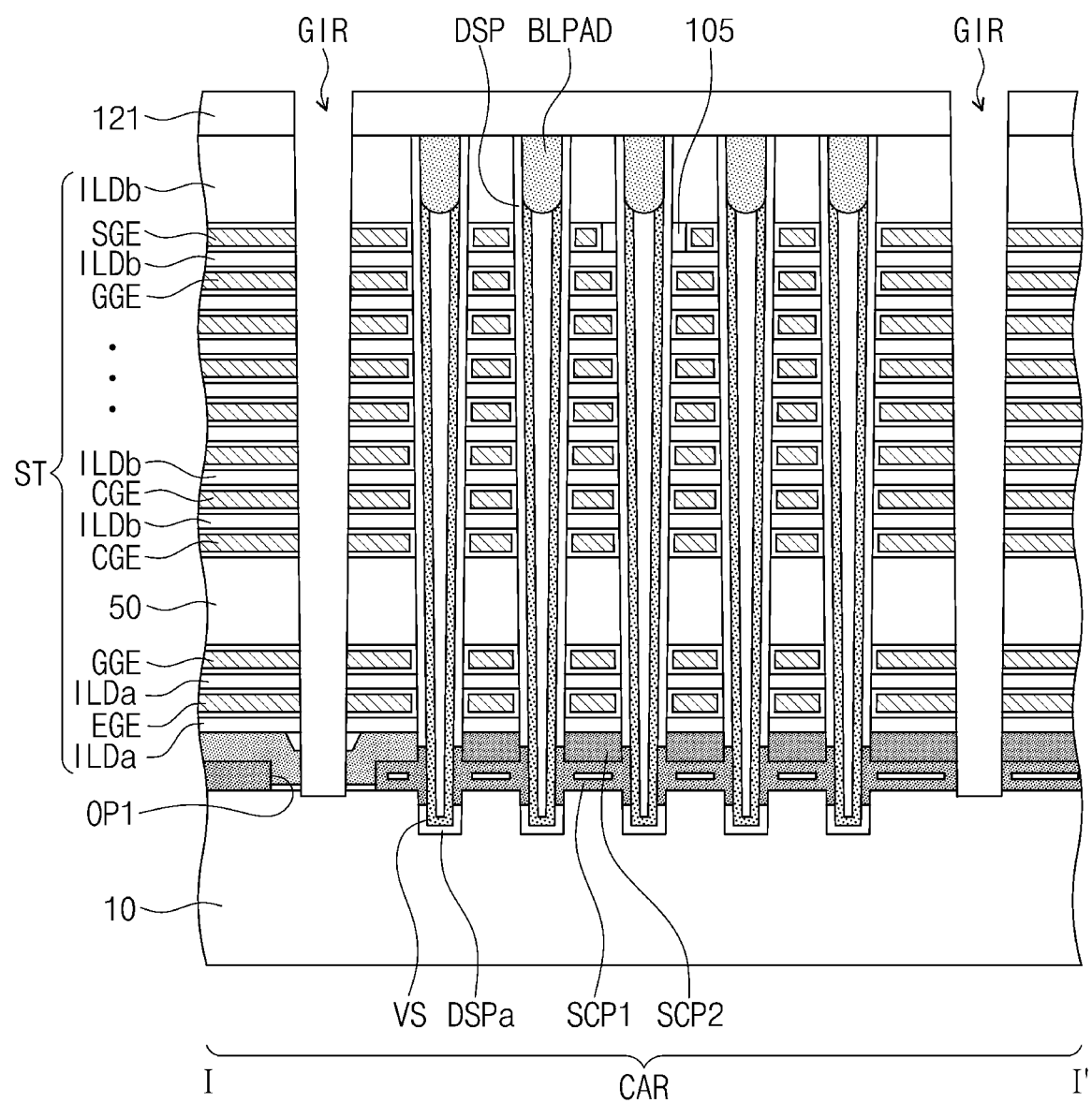
Figure 20B:
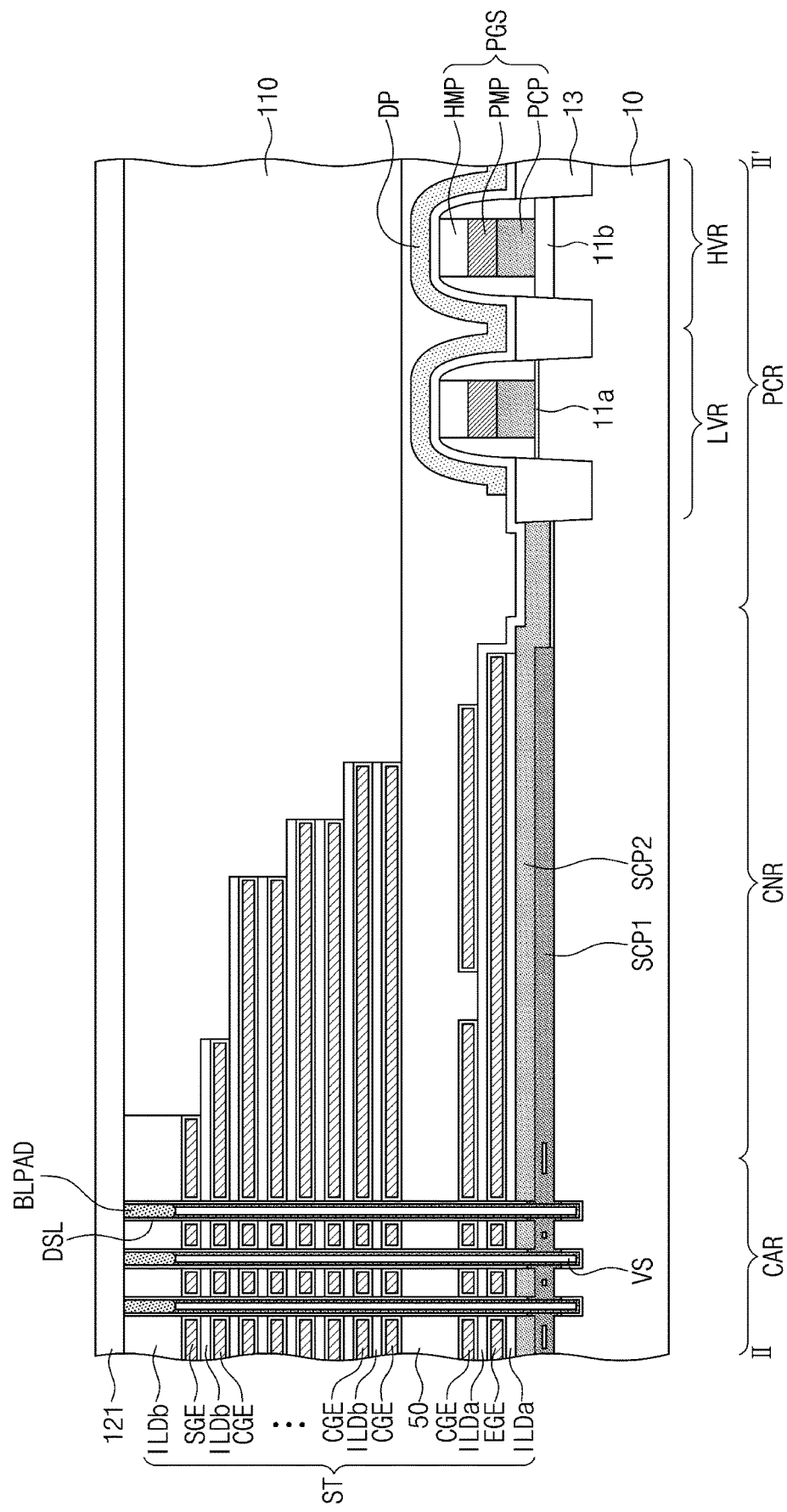
Figure 21A:
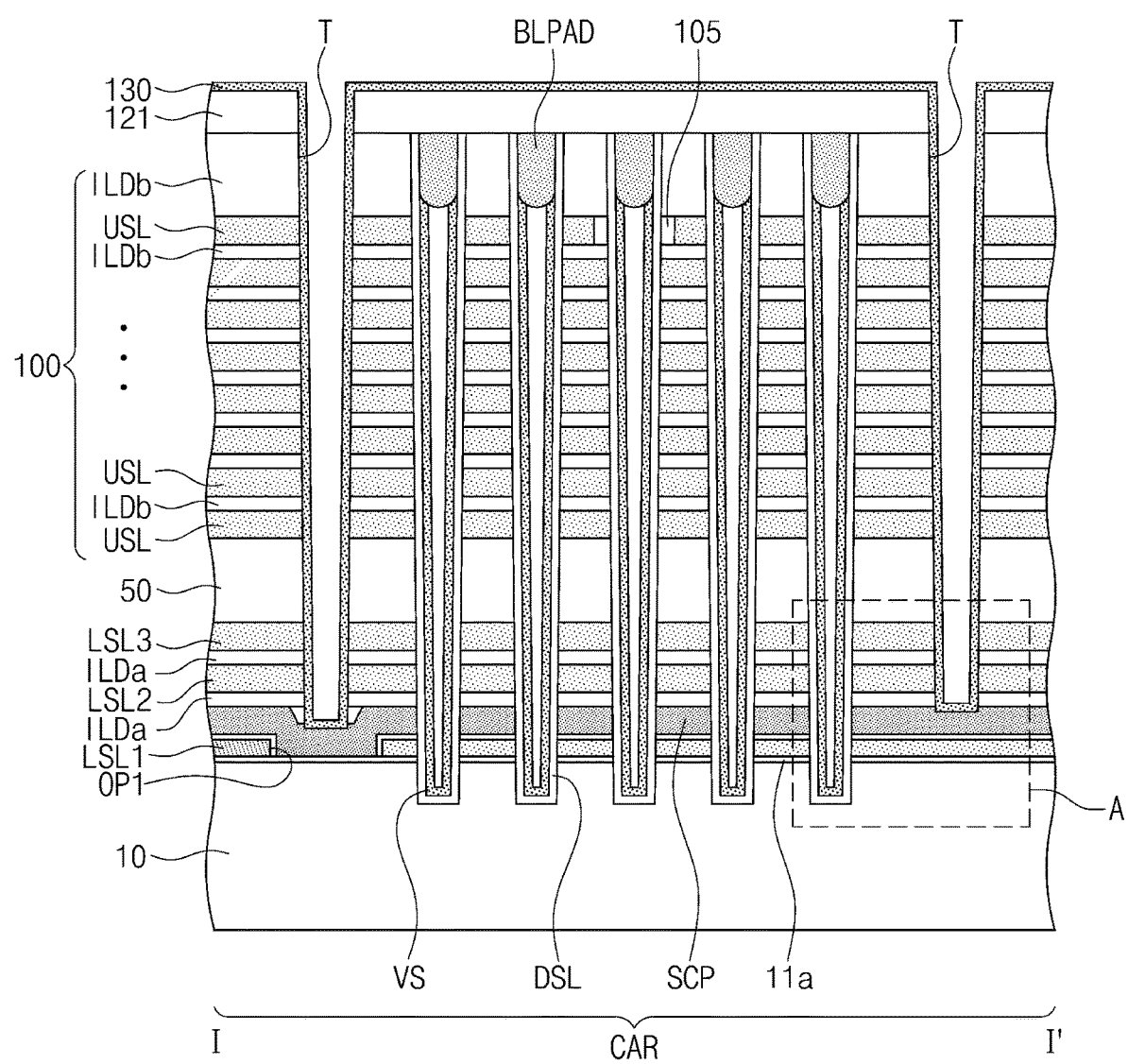
Figure 21B:
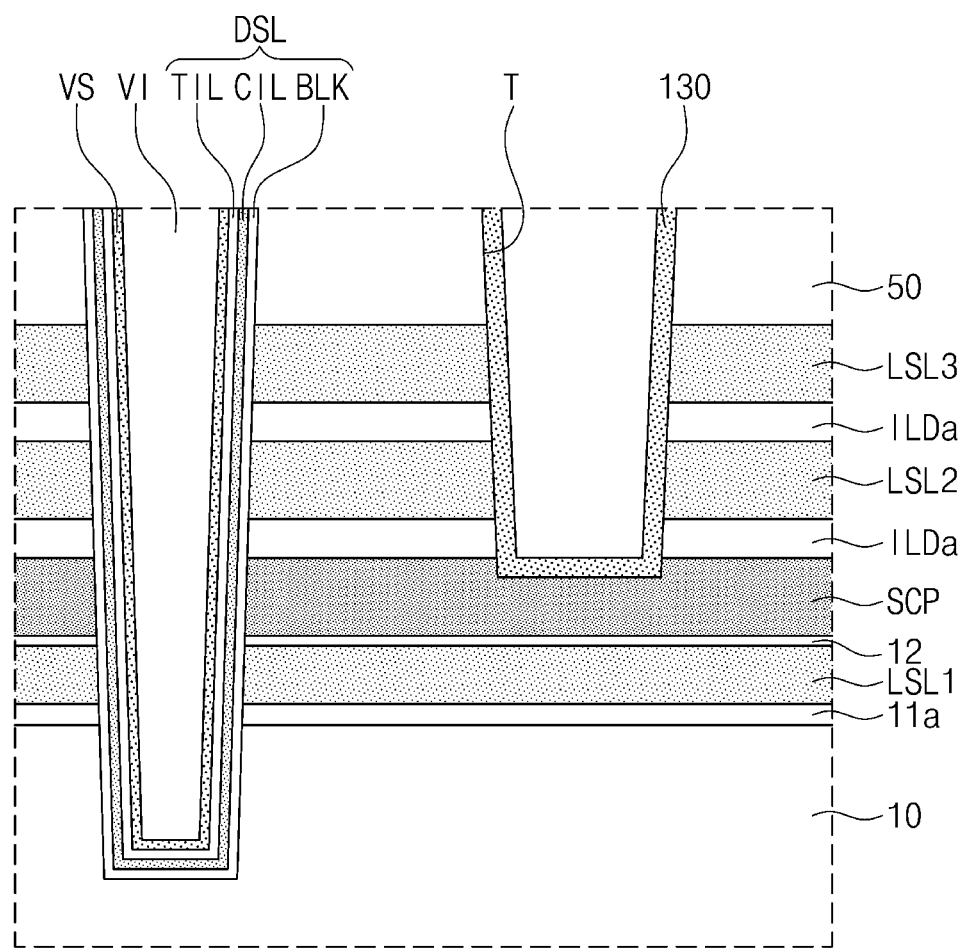

Referring to FIGS. 2, 20A, and 20B, after the formation of the first source conductive pattern SCP1, processes of replacing the second and third lower sacrificial layers LSL2 and LSL3 and the upper sacrificial layers USL with electrodes may be performed to form the electrode structure ST described above (e.g., electrodes EGE, CGE, CGE, and SGE). The method of forming the electrode structure ST will be described later in more detail with reference to FIGS. 25A, 25B, 25C 26A, and 26B.

After the formation of the electrode structure ST, insulating spacers SS and source contact plugs CSPLG may be formed in the gate isolation regions GIR. In some embodiments, the formation of the insulating spacers SS may include depositing a spacer layer with a uniform thickness on the substrate 10 having the electrode structure ST, and performing an etch-back process on the spacer layer to expose the first source conductive pattern SCP1 or the substrate 10. Next, a conductive layer may be deposited to be within, and in some embodiments fill, the gate isolation regions GIR having the insulating spacers SS, and the deposited conductive layer may be planarized until a top surface of the first interlayer insulating layer 121 is exposed, thereby forming the source contact plugs CSPLG. The source contact plugs CSPLG may be connected to the substrate 10 or the first source conductive pattern SCP1.

Thereafter, as described with reference to FIGS. 2, 3A, and 3B, the second interlayer insulating layer 123 may be formed on the substrate 10, and then, the bit line contact plugs BPLG1 of the cell array region CAR, the cell contact plugs CPLG of the connection region CNR, and the peripheral contact plugs PPLG of the peripheral circuit region PCR may be formed. Next, the sub-bit lines SBL, the first interconnection lines CL1, and the peripheral circuit interconnection lines PCL may be formed. The third interlayer insulating layer 125 may be formed on the second interlayer insulating layer 123, and the bit lines BL and the second interconnection lines CL2 may be formed on the third interlayer insulating layer 125.

FIGS. 21A to 26A (e.g., 21A, 22A, . . . , 26A) are cross-sectional views illustrating a method of forming a source conductive pattern of a 3D semiconductor memory device according to some embodiments of the inventive concepts. FIGS. 21B to 26B (e.g., 21B, 22B, . . . , 26B) are enlarged views of portions 'A' of FIGS. 21A to 26A, respectively.

Referring to FIGS. 2, 18A, 18B, 21A, and 21B, trenches T may be formed to penetrate the mold structure 100. The trenches T may expose portions of the source conductive layer SCP. The trenches T may extend in the first direction D1.

A sacrificial spacer layer 130 may be formed on inner surfaces of the trenches T. The sacrificial spacer layer 130 may have a substantially uniform thickness on sidewalls and bottom surfaces of the trenches T. The sacrificial spacer layer 130 may be formed of a material having an etch selectivity with respect to the mold structure 100. For example, the sacrificial spacer layer 130 may be formed of a poly-silicon layer. The thickness of the sacrificial spacer layer 130 may be less than about a half of a width of the trench T, and the sacrificial spacer layer 130 may be deposited with the substantially uniform thickness by a deposition process.

Figure 22A:
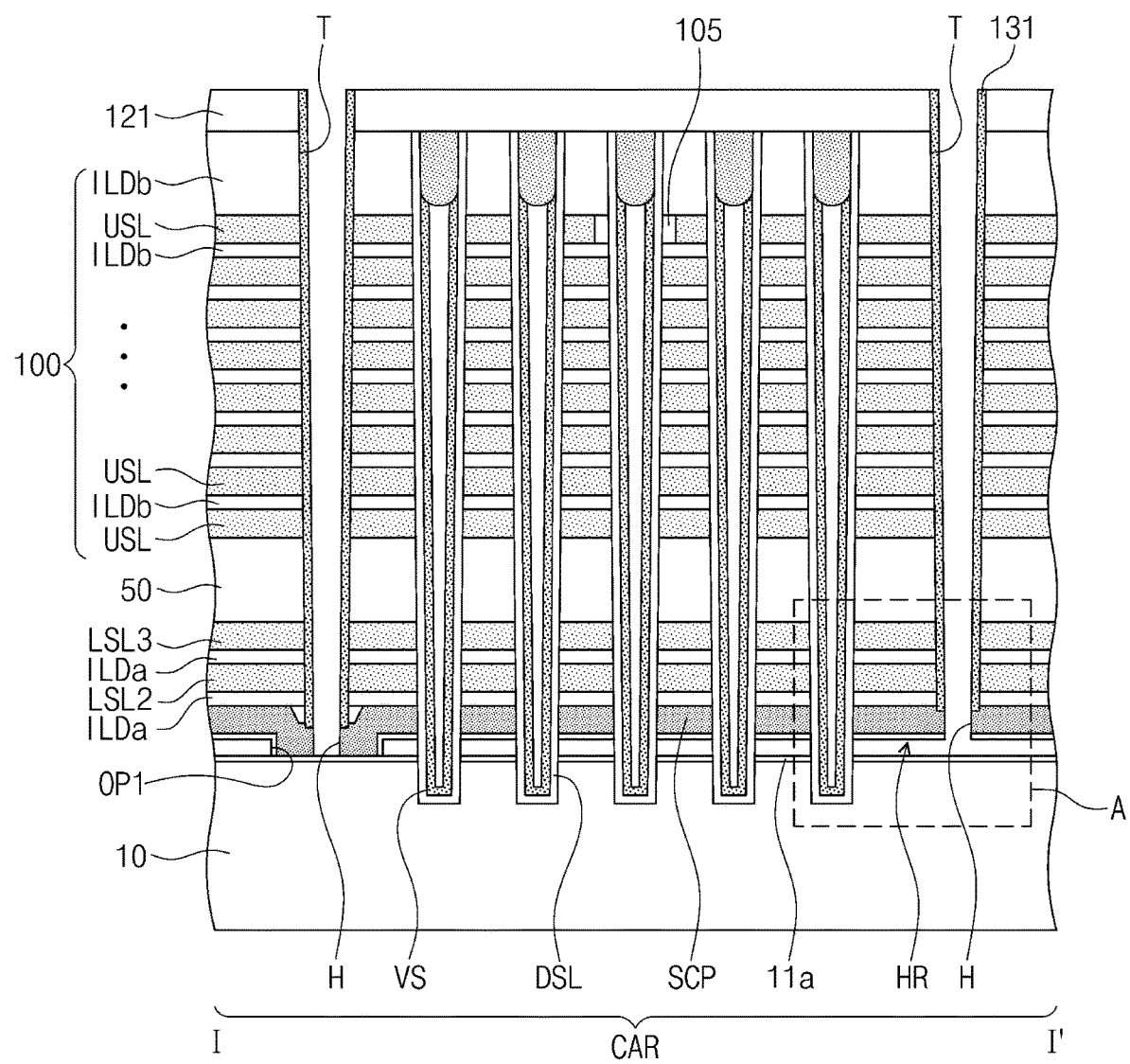
Figure 22B:
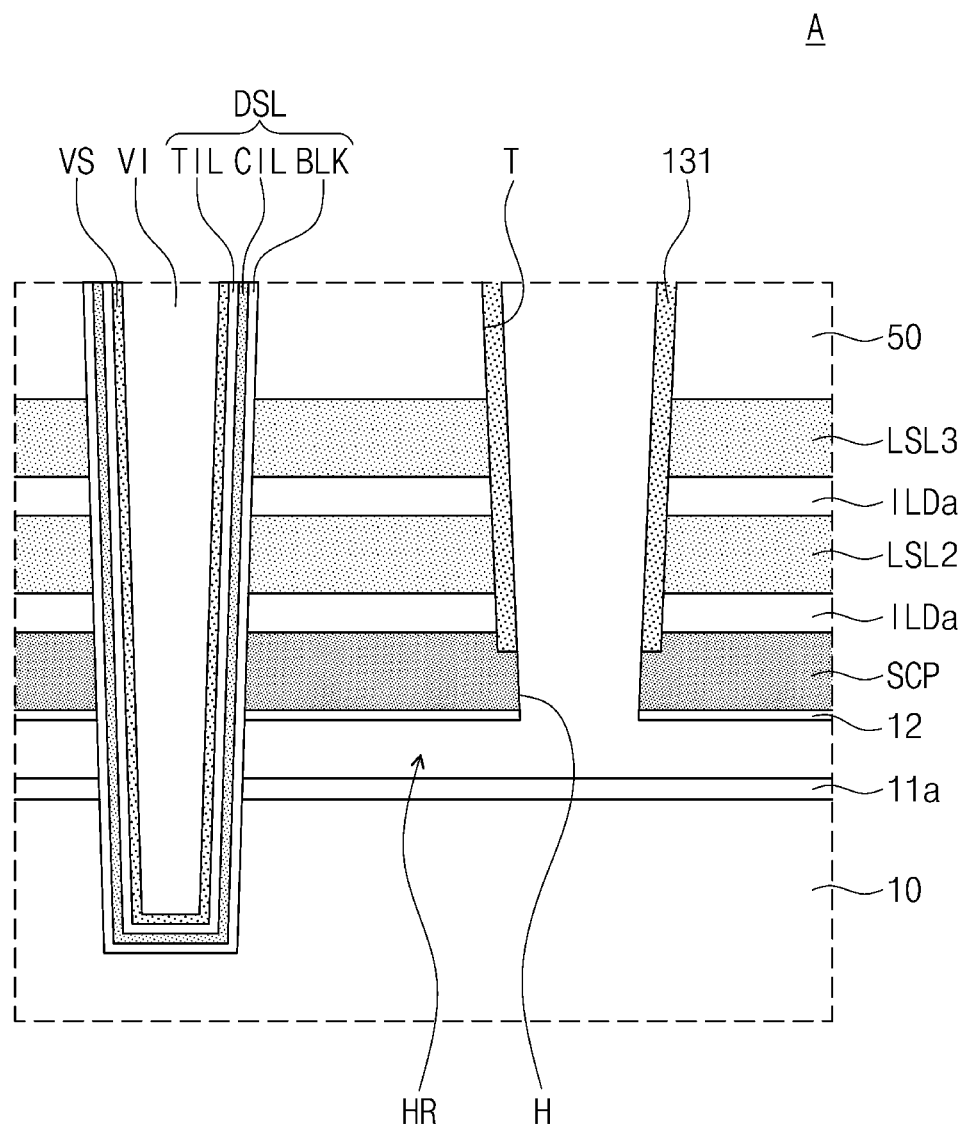

Referring to FIGS. 2, 22A, and 22B, an anisotropic etching process may be performed on the sacrificial spacer layer 130 to form sacrificial spacers 131 covering the sidewalls of the trenches T. In addition, through-holes H penetrating the source conductive layer SCP under the trenches T may be formed in the anisotropic etching process for forming the sacrificial spacers 131. The through-holes H may expose the first lower sacrificial layer LSL1.

Next, an isotropic etching process may be performed on the first lower sacrificial layer LSL1 exposed by the through-holes H to form a horizontal recess region HR exposing portions of the data storage layers DSL. In the isotropic etching process, the horizontal recess region HR may be formed using an etch recipe having an etch selectivity with respect to the sacrificial spacers 131, the first gate insulating layer 11a, and the buffer insulating layer 12.

The horizontal recess region HR may laterally extend from the through-hole H into between the source conductive layer SCP and the substrate 10. In other words, the horizontal recess region HR may be an empty space between the source conductive layer SCP and the substrate 10. When the horizontal recess region HR is formed, the portions of the source conductive layer SCP, which fill the first openings OP1 of the first lower sacrificial layer LSL1, may function as supporters preventing the mold structure 100 from collapsing.

Figure 23A:
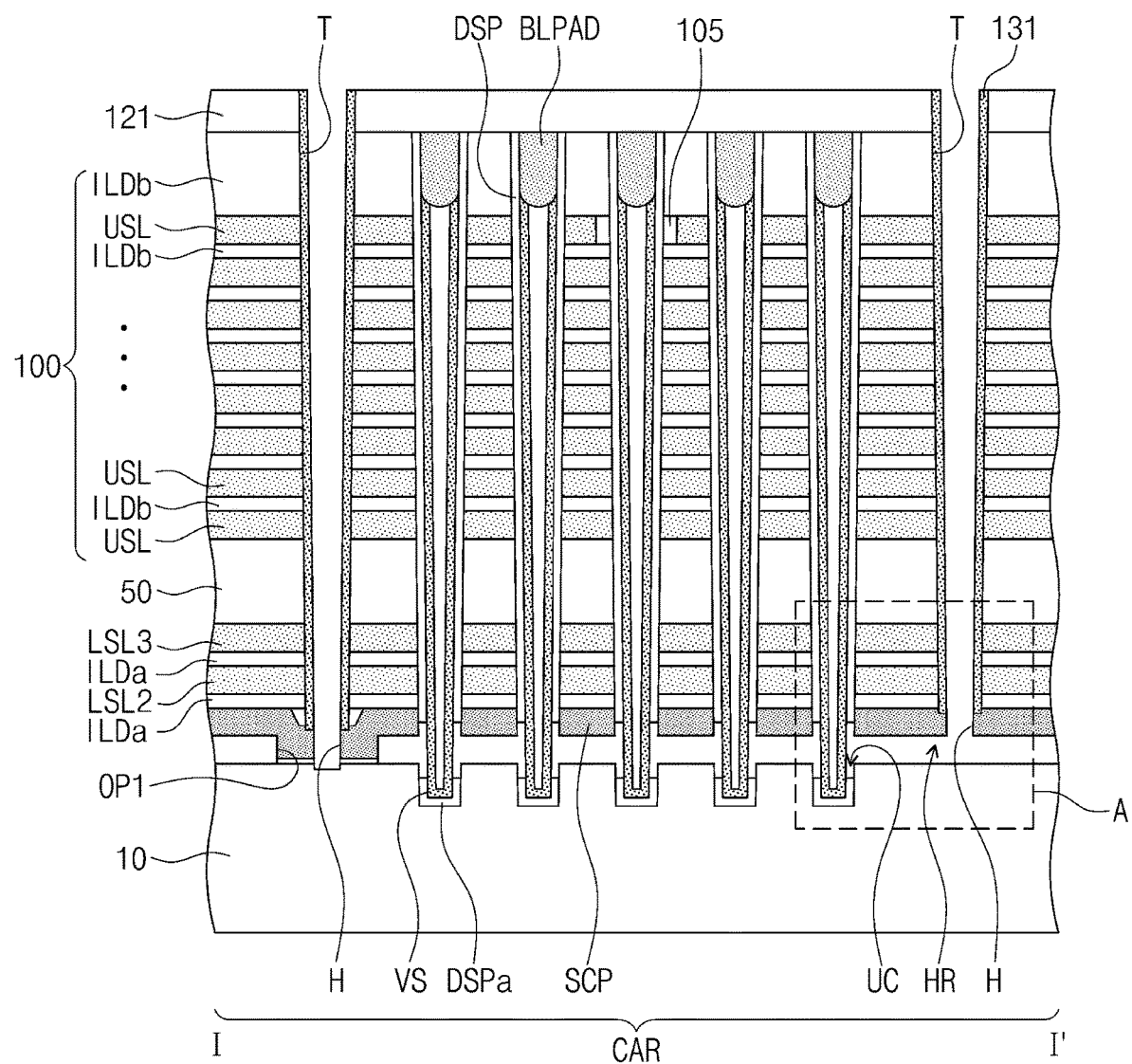
Figure 23B:
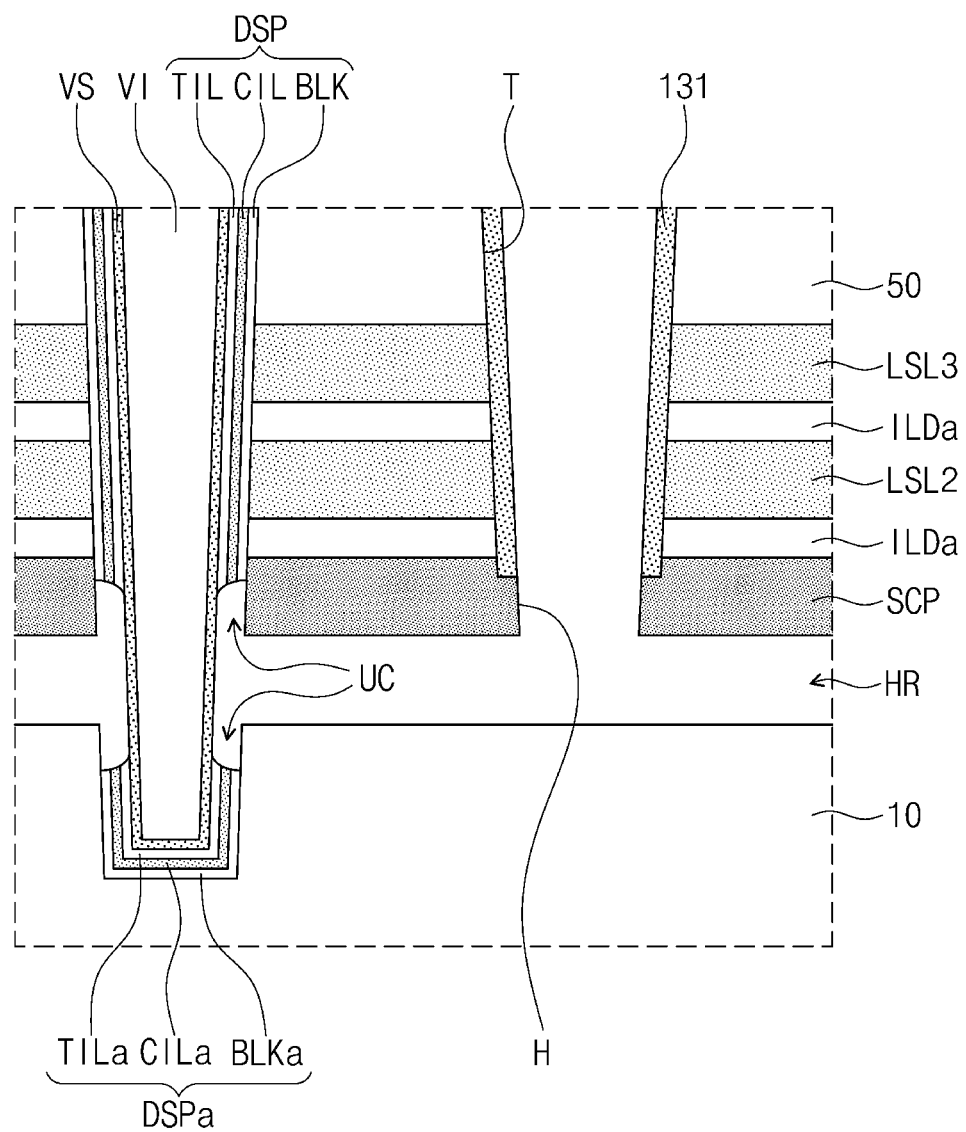

Referring to FIGS. 2, 23A, and 23B, the portions of the data storage layers DSL exposed by the horizontal recess region HR may be isotropically etched to expose portions of the vertical semiconductor patterns VS. Since the isotropic etching process is performed on the data storage layer DSL surrounding each of the vertical semiconductor patterns VS, the data storage layer DSL may be divided into a data storage pattern DSP and a dummy data storage pattern DSPa, which are vertically spaced apart from each other.

The isotropic etching process performed on the data storage layer DSL may use an etch recipe having an etch selectivity with respect to the substrate 10, the source conductive layer SCP, the vertical semiconductor pattern VS, and the sacrificial spacer 131. In more detail, the isotropic etching of the data storage layer DSL may include sequentially and isotropically etching the blocking insulating layer BLK, the charge storage layer CIL, and the tunnel insulating layer TIL, which are exposed by the horizontal recess region HR.

During the isotropic etching process of the data storage layer DSL, the first gate insulating layer 11a and the buffer insulating layer 12 exposed by the horizontal recess region HR may be etched to expose a bottom surface of the source conductive layer SCP and the top surface of the substrate 10 through the horizontal recess region HR. In addition, undercut regions UC may be formed by the isotropic etching process of the data storage layer DSL. The undercut region UC may be an empty space vertically extending from the horizontal recess region HR and may be defined between the vertical semiconductor pattern VS and a sidewall of the source conductive layer SCP. A bottom surface of the data storage pattern DSP and a top surface of the dummy data storage pattern DSPa may be defined by the formation of the undercut region UC. The bottom surface of the data storage pattern DSP and the top surface of the dummy data storage pattern DSPa may have tapered shapes. A level of the bottom surface of the data storage pattern DSP and a level of the top surface of the dummy data storage pattern DSPa may be changed according to an etching degree of the isotropic etching process of the data storage layer DSL.

Referring to FIGS. 2, 24A, 24B, and 24C, a sidewall contact layer SCL may be formed in the undercut regions UC, the horizontal recess region HR, the through-holes H, and the trenches T. The sidewall contact layer SCL may be formed using a CVD process or an ALD process. The sidewall contact layer SCL may be a semiconductor layer doped with dopants, for example, a poly-silicon layer doped with N-type dopants.

Figure 24A:
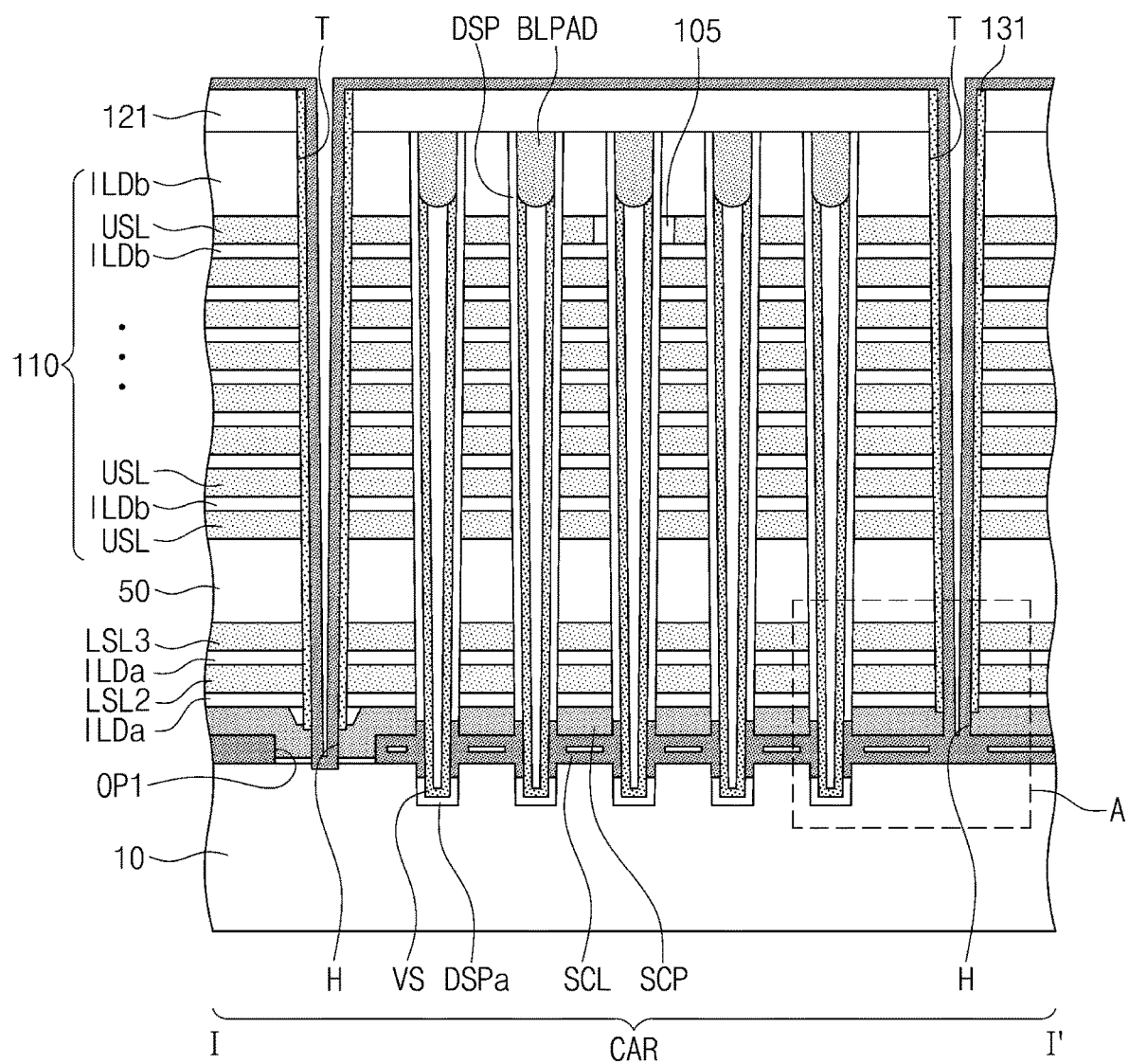
Figure 24B:
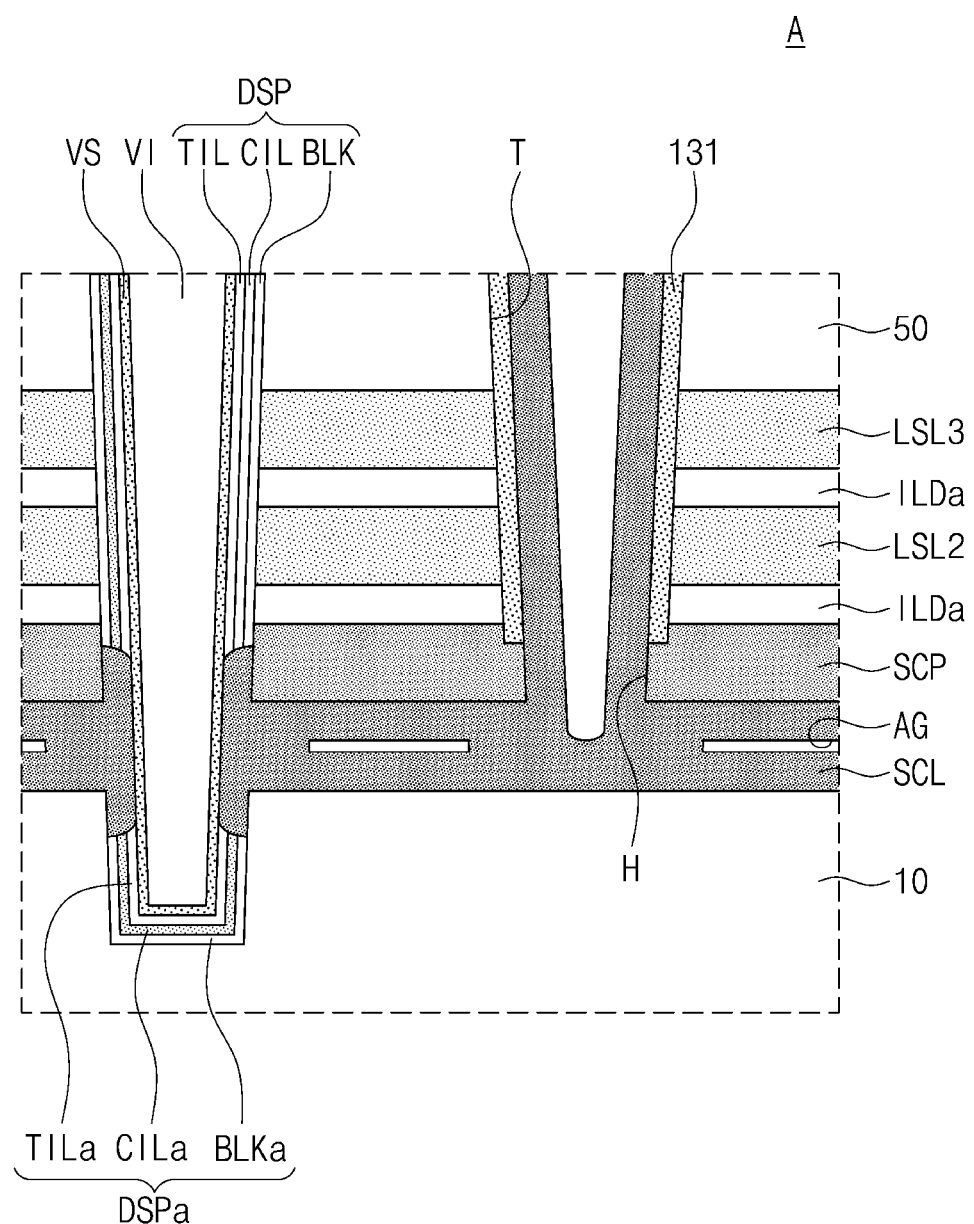
Figure 24C:
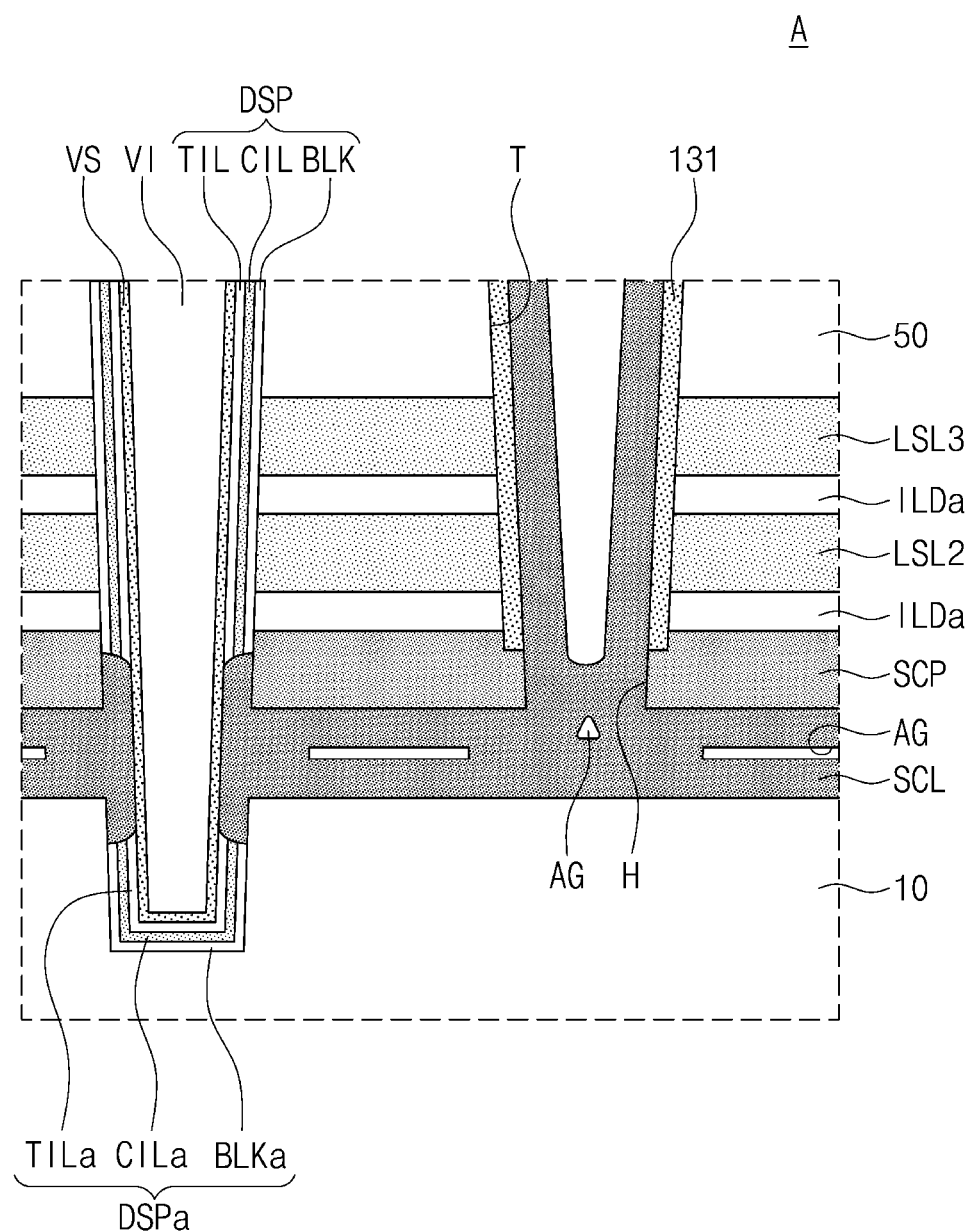
FIG. 24C is an enlarged view of the portion 'A' of FIG. 24A to illustrate a method of forming a source structure according to some embodiments of the inventive concepts.
Figure 25A:
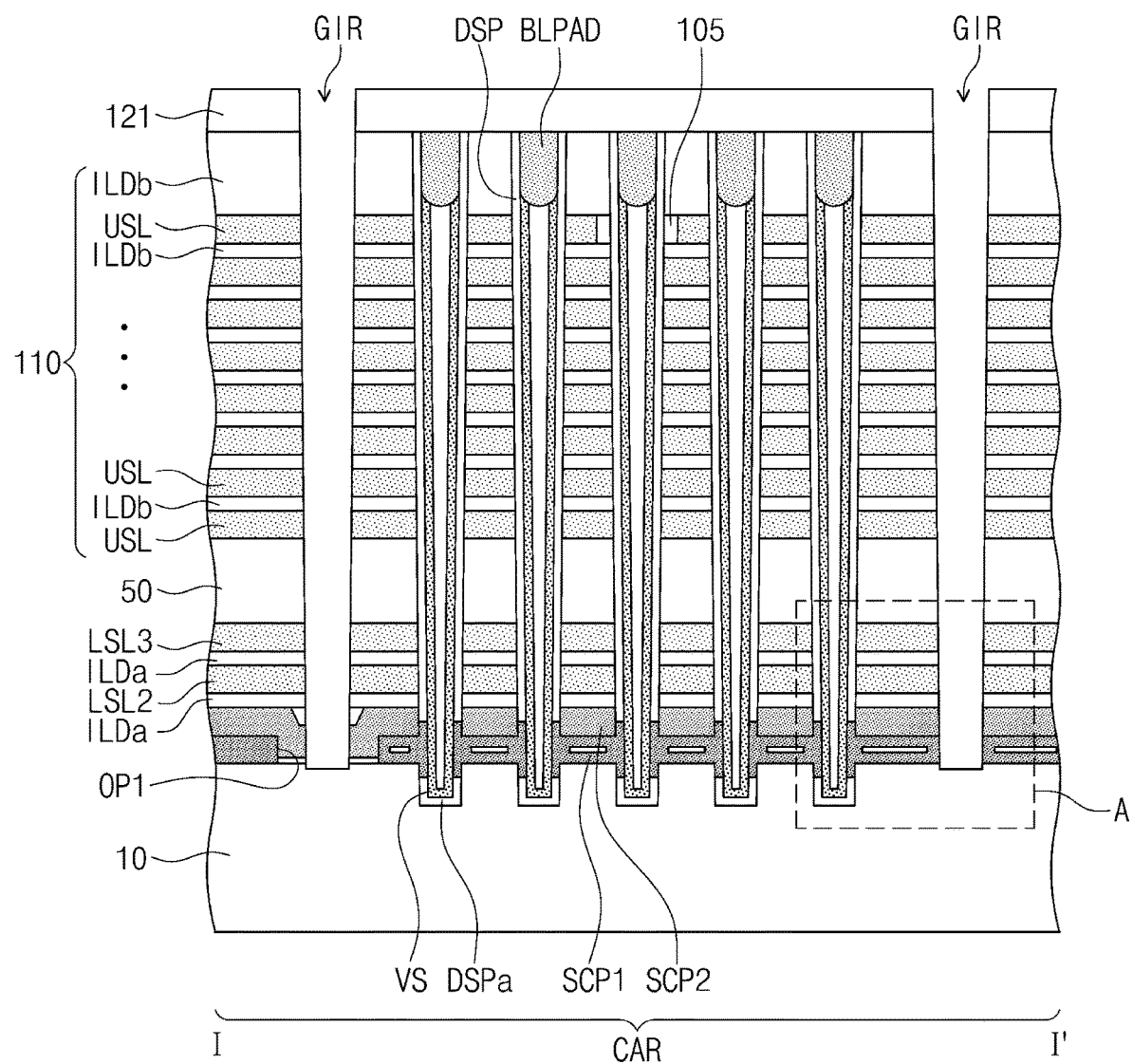
Figure 25B:
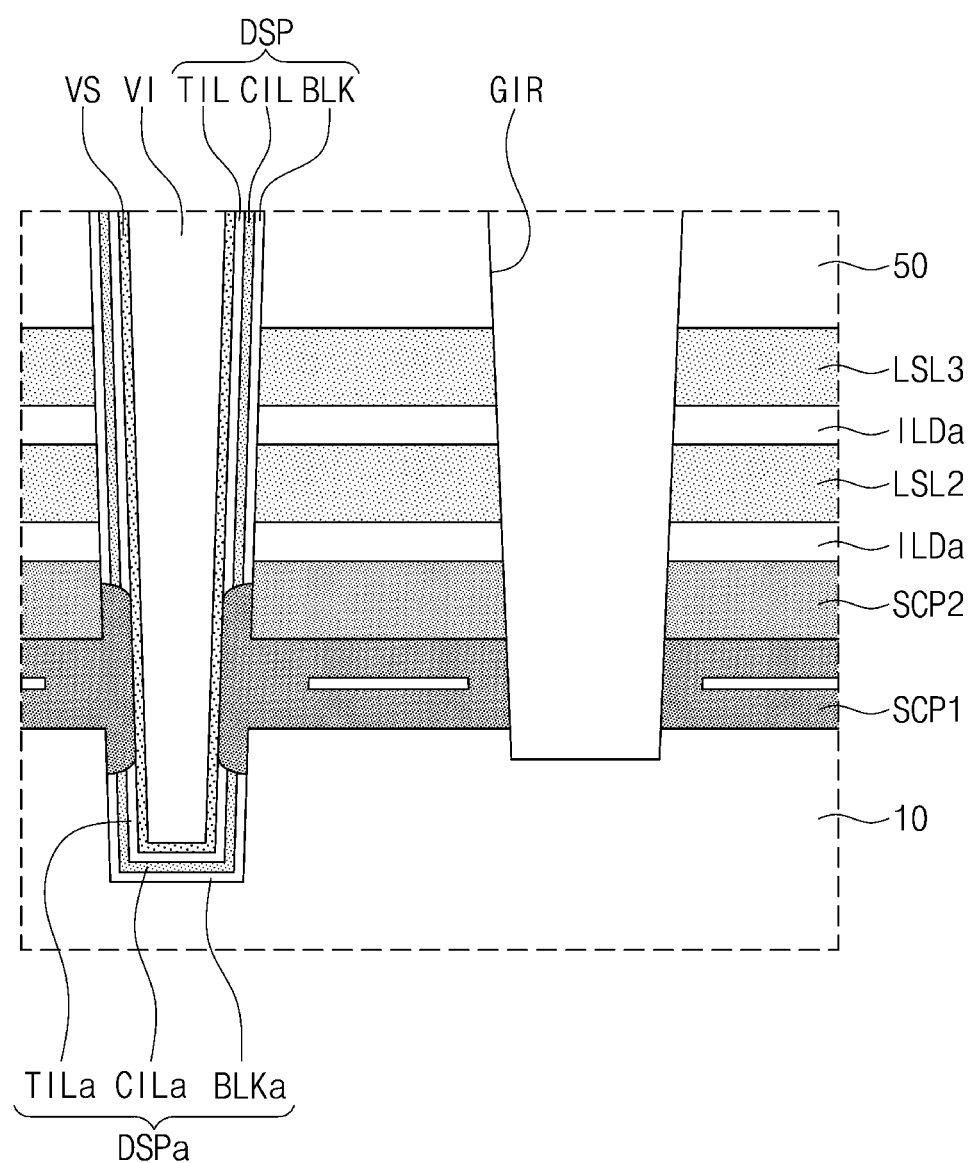
Figure 25C:
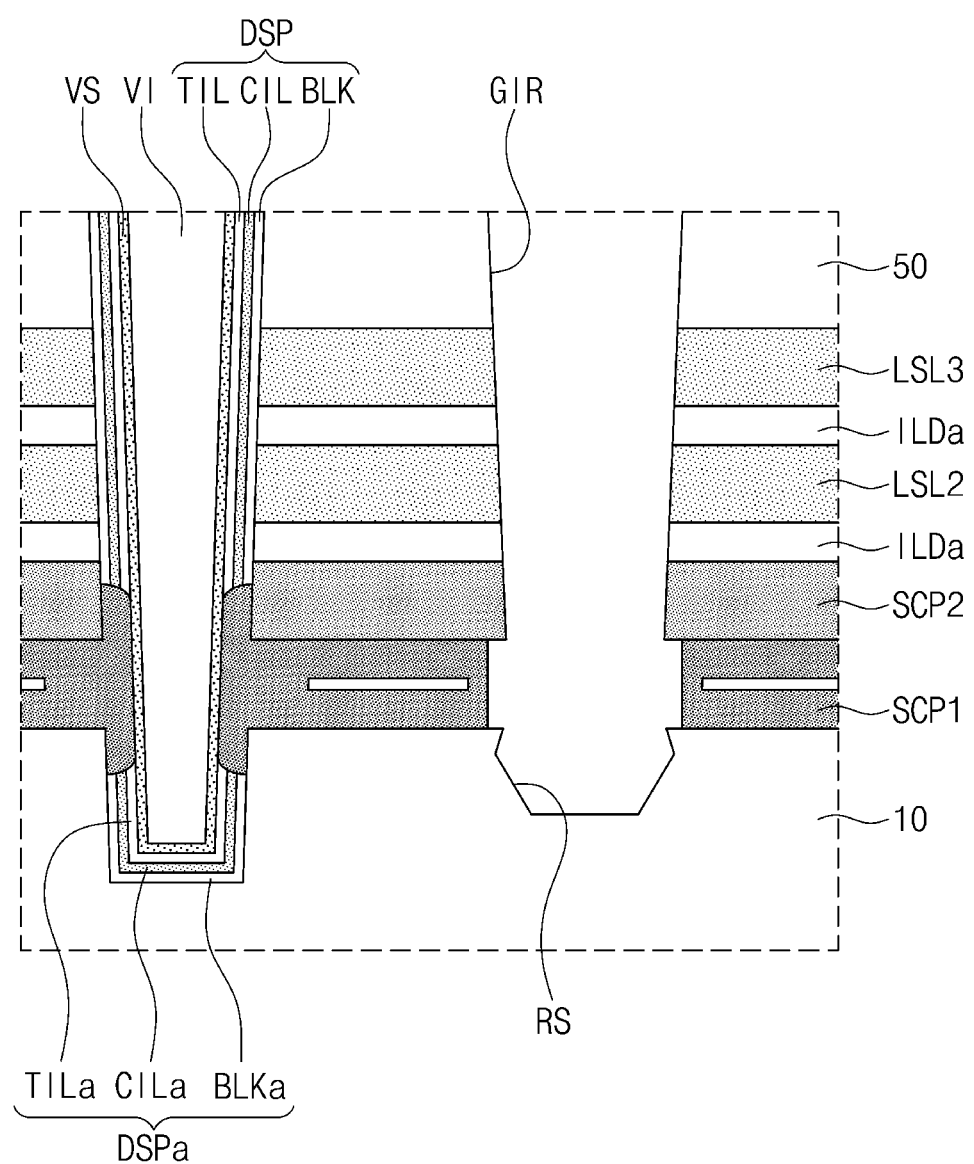
FIG. 25C is an enlarged view of the portion 'A' of FIG. 25A to illustrate a method of forming a source structure according to some embodiments of the inventive concepts.

The sidewall contact layer SCL may be formed with a substantially uniform thickness on inner surfaces of the undercut region UC, the horizontal recess region HR, the through-hole H, and the trench T by the deposition process. The sidewall contact layer SCL may not completely fill the trench T. Referring to FIGS. 24B and 24C, air gaps AG and/or a seam may be formed in the horizontal recess region HR during the deposition of the sidewall contact layer SCL. The sidewall contact layer SCL may be deposited to fill at least a portion of the through-hole H, as illustrated in FIG. 24C.

The sidewall contact layer SCL may be in contact with the portions of the vertical semiconductor patterns VS exposed by the horizontal recess region HR. In addition, the sidewall contact layer SCL may be in direct contact with the substrate 10 (or the well dopant region formed in the substrate 10).

Referring to FIGS. 2, 25A, 25B, and 25C an isotropic etching process may be performed on the sidewall contact layer SCL to form the first source conductive pattern SCP1 in the undercut regions UC and the horizontal recess region HR. In addition, the sacrificial spacers 131 may also be etched in the isotropic etching process of the sidewall contact layer SCL to form the gate isolation regions GIR which expose sidewalls of the mold structure 100, the second and third lower sacrificial layers LSL2 and LSL3, and the lower insulating layers ILDa. The isotropic etching process of the sidewall contact layer SCL and the sacrificial spacers 131 may use an etch recipe having an etch selectivity with respect to the mold structure 100. The isotropic etching process of the sidewall contact layer SCL and the sacrificial spacers 131 may use a wet etching process using, for example, a standard clean 1 (SC1) solution or ammonia ($NH_4OH$) water.

In some embodiments, the gate isolation regions GIR may define sidewalls of the first source conductive pattern SCP1 and may expose the substrate 10. In some embodiments, the sidewalls of the first source conductive pattern SCP1 may be laterally recessed when the gate isolation regions GIR are formed. In addition, in the isotropic etching process of the sidewall contact layer SCL and the sacrificial spacers 131, portions of the substrate 10 exposed by the gate isolation regions GIR may be etched to form substrate recess regions RS (see, e.g., FIG. 25C). Here, the substrate recess region RS may be defined by sidewalls inclined with respect to the top surface of the substrate 10.

Figure 26A:
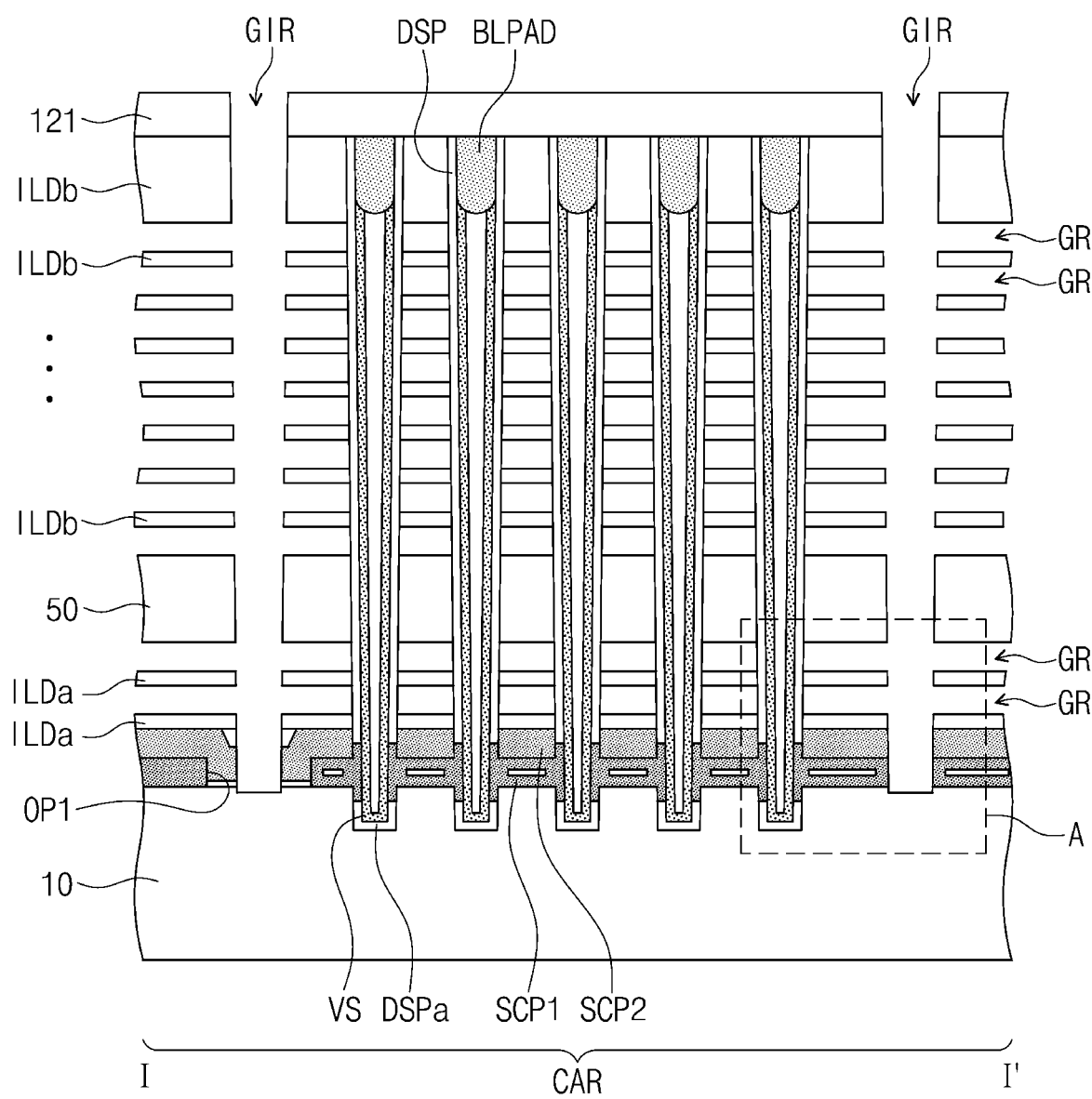
Figure 26B:
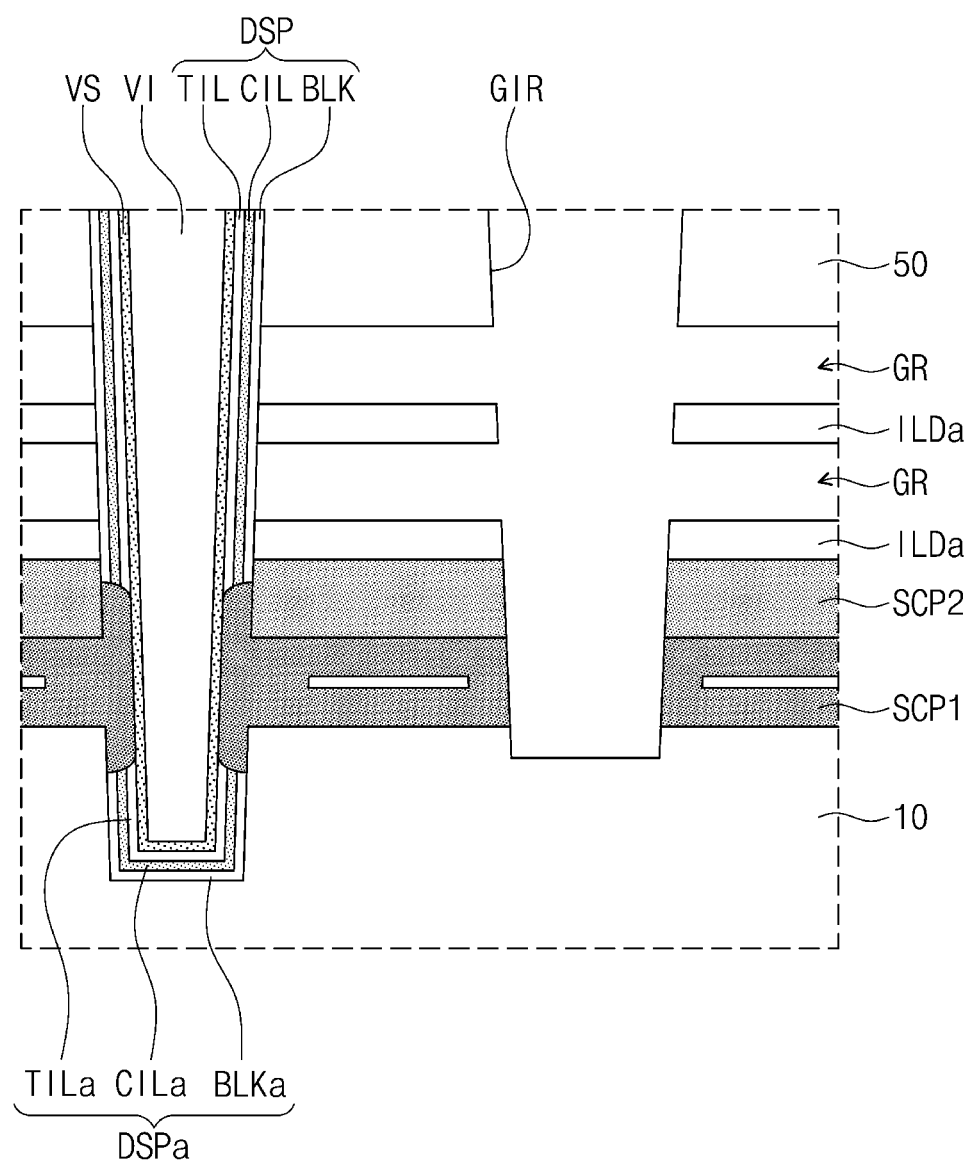

Referring to FIGS. 2, 26A, and 26B, the second and third lower sacrificial layers LSL2 and LSL3 and the upper sacrificial layers USL, which are exposed by the gate isolation regions GIR, may be removed to form gate regions GR between the insulating layers ILDa and ILDb.

The second and third lower sacrificial layers LSL2 and LSL3 and the upper sacrificial layers USL may be isotropically etched using an etch recipe having an etch selectivity with respect to the lower and upper insulating layers ILDa and ILDb, the data storage pattern DSP, and the first and second source conductive patterns SCP1 and SCP2, and thus the gate regions GR may be formed. The gate regions GR may laterally extend from the gate isolation region GIR and may expose portions of the sidewall of the data storage pattern DSP, respectively.

A horizontal insulating pattern HL may be formed to conformally cover inner surfaces of the gate regions GR. The horizontal insulating pattern HL may be formed with a substantially uniform thickness on the inner surfaces of the gate regions GR.

Electrodes EGE, GGE, CGE, and SGE may be formed to be within, and in some embodiments fill, the gate regions GR having the horizontal insulating pattern HL. The electrodes EGE, GGE, CGE, and SGE may partially fill the gate regions GR or may completely fill the gate regions GR. In some embodiments, the formation of the electrodes EGE, GGE, CGE, and SGE may include sequentially depositing a metal nitride layer (e.g., TiN, TaN, and/or WN) and a metal layer (e.g., W, Al, Ti, Ta, Co, and/or Cu). Subsequently, the metal nitride layer and the metal layer disposed in the gate isolation regions GIR may be removed to locally form the electrodes EGE, GGE, CGE, and SGE in the gate regions GR, respectively.

In the 3D semiconductor memory device according to some embodiments of the inventive concepts, the electrode structure may be disposed on the source conductive pattern parallel to the top surface of the substrate, and the source conductive pattern may be in direct contact with the sidewall of the lower portion of the vertical semiconductor pattern used as channels of the memory cell transistors. Thus, processes for electrical connection between the vertical semiconductor pattern and the source conductive pattern may be omitted.

A portion of the source conductive pattern may protrude in the direction perpendicular to the top surface of the substrate to optimize a distance between the source conductive pattern and the erase control gate electrode corresponding to the lowermost layer of the electrode structure. Thus, occurrence of the gate induced drain leakage (GIDL) may be optimized in the erase operation of the memory cell array to improve operating characteristics of the 3D semiconductor memory device.

One of the insulating layers between the vertically stacked electrodes may extend from the cell array region onto the peripheral circuit region to be on, and in some embodiments cover, the peripheral circuit structure. In other words, since a portion of the cell array and a portion of the peripheral circuit are formed at the same time, the method of manufacturing the 3D semiconductor memory device may be simplified and a manufacture cost of the 3D semiconductor memory device may be reduced.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concepts are to be determined by the broadest permissible interpretation of the following claims and their equivalents, and shall not be restricted or limited by the foregoing description.

What is claimed is:

1. A three-dimensional (3D) semiconductor memory device, comprising:
   a source structure on a substrate and extending in parallel to a top surface of the substrate; and
   an electrode structure comprising an erase control gate electrode, a ground selection gate electrode, cell gate electrodes, and a string selection gate electrode, which are sequentially stacked on the source structure in a first direction that is perpendicular to the top surface of the substrate,
   wherein the erase control gate electrode is a lowest one of the gate structure and has a first thickness in the first direction, the ground selection gate electrode is a second lowest one of the gate structure and has a second thickness in the first direction, a lowermost one of the cell gate electrodes is a third lowest one of the gate structure, and each of the cell gate electrodes has a third thickness in the first direction,
   wherein the first thickness is greater than both the second thickness and the third thickness,
   wherein the ground selection gate electrode is spaced apart from the erase control gate electrode by a first maximum distance and is spaced apart from the lowermost one of the cell gate electrodes by a second maximum distance in the first direction, and
   wherein the second maximum distance is greater than the first maximum distance.

2. The 3D semiconductor memory device of claim 1, further comprising a vertical semiconductor pattern penetrating the electrode structure and the source structure, wherein a portion of a sidewall of the vertical semiconductor pattern is in contact with the source structure.

3. The 3D semiconductor memory device of claim 2, wherein the vertical semiconductor pattern has a bottom surface located at a level lower than that of a bottom surface of the source structure.

4. The 3D semiconductor memory device of claim 1, wherein the source structure comprises:
   a first source conductive pattern on the substrate; and
   a second source conductive pattern in contact with a top surface of the first source conductive pattern.

5. The 3D semiconductor memory device of claim 4, wherein the first source conductive pattern comprises an additional portion having a recessed sidewall, and
   wherein the second source conductive pattern is formed on, and covers, at least a portion of the top surface of the first source conductive pattern; and
   wherein the second source conductive pattern is formed on, and covers, at least a portion of the recessed sidewall of the first source conductive pattern.

6. The 3D semiconductor memory device of claim 4, wherein the first source conductive pattern and the second source conductive pattern each comprise a semiconductor material doped with dopants of a first conductivity type, and
   wherein a first concentration of the dopants in the first source conductive pattern is greater than a second concentration of the dopants in the second source conductive pattern.

7. The 3D semiconductor memory device of claim 4, wherein the first source conductive pattern comprises:
   a horizontal portion extending in parallel to the electrode structure under the electrode structure; and
   a sidewall portion extending from the horizontal portion in the first direction and surrounding a portion of a sidewall of a vertical semiconductor pattern penetrating the electrode structure and the source structure.

8. The 3D semiconductor memory device of claim 7, further comprising:
   a data storage pattern extending in the first direction between the vertical semiconductor pattern and the electrode structure,
   wherein a bottom surface of the data storage pattern is in contact with the sidewall portion of the first source conductive pattern.

9. The 3D semiconductor memory device of claim 8, wherein the data storage pattern has a fourth thickness on the sidewall of the vertical semiconductor pattern,
   wherein the sidewall portion of the first source conductive pattern has a fifth thickness on the sidewall of the vertical semiconductor pattern, and wherein the fifth thickness of the sidewall portion of the first source conductive pattern is equal to the fourth of the data storage pattern.

10. The 3D semiconductor memory device of claim 8, further comprising:
    a dummy data storage pattern vertically spaced apart from the data storage pattern and the source structure.

11. A three-dimensional (3D) semiconductor memory device, comprising:
    a source structure on a substrate and extending in parallel to a top surface of the substrate; and
    an electrode structure comprising an erase control gate electrode, a ground selection gate electrode, cell gate electrodes, and a string selection gate electrode, which are sequentially stacked on the source structure in a first direction that is perpendicular to the top surface of the substrate,
    wherein the erase control gate electrode is a lowest one of the electrode structure and has a first thickness in the first direction, the ground selection gate electrode is a second lowest one of the electrode structure and has a second thickness in the first direction, a lowermost one of the cell gate electrodes is a third lowest one of the electrode structure, and each of the cell gate electrodes has a third thickness in the first direction,
    wherein the ground selection gate electrode is spaced apart from the erase control gate electrode by a first maximum distance in the first direction,
    wherein the ground selection gate electrode is spaced apart from a first cell gate electrode of the cell gate electrodes by a second maximum distance in the first direction, the first cell gate electrode being the lowermost one of the cell gate electrodes in the first direction, and
    wherein the second maximum distance is greater than the first maximum distance.

12. The 3D semiconductor memory device of claim 11, wherein the first cell gate electrode is between the ground selection gate electrode and a second cell gate electrode of the cell gate electrodes.

13. The 3D semiconductor memory device of claim 11, wherein the second maximum distance is greater than the third thickness.

14. The 3D semiconductor memory device of claim 11, wherein the second maximum distance is greater than a third distance between two of the cell gate electrodes that are adjacent to each other in the first direction.

15. The 3D semiconductor memory device of claim 11, further comprising a vertical semiconductor pattern penetrating the electrode structure and the source structure,
    wherein a portion of a sidewall of the vertical semiconductor pattern is in contact with the source structure.

16. The 3D semiconductor memory device of claim 11, wherein the source structure comprises:
    a first source conductive pattern on the substrate; and
    a second source conductive pattern in contact with a top surface of the first source conductive pattern,
    wherein the first source conductive pattern and the second source conductive pattern each comprise a semiconductor material doped with dopants of a first conductivity type, and
    wherein a first concentration of the dopants in the first source conductive pattern is greater than a second concentration of the dopants in the second source conductive pattern.

17. The 3D semiconductor memory device of claim 16, further comprising a vertical semiconductor pattern that extends in the first direction,
    wherein the first source conductive pattern is in contact with a portion of a sidewall of the vertical semiconductor pattern.

18. The 3D semiconductor memory device of claim 17, wherein the first source conductive pattern comprises:
    a horizontal portion extending in parallel to the electrode structure under the electrode structure; and
    a sidewall portion extending from the horizontal portion in the first direction and surrounding the portion of the sidewall of the vertical semiconductor pattern.

19. The 3D semiconductor memory device of claim 18, further comprising:
    a data storage pattern extending in the first direction between the vertical semiconductor pattern and the electrode structure, wherein a bottom surface of the data storage pattern is in contact with the sidewall portion of the first source conductive pattern.

20. A three-dimensional (3D) semiconductor memory device, comprising:
- a source structure on a substrate and extending in parallel to a top surface of the substrate;
- an electrode structure comprising an erase control gate electrode, a ground selection gate electrode, cell gate electrodes, and a string selection gate electrode, which are sequentially stacked on the source structure in a first direction that is perpendicular to the top surface of the substrate;
- a vertical semiconductor pattern penetrating the electrode structure and the source structure, wherein a portion of a sidewall of the vertical semiconductor pattern is in contact with the source structure; and
- a data storage pattern extending between the vertical semiconductor pattern and the electrode structure in the first direction, wherein the source structure comprises:
- a first source conductive pattern on the substrate; and
- a second source conductive pattern in contact with a top surface of the first source conductive pattern, wherein the first source conductive pattern comprises:
- a horizontal portion extending in parallel to the electrode structure under the electrode structure; and
- a sidewall portion extending from the horizontal portion in the first direction and surrounding the portion of the sidewall of the vertical semiconductor pattern, wherein the erase control gate electrode is a lowest one of the electrode structure and has a first thickness in the first direction, the ground selection gate electrode is a second lowest one of the electrode structure and has a second thickness in the first direction, a lowermost one of the cell gate electrodes is a third lowest one of the electrode structure, and each of the cell gate electrodes has a third thickness in the first direction, wherein the first thickness is greater than the second thickness and the third thickness, wherein the ground selection gate electrode is spaced apart from the erase control gate electrode by a first maximum distance in the first direction, wherein the ground selection gate electrode is spaced apart from a first cell gate electrode of the cell gate electrodes by a second maximum distance in the first direction, wherein the second maximum distance is greater than the first maximum distance, and wherein the first cell gate electrode is closest to the ground selection gate electrode.

* * * * *